(12) United States Patent
Masuyama et al.

(10) Patent No.: US 10,209,618 B2
(45) Date of Patent: Feb. 19, 2019

(54) PHOTORESIST COMPOSITION

(71) Applicant: SUMITOMO CHEMICAL COMPANY, LIMITED, Tokyo (JP)

(72) Inventors: Tatsuro Masuyama, Osaka (JP); Koji Ichikawa, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 79 days.

(21) Appl. No.: 15/591,266

(22) Filed: May 10, 2017

(65) Prior Publication Data
US 2017/0329219 A1 Nov. 16, 2017

(30) Foreign Application Priority Data

May 13, 2016 (JP) .................................. 2016-097197
May 13, 2016 (JP) .................................. 2016-097198

(51) Int. Cl.
| | |
|---|---|
| *G03F 7/16* | (2006.01) |
| *G03F 7/20* | (2006.01) |
| *G03F 7/32* | (2006.01) |
| *G03F 7/38* | (2006.01) |
| *G03F 7/004* | (2006.01) |
| *G03F 7/038* | (2006.01) |
| *G03F 7/039* | (2006.01) |

(52) U.S. Cl.
CPC ............ *G03F 7/0045* (2013.01); *G03F 7/038* (2013.01); *G03F 7/0397* (2013.01); *G03F 7/162* (2013.01); *G03F 7/168* (2013.01); *G03F 7/2006* (2013.01); *G03F 7/2041* (2013.01); *G03F 7/325* (2013.01); *G03F 7/38* (2013.01)

(58) Field of Classification Search
CPC ................ G03F 7/0045; G03F 7/0382; G03F 7/0392–7/0397
See application file for complete search history.

(56) References Cited

U.S. PATENT DOCUMENTS

| | | |
|---|---|---|
| 2002/0120053 A1 | 8/2002 | Mills et al. |
| 2006/0194982 A1 | 8/2006 | Harada et al. |
| 2007/0027336 A1 | 2/2007 | Yoshida et al. |
| 2010/0209740 A1 | 8/2010 | Ayama et al. |
| 2013/0022916 A1* | 1/2013 | Ichikawa ............... G03F 7/0045 430/281.1 |
| 2015/0212408 A1* | 7/2015 | Masuyama ........... G03F 7/0045 430/281.1 |
| 2016/0002494 A1 | 1/2016 | Yamamoto et al. |
| 2016/0062233 A1* | 3/2016 | Masuyama ........... G03F 7/0045 430/270.1 |

FOREIGN PATENT DOCUMENTS

| | | |
|---|---|---|
| JP | 2013-41257 A | 2/2013 |
| JP | 2013-234209 A | 11/2013 |
| JP | 2014-115631 A | 6/2014 |
| JP | 2015-99899 A | 5/2015 |
| WO | WO 2013/024886 A1 | 2/2013 |

OTHER PUBLICATIONS

Lee et al., "Understanding dissolution behavior of 193nm photoresists in organic solvent developers", Proc. SPIE 8325, Advances in Resist Materials and Processing Technology XXIX, pp. 83250Q-1 to 83250Q-12, dated Mar. 19, 2012. Event SPEI jAdvanced Lithography, 2012, San JOse, Californica, US. (Year: 2012).*

* cited by examiner

*Primary Examiner* — Cynthia Hamilton
(74) *Attorney, Agent, or Firm* — Birch, Stewart, Kolasch & Birch, LLP

(57) ABSTRACT

A photoresist composition comprising an acid generator and a resin which comprises a structural unit having an acid-liable group,
the acid generator generating an acid (I) or an acid (II):
the acid (I) showing a hydrogen bonding parameter in the range of 12 $(MPa)^{1/2}$ to 15 $(MPa)^{1/2}$ and a polarity parameter in the range of 15 $(MPa)^{1/2}$ or more;
the acid (II) showing a hydrogen bonding parameter in the range of 12 $(MPa)^{1/2}$ to 15 $(MPa)^{1/2}$, and a distance of Hansen solubility parameters between the acid (II) and γ-butyrolactone being 7.5 or less, and
the distance being calculated from formula (1):

$$R=(4\times(\delta d_A-18)^2+(\delta p_A-16.6)^2+(\delta h_A-7.4)^2)^{1/2} \quad (1)$$

in which $\delta d_A$ represents a dispersion parameter of an acid, $\delta p_A$ represents a polarity parameter of an acid, $\delta h_A$ represents a hydrogen bonding parameter of an acid, and R represents a distance of Hansen solubility parameters between an acid and γ-butyrolactone.

16 Claims, No Drawings

PHOTORESIST COMPOSITION

This application claims priority to Japanese Applications No. 2016-097197 and No. 2016-097198 which were filed on May 13, 2016. The entire disclosures of Japanese Applications No. 2016-097197 and No. 2016-097198 are incorporated hereinto by reference.

FIELD OF THE INVENTION

The disclosure relates to a photoresist composition.

BACKGROUND ART

As to an acid generator to be used for a photoresist composition, JP2006-257078A1 mentions a salt represented by the following formula.

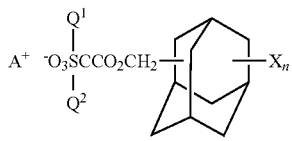

JP2007-224008A1 mentions a salt represented by one of the following formulae.

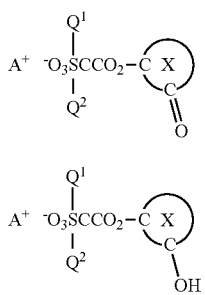

JP2013-41257A1 mentions a salt which consists of an organic action having no acid-labile group and no nitrogen atom as well as a anion represented by one of the following formulae.

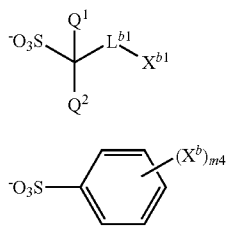

($L^{b1}$ represents a divalent organic group, and $X^{b1}$ represents an acid-labile group having no nitrogen atom.)

JP2012-97074A1 mentions a salt represented by the following formula.

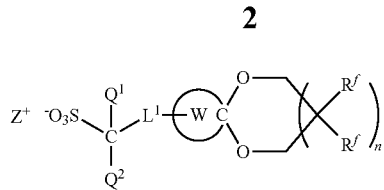

($L^1$ represents a divalent C1 to C17 saturated hydrocarbon group or the like, W represents a divalent C3 to C36 alicyclic hydrocarbon group or the like, and $X^{b1}$ represents a fluorine atom or a C1 to C6 fluorine-containing alkyl group.)

SUMMARY OF THE DISCLOSURE

The disclosure provides the following inventions.

[1] A photoresist composition comprising an acid generator and a resin which comprises a structural unit having an acid-liable group, the acid generator generating an acid (I) or an acid (II):

the acid (I) showing a hydrogen bonding parameter in the range of 12 $(MPa)^{1/2}$ to 15 $(MPa)^{1/2}$ and a polarity parameter in the range of 15 (MPa) or more;

the acid (II) showing a hydrogen bonding parameter in the range of 12 $(MPa)^{1/2}$ to 15 $(MPa)^{1/2}$, and a distance of Hansen solubility parameters between the acid (II) and γ-butyrolactone being 7.5 or less, and the distance being calculated from formula (1):

$$R=(4\times(\delta d_A-18)^2+(\delta p_A-16.6)^2+(\delta h_A-7.4)^2)^{1/2} \quad (1)$$

in which $\delta d_A$ represents a dispersion parameter of an acid, $\delta p_A$ represents a polarity parameter of an acid, $\delta h_A$ represents a hydrogen bonding parameter of an acid, and R represents a distance of Hansen solubility parameters between an acid and γ-butyrolactone.

[2] The photoresist composition according to [1], wherein the acid generator generates the acid (I).

[3] The photoresist composition according to [1], wherein the acid generator generates the acid (II).

[4] The photoresist composition according to [1] wherein the acid (I) or the acid (II) has a molar volume of 850 cm³/mol or more.

[5] The photoresist composition according to [1] wherein the structural unit having an acid-labile group is at least one selected from the group consisting of a structural unit represented by formula (a1-0), a structural unit represented by formula (a1-1) and a structural unit represented by formula (a1-2):

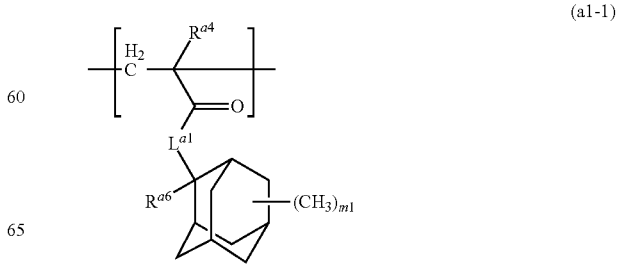

(a1-0)

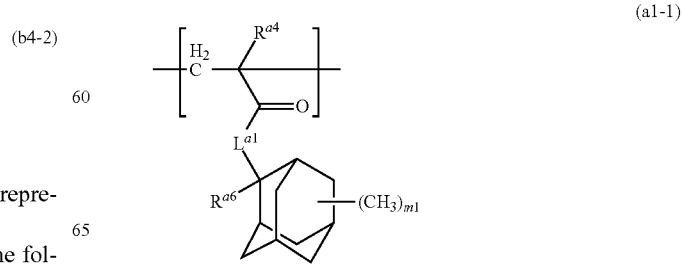

(a1-1)

-continued

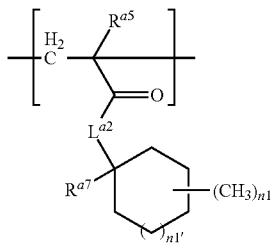

(a1-2)

in each formula, $L_{a01}$, $L^{a1}$ and $L^{a2}$ represent —O— or *—O—$(CH_2)_{k01}$—CO—O—, k01 represents an integer of 1 to 7, * represents a binding position to —CO—, $R^{a01}$, $R^{a4}$ and $R^{a5}$ represent a hydrogen atom or a methyl group, and $R^{a02}$, $R^{a03}$ and $R^{a04}$ independently represent a C1 to C8 alkyl group, a C3 to C18 alicyclic hydrocarbon group or combination thereof, $R^{a6}$ and $R^{a7}$ independently represent a C1 to C8 alkyl group, a C3 to C18 alicyclic hydrocarbon group or a combination thereof, m1 represents an integer of 0 to 14, n1 represents an integer of 0 to 10, and n1' represents an integer of 0 to 3.

[6] The photoresist composition according to [1] wherein the resin further comprises a structural unit having a lactone ring and no acid-labile group.

[7] The photoresist composition according to claim 6 wherein the structural unit having a lactone ring and no acid-labile group is a structural unit represented by formula (a3-4):

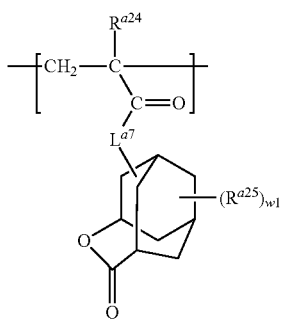

(a3-4)

wherein $R^{a24}$ represents a hydrogen atom, a halogen atom or a C1 to C6 alkyl group which can have a halogen atom, $L^{a7}$ represents —O—, *—O-$L^{a8}$-O—, *—O-$L^{a8}$-CO—O—, *—O-$L^{a8}$-CO—O— $L^{a9}$-CO—O— or *—O-$L^{a8}$-O—CO-$L^{a9}$-O— where * represents a binding position to a carbonyl group, $L^{a8}$ and $L^{a9}$ independently represents a C1 to C6 alkanediyl group, and $R^{a25}$ in each occurrence represents a carboxy group, a cyano group or a C1 to C4 aliphatic hydrocarbon group, and w1 represents an integer of 0 to 8.

[8] The photoresist composition according to [1] which further comprises γ-butyrolactone as a solvent.

[9] The photoresist composition according to [8] wherein the weight ratio of γ-butyrolactone is from 0.1% by weight to 5% by weight with respect to the solvent.

[10] The photoresist composition according to [8] which further comprises at least one selected from the group consisting of propyleneglycolmonomethylether acetate, propyleneglycolmonomethylether and a ketone solvent.

[11] The photoresist composition according to [10] wherein the ketone solvent is 2-heptanone.

[12] The photoresist composition according to [1] wherein the resin further comprises a structural unit having a hydroxyl group and no acid-labile group.

[13] The photoresist composition according to [1] wherein the acid has a cyclic structure comprising a —O—SO—O— moiety.

[14] The photoresist composition according to [1] further comprising a resin which comprises a structural unit having a fluorine atom and no structural unit having an acid-labile group.

[15] The photoresist composition according to [1] further comprising a salt which generates an acid having an acidity weaker than the acid (I) and the acid (II).

[16] A method for producing a photoresist pattern comprising steps (1) to (5);
(1) applying the photoresist composition according to [1] onto a substrate;
(2) drying the applied composition to form a composition layer;
(3) exposing the composition layer;
(4) heating the exposed composition layer; and
(5) developing the heated composition layer.

DETAILED DESCRIPTION OF DISCLOSURE

The indefinite articles "a" and "an" are taken as the same meaning as "one or more".

In the specification, the term "solid components" means components other than solvents in a photoresist composition.

<Photoresist Composition>

The photoresist composition of the disclosure contains a resin (A) and an acid generator.

The composition of the disclosure can contain another resin than Resin (A). The another resin is sometimes referred to as "Resin (X)".

Further, the photoresist composition preferably contains a quencher (which is sometimes referred to as "quencher (C)") and/or a solvent (which is sometimes referred to as "solvent (E)") in addition to a resin and an acid generator.

An acid generator is a compound which can be decomposed by irritation to generate an acid. The acid acts catalytically to Resin (A), resulting in removing a leaving group from the resin.

In the photoresist composition of the disclosure, an acid generator contains an acid which shows specific Hansen solubility parameters (Such acid generator is sometimes referred to as "acid generator (I)").

Hansen solubility parameter consists of three dimensions and is represented by the following coordinates. One of the coordinates is the parameter "δd", determined from dispersibility of one substance, another one is the parameter "δp", determined from polarity of one substance, and the other is the parameter "δh", determined from hydrogen bonding force of one substance. These parameters are related to solubility of one substance.

The parameter "δd" is a coordinate which represents a level of dispersibility, the parameter "δp" is a coordinate which represents a level of dipole-dipole force, and the parameter "δh" is a coordinate which represents a level of hydrogen bonding force.

The definition and calculation as to Hansen solubility parameters are described in "Hansen Solubility Parameters: A Users Handbook (CRC Press, 2007)", authored by Charles M. Hansen.

When the coordinates of Hansen solubility parameters of any compound have not been confirmed, the coordinates can easily be calculated from their chemical structures by using a computer software "Hansen Solubility Parameters in Practice (HSPiP)".

In the present application, the parameters [δd, δp, and δh] which an acid generated from an acid generator shows were calculated using the software "HSPiP Version 4.1".

The acid generator (I) generates an acid (I) or an acid (II).

The acid (I) shows a hydrogen bonding parameter in the range of 12 $(MPa)^{1/2}$ to 15 $(MPa)^{1/2}$ and a polarity parameter in the range of 15 $(MPa)^{1/2}$ or more. The acid (II) shows a hydrogen bonding parameter in the range of 12 $(MPa)^{1/2}$ to 15 $(MPa)^{1/2}$. A distance of Hansen solubility parameters between the acid (II) and γ-butyrolactone is 7.5 or less, which distance is calculated from formula (1):

$$R=(4\times(\delta d_A-18)^2+(\delta p_A-16.6)^2+(\delta h_A-7.4)^2)^{1/2} \quad (1)$$

in which $\delta d_A$ represents a dispersion parameter of an acid, $\delta p_A$ represents a polarity parameter of an acid, $\delta h_A$ represents a hydrogen bonding parameter of an acid, and R represents a distance of Hansen solubility parameters between an acid and γ-butyrolactone.

In the acid (I) and the acid (II), the hydrogen bonding parameter, i.e., parameter δh, is preferably 12.5 $(MPa)^{1/2}$ to 15 $(MPa)^{1/2}$, more preferably 13 $(MPa)^{1/2}$ to 15 $(MPa)^{1/2}$.

The acid (I) and the acid (II) each preferably show a polarity parameter in the range of 15 $(MPa)^{1/2}$ or more. The polarity parameter, i.e., parameter δp, is preferably 15.5 $(MPa)^{1/2}$ or more, more preferably 16 $(MPa)^{1/2}$ or more. The parameter Op is preferably 19 $(MPa)^{1/2}$ or less, more preferably 18.5 $(MPa)^{1/2}$ or less, and still more preferably 18 $(MPa)^{1/2}$ or less.

When an acid generator generates an acid which has both of the parameters δp and δh within the above-mentioned ranges, a photoresist composition which contains such acid generator can provide a photoresist film with good CDU or good MEF. An acid which has both of the parameters within the above-mentioned ranges can be being diffused moderately in a photoresist film while the acid is interacting with Resin (A).

The acid (II) shows Hansen solubility parameters a distance of which between the acid and γ-butyrolactone is 7.5 or less.

Here, the distance is calculated from formula (1):

$$R=(4\times(\delta d_A-18)^2+(\delta p_A-16.6)^2+(\delta h_A-7.4)^2)^{1/2} \quad (1)$$

in which $\delta d_A$ represents a dispersion parameter of an acid, $\delta p_A$ represents a polarity parameter of an acid, $\delta h_A$ represents a hydrogen bonding parameter of an acid, and R represents the distance.

The distance is preferably 7.3 or less, more preferably 7.1 or less. The distance can be usually 5.5 or more, preferably 6.0 or more.

When the acid generator (I) shows the above-mentioned distance, it can show good solubility in a photoresist composition with a reasonable temporal stability, and the diffusion of the acid generator in a photoresist film produced from the composition can appropriately be controlled so that a photoresist pattern will be produced from the film with an excellent DOF.

The effect caused by the above-mentioned acid generator can be more enhanced by adjusting a molar volume of the acid generated therefrom.

The acid (I) or the acid (II) has a molar volume of preferably 850 cm³/mol or more, more preferably 900 cm³/mol or more. The molar volume of the acid (I) or the acid (II) is preferably 3000 cm³/mol or less, more preferably 2000 cm³/mol or less.

Herein, the volume is usually calculated with the software "Chem Draw Ultra Ver 11.0 Clinical Vol.".

<Resin (A)>

Resin (A) has a structural unit having an acid-labile group (which is sometimes referred to as "structural unit (a1)"). The resin is preferably decomposed by an action of acid to decrease in solubility in butyl acetate. Here the "acid-labile group" means a group having a leaving group capable of detaching by contacting with an acid to thereby form a hydrophilic group such as a hydroxy or carboxy group.

Resin (A) further has a structural unit having no acid-labile group (which is sometimes referred to as "structural unit (s)").

<Structural Unit (a1)>

The structural unit (a1) is derived from a monomer having an acid-labile group, which monomer is sometimes referred to as "monomer (a1)". In Resin (A), the acid-labile group which the structural unit (a1) has is preferably one represented by formula (1) or formula (2).

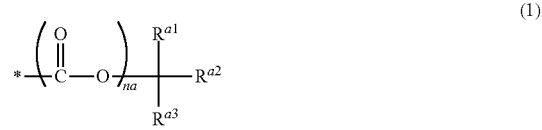

In the formula, $R^{a1}$ to $R^{a3}$ independently represent a C1 to C8 alkyl group, a C3 to C20 alicyclic hydrocarbon group or combination thereof, or $R^{a1}$ and $R^{a2}$ can be bonded together with a carbon atom bonded thereto to form a C3 to C20 divalent alicyclic hydrocarbon group, na represents an integer of 0 or 1, and * represents a binding position.

In the formula, $R^{a1'}$ and $R^{a2'}$ independently represent a hydrogen atom or a C1 to C12 hydrocarbon group, $R^{a3'}$ represents a C1 to C20 hydrocarbon group, or $R^{a2'}$ and $R^{a3'}$ can be bonded together with a carbon atom and X bonded thereto to form a divalent C3 to C20 heterocyclic group, and a methylene group contained in the hydrocarbon group or the divalent heterocyclic group can be replaced by an oxygen atom or sulfur atom, X represents —O— or —S—, and * represents a binding position.

Examples of the alkyl group for $R^{a1}$ to $R^{a3}$ include methyl, ethyl, propyl, n-butyl, n-pentyl, n-hexyl, n-heptyl and n-octyl groups.

Examples of the alicyclic hydrocarbon group for $R^{a1}$ to $R^{a3}$ include monocyclic groups such as a cycloalkyl group, i.e., cyclopentyl, cyclohexyl, cycloheptyl, cyclooctyl groups, and polycyclic hydrocarbon groups such as decahydronaphtyl, adamantyl and norbornyl groups as well as groups below. * represents a binding position.

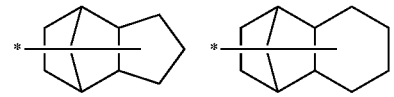

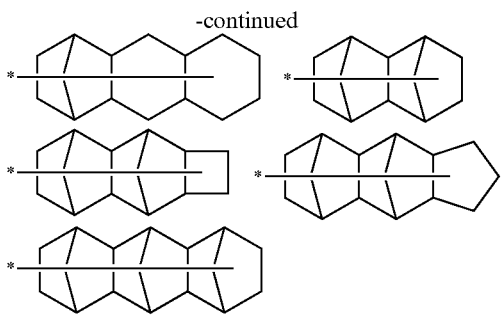

The alicyclic hydrocarbon group of $R^{a1}$ to $R^{a3}$ preferably has 3 to 16 carbon atoms.

Examples of groups combining the alkyl group and the alicyclic hydrocarbon group include methylcyclohexyl, dimethylcyclohexyl, methylnorbornyl, cyclohexylmethyl, adamantylmethyl and norbornyletyl groups.

na is preferably an integer of 0.

When $R^{a1}$ and $R^{a2}$ are bonded together to form a divalent alicyclic hydrocarbon group, examples of the group represented by $-C(R^{a1})(R^{a2})(R^{a3})$ include groups below. The divalent alicyclic hydrocarbon group preferably has 3 to 12 carbon atoms. * represent a binding position to —O—.

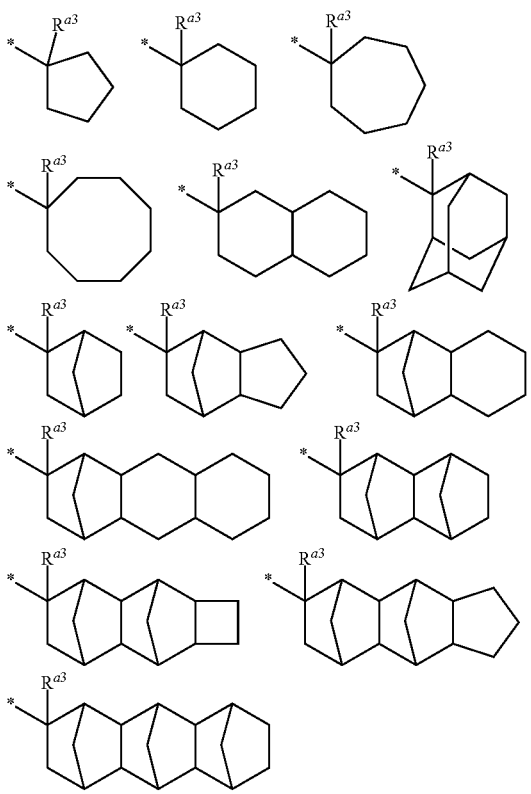

Specific examples of the group represented by formula (1) include 1,1-dialkylalkoxycarbonyl group (a group represented by formula (1) in which $R^{a1}$ to $R^{a3}$ are alkyl groups, preferably tert-butoxycarbonyl group), 2-alkyladamantane-2-yloxycarbonyl group (a group represented by formula (1) in which $R^{a1}$, $R^{a2}$ and a carbon atom form adamantyl group, and $R^{a3}$ is alkyl group), and 1-(adamantane-1-yl)-1-alkylalkoxycarbonyl group (a group represented by formula (1) in which $R^{a1}$ and $R^{a2}$ are alkyl group, and $R^{a3}$ is adamantyl group).

The hydrocarbon group for $R^{a1'}$ to $R^{a3'}$ includes an alkyl group, an alicyclic hydrocarbon group, an aromatic hydrocarbon group and a combination thereof. Examples of the alkyl group and the alicyclic hydrocarbon group are the same examples as described above.

Examples of the aromatic hydrocarbon group include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups.

Examples of the divalent heterocyclic group formed by binding with $R^{a2'}$ and $R^{a3'}$ include groups below. * represents a binding position.

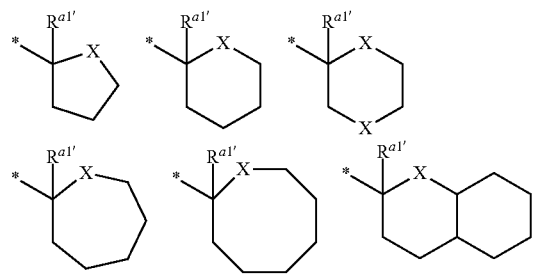

At least one of $R^{a1'}$ and $R^{a2'}$ is preferably a hydrogen atom. Specific examples of the group represented by formula (2) include a group below. * represents a binding position.

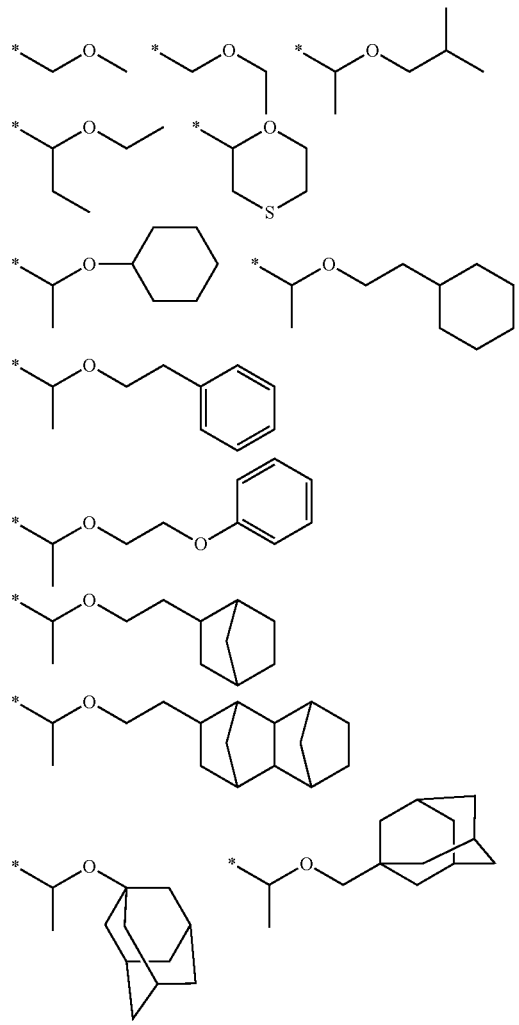

The monomer (a1) is preferably a monomer having an acid-labile group and an ethylene unsaturated bond, and more preferably a (meth)acrylic monomer having an acid-labile group.

Among the (meth)acrylic monomer having an acid-labile group, a monomer having a C5 to C20 alicyclic hydrocarbon group is preferred. When a resin (A) having a structural unit derived from a monomer (a1) having a bulky structure such as the alicyclic hydrocarbon group is used for a photoresist composition, the photoresist composition having excellent resolution tends to be obtained.

Examples of a structural unit derived from the (meth) acrylic monomer having the group represented by formula (1) preferably include structural units represented by formula (a1-0), formula (a1-1) and formula (a1-2) below. These may be used as one kind of the structural unit or as a combination of two or more kinds of the structural units. The structural unit represented by formula (a1-0), the structural unit represented by formula (a1-1) and a structural unit represented by formula (a1-2) are sometimes referred to as "structural unit (a1-0)", "structural unit (a1-1)" and "structural unit (a1-2)"), respectively, and monomers deriving the structural unit (a1-0), the structural unit (a1-1) and the structural unit (a1-2) are sometimes referred to as "monomer (a1-0)", "monomer (a1-1)" and "monomer (a1-2)", respectively.

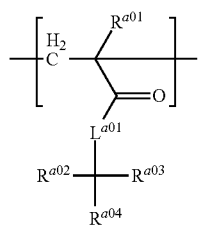

(a1-0)

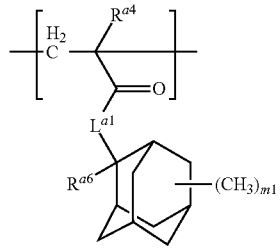

(a1-1)

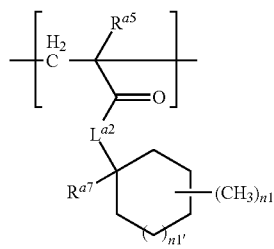

(a1-2)

In these formulae, $L^{a01}$, $L^{a1}$ and $L^{a2}$ independently represent —O— or *—O—$(CH_2)_{k1}$—CO—O— where k1 represents an integer of 1 to 7 and * represents a binding position to —CO—, $R^{a01}$, $R^{a4}$ and $R^{a5}$ independently represent a hydrogen atom or a methyl group, $R^{a02}$, $R^{a03}$ and $R^{a04}$ independently represent a C1 to C8 alkyl group, a C3 to C18 alicyclic hydrocarbon group or combination thereof, $R^{a6}$ and $R^{a7}$ independently represent a C1 to C8 alkyl group, a C3 to C18 alicyclic hydrocarbon group or a combination thereof, $R^{a6}$ and $R^{a7}$ independently represent a C1 to C8 alkyl group, a C3 to C18 alicyclic hydrocarbon group or a combination thereof, m1 represents an integer of 0 to 14, n1 represents an integer of 0 to 10, and n1' represents an integer of 0 to 3.

$L^{a01}$, $L^{a1}$ and $L^{a2}$ is preferably an —O— or *—O—$(CH_2)_{k01}$—CO—O— in which k01 is preferably an integer of 1 to 4, more preferably an integer of 1, still more preferably an —O—.

$R^{a4}$ and $R^{a5}$ are preferably a methyl group.

Examples of the alkyl group, an alicyclic hydrocarbon group and combination thereof for $R^{a02}$, $R^{a03}$, $R^{a04}$, $R^{a6}$ and $R^{a7}$ are the same examples as the group described in $R^{a1}$ to $R^{a3}$ in formula (1).

The alkyl group for $R^{a02}$, $R^{a03}$, $R^{a04}$, $R^{a6}$ and $R^{a7}$ is preferably a C1 to C6 alkyl group.

The alicyclic hydrocarbon group for $R^{a02}$, $R^{a03}$, $R^{a04}$, $R^{a6}$ and $R^{a7}$ is preferably a C3 to C8 alicyclic hydrocarbon group, more preferably a C3 to C6 alicyclic hydrocarbon group.

The group formed by combining the alkyl group and the alicyclic hydrocarbon group has preferably 18 or less of carbon atom. Examples of those groups include methylcyclohexyl, dimethylcyclohexyl, methylnorbornyl, methyladamantyl, cyclohexylmethyl, methyl cyclohexylmethyl, adamantylmethyl and norbornylmethyl groups.

Each of $R^{a02}$, $R^{a03}$, $R^{a04}$, $R^{a6}$ and $R^{a7}$ is preferably a C1 to C6 alkyl group, more preferably a methyl group or an ethyl group.

$R^{a04}$ is preferably a C1 to C6 alkyl group or a C5 to C12 alicyclic hydrocarbon group, more preferably a methyl, ethyl, cyclohexyl or adamantyl group.

m1 is preferably an integer of 0 to 3, and more preferably 0 or 1.

n1 is preferably an integer of 0 to 3, and more preferably 0 or 1.

n1' is preferably 0 or 1, and more preferably 1.

Examples of the structural unit (a1-0) preferably include those represented by formula (a1-0-1) to formula (a1-0-12) and these in which a methyl group corresponding to $R^{a01}$ has been replaced by a hydrogen atom, and more preferably monomers represented by formula (a1-0-1) to formula (a1-0-10).

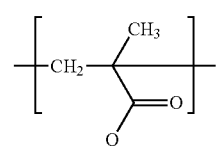

(a1-0-1)

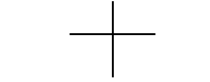

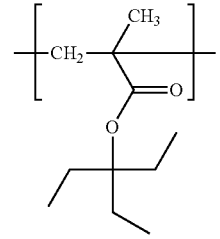

(a1-0-2)

(a1-0-3) 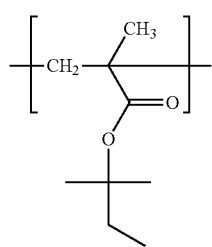
(a1-0-4) 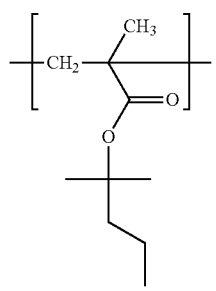
(A1-0-5) 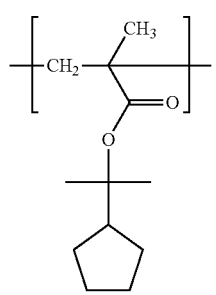
(a1-0-6) 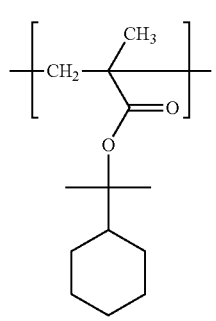
(a1-0-7) 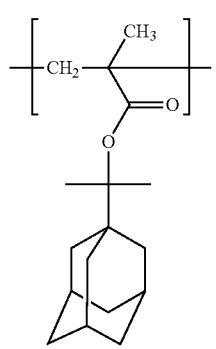
(a1-0-8) 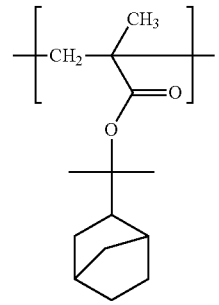
(a1-0-9) 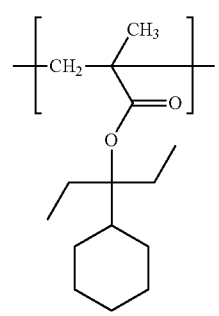
(a1-0-10) 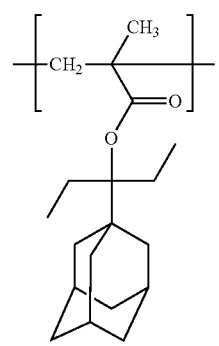
(a1-0-11) 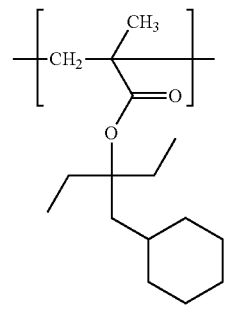
(a1-0-12) 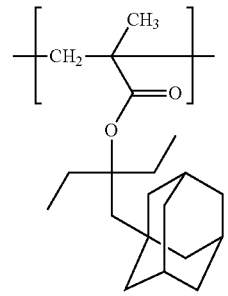
Examples of the structural unit (a1-1) include those derived from monomers described in JP 2010-204646A1.

Among them, preferred are structural units represented by formula (a1-1-1) to formula (a1-1-4) and those in which a methyl group corresponding to $R^{a4}$ has been replaced by a hydrogen atom.

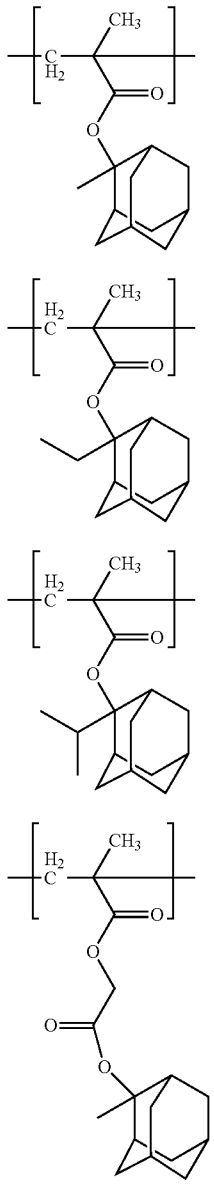

(a1-1-1)

(a1-1-2)

(a1-1-3)

(a1-1-4)

Examples of the structural unit (a1-2) include the structural units represented by formula (a1-2-1) to formula (a1-2-6), and preferably those represented by formula (a1-2-2) and formula (a1-2-5).

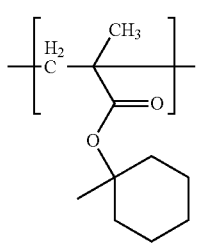

(a1-2-1)

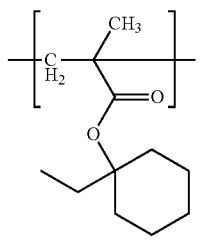

(a1-2-2)

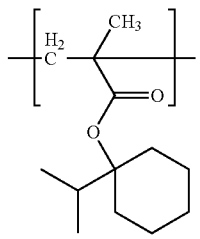

(a1-2-3)

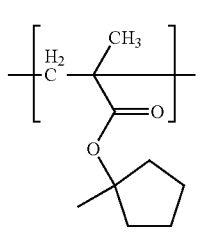

(a1-2-4)

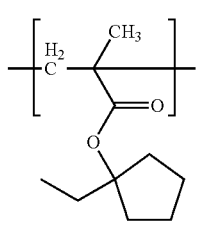

(a1-2-5)

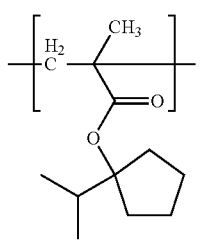

(a1-2-6)

Specific examples of the structural unit (a1-2) include the structural units represented by formula (a1-2-1) to formula (a1-2-6) in which a methyl group corresponding to $R^{a5}$ has been replaced by a hydrogen atom.

When Resin (A) has the structural unit (a1-0), the structural unit (a1-1) and/or the structural unit (a1-2), the total proportion thereof is generally 10 to 95% by mole, preferably 15 to 90% by mole, more preferably 20 to 85% by mole, with respect to all of the structural units (a1).

Examples of the structural unit (a1) further include the following ones.

(a1-3-1) 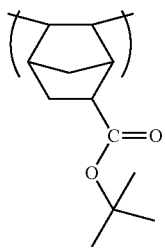

(a1-3-2) 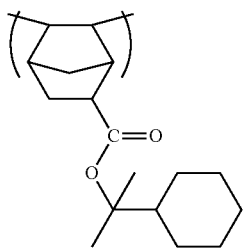

(a1-3-3) 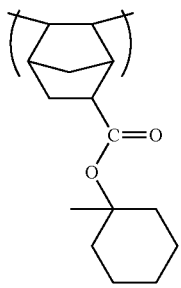

(a1-3-4) 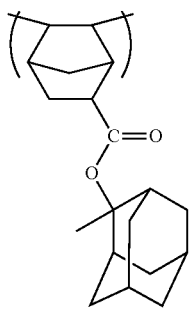

(a1-3-5) 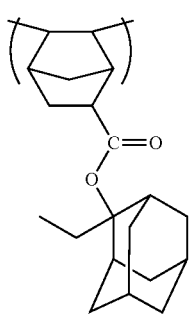

(a1-3-6) 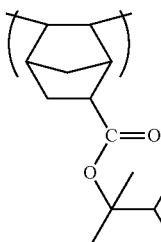

(a1-3-7) 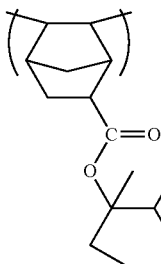

When Resin (A) has any one of the structural units represented by formula (a1-3-1) to formula (a1-3-7), the total proportion of these structural units is generally 10 to 95% by mole, preferably 15 to 90% by mole, more preferably 20 to 85% by mole, still more preferably 25% by mole to less than 65% by mole, with respect to the total structural units (100% by mole) constituting Resin (A).

Examples of a structural unit (a1) having a group represented by formula (2) include a structural unit represented by formula (a1-4). The structural unit is sometimes referred to as "structural unit (a1-4)".

(a1-4) 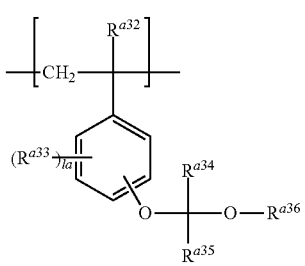

In the formula, $R^{a32}$ represents a hydrogen atom, a halogen atom or a C1 to C6 alkyl group which can have a halogen atom, $R^{a33}$ in each occurrence independently represent a halogen atom, a hydroxy group, a C1 to C6 alkyl group, a C1 to C6 alkoxy group, a C2 to C4 acyl group, a C2 to C4 acyloxy group, an acryloyloxy group or methacryloyloxy group, la represents an integer 0 to 4, $R^{a34}$ and $R^{a35}$ independently represent a hydrogen atom or a C1 to C12 hydrocarbon group; and $R^{a36}$ represents a C1 to C20 hydrocarbon group, or $R^{a35}$ and $R^{a36}$ can be bonded together with a C—O bonded thereto to form a C3 to C20 divalent heterocyclic group, and a methylene group contained in the hydrocarbon group or the divalent heterocyclic group can be replaced by an oxygen atom or sulfur atom.

Examples of the alkyl group for $R^{a32}$ and $R^{a33}$ include methyl, ethyl, propyl, isopropyl, butyl, pentyl and hexyl groups. The alkyl group is preferably a C1 to C4 alkyl group, and more preferably a methyl group or an ethyl group, and still more preferably a methyl group.

Examples of the halogen atom for $R^{a32}$ and $R^{a33}$ include fluorine, chlorine, bromine and iodine atoms.

Examples of the alkyl group which can have a halogen atom include trifluoromethyl, difluoromethyl, methyl, perfluoromethyl, 1,1,1-trifluoroethyl, 1,1,2,2-tetrafluoroethyl, ethyl, perfluoropropyl, 1,1,1,2,2-pentafluoropropyl, propyl, perfluorobutyl, 1,1,2,2,3,3,4,4-octafluorobutyl, butyl, perfluoropentyl, 1,1,1,2,2,3,3,4,4-nonafluoropentyl, n-pentyl, n-hexyl and n-perfluorohexyl groups.

Examples of an alkoxy group include methoxy, ethoxy, propoxy, butoxy, pentyloxy, and hexyloxy groups. The alkoxy group is preferably a C1 to C4 alkoxy group, more preferably a methoxy group or an ethoxy group, and still more preferably a methoxy group.

Examples of the acyl group include acetyl, propanonyl and butylyl groups.

Examples of the acyloxy group include acetyloxy, propanonyloxy and butylyloxy groups.

Examples of the hydrocarbon group for $R^{a34}$ and $R^{a35}$ are the same examples as described in $R^{a1'}$ to $R^{a2'}$ in formula (2).

Examples of hydrocarbon group for $R^{a36}$ include a C1 to C18 alkyl group, a C3 to C18 alicyclic hydrocarbon group, a C6 to C18 aromatic hydrocarbon group and a combination thereof.

In formula (a1-4), $R^{a32}$ is preferably a hydrogen atom.

$R^{a33}$ is preferably a C1 to C4 alkoxy group, more preferably a methoxy group or an ethoxy group, and still more preferably a methoxy group.

la is preferably 0 or 1, and more preferably 0.

$R^{a34}$ is preferably a hydrogen atom.

$R^{a35}$ is preferably a C1 to C12 hydrocarbon group, and more preferably a methyl group or an ethyl group.

The hydrocarbon group for $R^{a36}$ is preferably a C1 to C18 alkyl group, a C3 to C18 alicyclic hydrocarbon group, a C6 to C18 aromatic hydrocarbon group and a combination thereof, and more preferably a C1 to C18 alkyl group, a C3 to C18 alicyclic hydrocarbon group or a C7 to C18 aralkyl group. Each of the alkyl group and the alicyclic hydrocarbon group for $R^{a36}$ is preferably not substituted. When the aromatic hydrocarbon group of $R^{a36}$ has a substituent, the substituent is preferably a C6 to C10 aryloxy group. Examples of the structural unit (a1-4) include the following ones.

(a1-4-1)
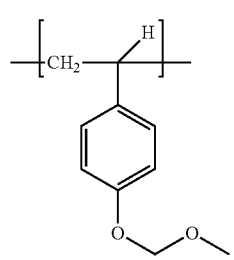

(a1-4-2)
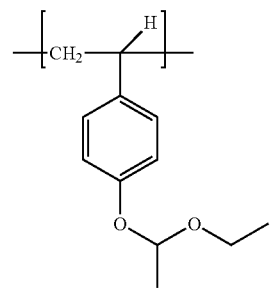

(a1-4-3)
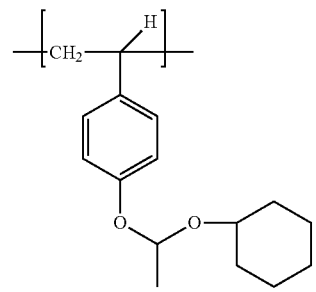

(a1-4-4)
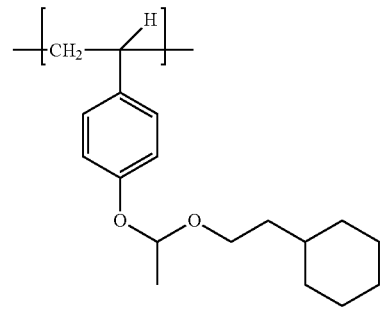

(a1-4-5)
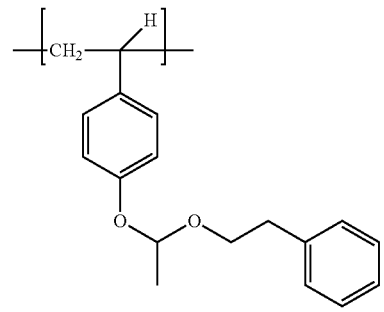

(a1-4-6)
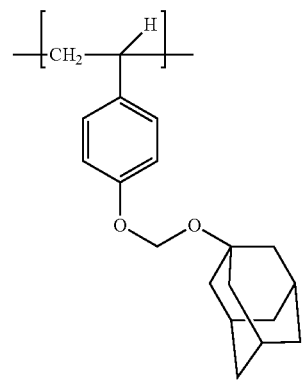

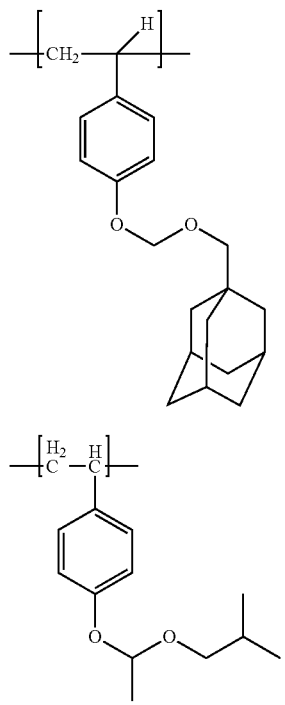

(a1-4-7)

(a1-4-8)

When Resin (A) contains the structural unit (a1-4), the proportion thereof is generally 10% by mole to 95% by mole, preferably 15% by mole to 90% by mole, more preferably 20% by mole to 85% by mole, still more preferably 25% by mole to less than 65% by mole, with respect to the total structural units constituting Resin (A) (100% by mole).

Examples of a structural unit having an acid-labile group, which is derived from a (meth)acrylic monomer include a structural unit represented by formula (a1-5). Such structural unit is sometimes referred to as "structural unit (a1-5)".

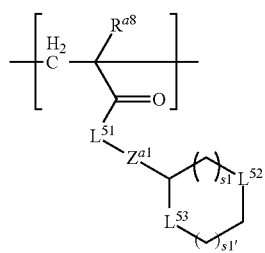

(a1-5)

In the formula, $R^{a8}$ represents a hydrogen atom, a halogen atom or a C1 to C6 alkyl group which can have a halogen atom, $Z^{a1}$ represents a single bond or *—$(CH_2)_{h3}$—CO-$L^{54}$-, where h3 represents an integer of 1 to 4, $L^{54}$ represents —O— or —S— and * represents a binding position to $L^{51}$, $L^{51}$, $L^{52}$ and $L^{53}$ independently represent —O— or —S—, s1 represents an integer of 1 to 3, and s1' represents an integer of 0 to 3.

Examples of the halogen atom include fluorine, chlorine, bromine and iodine atoms, and preferably a fluorine atom.

Examples of the alkyl group which can have a halogen atom include methyl, ethyl, propyl, butyl, pentyl, hexyl, heptyl, octyl, fluoromethyl and trifluoromethyl groups.

In formula (a1-5), $R^{a8}$ is preferably a hydrogen atom, a methyl group or trifluoromethyl group. $L^{51}$ is preferably —O—. $L^{52}$ and $L^{53}$ are independently preferably —O— or —S—, and more preferably one is —O— and another is —S—.

s1 is preferably 1.

s1' is preferably an integer of 0 to 2. $Z^{a1}$ is preferably a single bond or *—$CH_2$—CO—O— where * represents a binding position to $L^{51}$.

Examples of a monomer from which the structural unit (a1-5) is derived include a monomer described in JP 2010-61117A. Among them, the monomers are preferably monomers represented by formula (a1-5-1) to formula (a1-5-4), and more preferably monomers represented by formula (a1-5-1) to formula (a1-5-2) below.

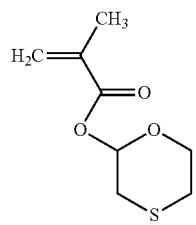

(a1-5-1)

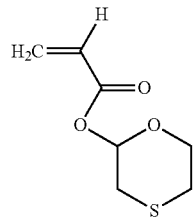

(a1-5-2)

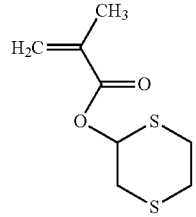

(a1-5-3)

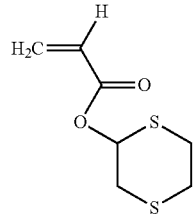

(a1-5-4)

When Resin (A) has the structural unit (a1-5), the proportion thereof is generally 1% by mole to 50% by mole, preferably 3% by mole to 45% by mole, and more preferably 5% by mole to 40% by mole, with respect to the total structural units (100% by mole) constituting Resin (A).

As the structural unit (a1), Resin (A) has preferably one or more structural units selected from the group consisting of a structural unit represented by formula (a1-1), a structural unit represented by formula (a1-2), a structural unit represented by formula (a1-5), more preferably two or more structural units selected from the above-mentioned group. Resin (A) has preferably at least one structural unit represented by formula (a1-2) as the structural unit (a1).

<Structural Unit (s)>

The structural unit (s) is derived from a monomer having no acid-labile group, which monomer is sometimes referred to as "monomer (s)".

For the monomer (s) from which a structural unit (s) is derived, a known monomer having no acid-labile group can be used.

As the structural unit (s), preferred is a structural unit having a hydroxy group or a lactone ring but having no acid-labile group. When the photoresist composition contains a resin which has a structural unit (s) having a hydroxy group (such structural unit is sometimes referred to as "structural unit (a2)") and/or a structural unit (s) having a lactone ring (such structural unit is sometimes referred to as "structural unit (a3)"), the adhesiveness of photoresist obtained therefrom to a substrate and resolution of photoresist pattern tend to be improved.

<Structural Unit (a2)>

A hydroxy group which the structural unit (a2) has can be an alcoholic hydroxy group or a phenolic hydroxy group.

When KrF excimer laser lithography (248 nm), or high-energy irradiation such as electron beam or EUV (extreme ultraviolet) is used for the photoresist composition, the structural unit having a phenolic hydroxy group is preferably used as structural unit (a2).

When ArF excimer laser lithography (193 nm) is used, the structural unit having an alcoholic hydroxy group is preferably used as structural unit (a2), and the structural represented by formula (a2-1) is more preferred. The structural unit (a2) can be used as one kind of the structural unit or as a combination of two or more kinds of the structural units. Examples of the structural unit (a2) having alcoholic hydroxy group include the structural unit represented by formula (a2-1) (which is sometimes referred to as "structural unit (a2-1)").

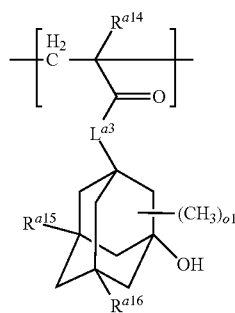

(a2-1)

In the formula, $L^{a3}$ represents —O— or *—O—$(CH_2)_{k2}$—CO—O—, k2 represents an integer of 1 to 7, * represents a binding position to —CO—, $R^{a14}$ represents a hydrogen atom or a methyl group, $R^{a15}$ and $R^{a16}$ each independently represent a hydrogen atom, a methyl group or a hydroxy group, and o1 represents an integer of 0 to 10.

In formula (a2-1), $L^{a3}$ is preferably —O—, —O—$(CH_2)_{f1}$—CO—O—, here f1 represents an integer of 1 to 4, and more preferably —O—. $R^{a14}$ is preferably a methyl group. $R^{a15}$ is preferably a hydrogen atom. $R^{a16}$ is preferably a hydrogen atom or a hydroxy group, more preferably a hydroxy group. o1 is preferably an integer of 0 to 3, and more preferably an integer of 0 or 1.

Preferred examples of the structural unit (a2-1) include those represented by formula (a2-1-1) to formula (a2-1-3), and more preferably those represented by formula (a2-1-1) to formula (a2-1-2).

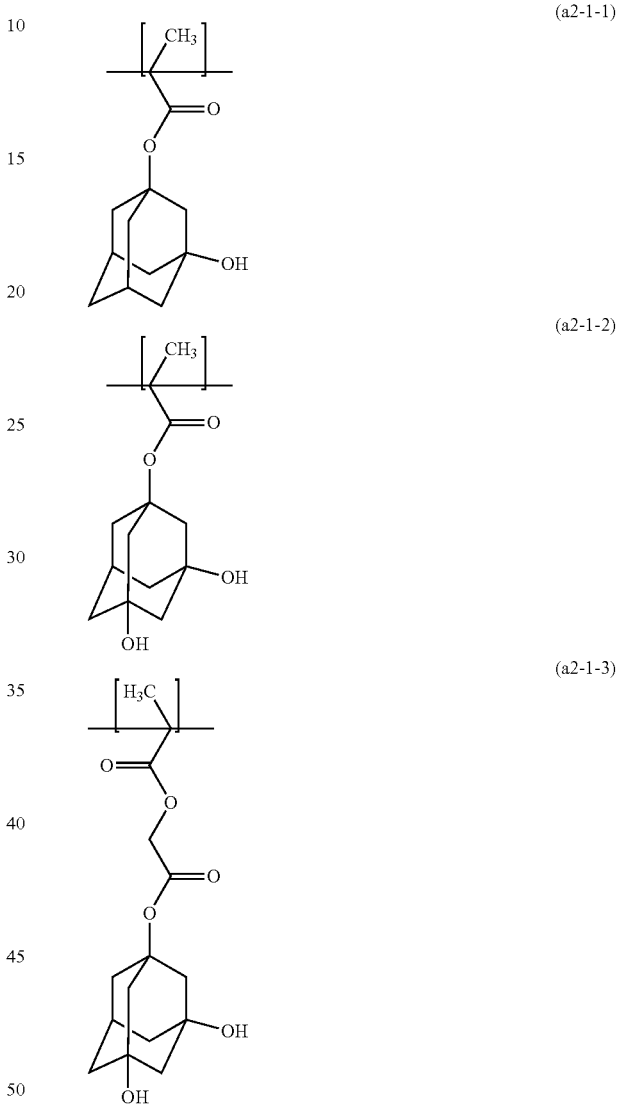

Examples of the structural unit (a2-1) also include those represented by formulae (a2-1-1) to (a2-1-3) in which a methyl group corresponding to $R^{a14}$ has been replaced by a hydrogen atom.

When Resin (A) has the structural unit (a2-1), the proportion thereof is generally 1% by mole to 45% by mole, preferably 1% by mole to 40% by mole, more preferably 1% by mole to 35% by mole, and still more preferably 2% by mole to 20% by mole, with respect to the total structural units (100% by mole) constituting Resin (A).

<Structural Unit (a3)>

The lactone ring included in the structural unit (a3) can be a monocyclic compound such as β-propiolactone, γ-butyrolactone, δ-valerolactone, or a condensed ring of monocyclic lactone ring with another ring. Examples of the lactone ring preferably include γ-butyrolactone or bridged ring with γ-butyrolactone.

Examples of the structural unit (a3) include structural units represented by any of formula (a3-1), formula (a3-2), formula (a3-3) and formula (a3-4). These structural units may be used as one kind of the structural unit or as a combination of two or more kind of the structural units.

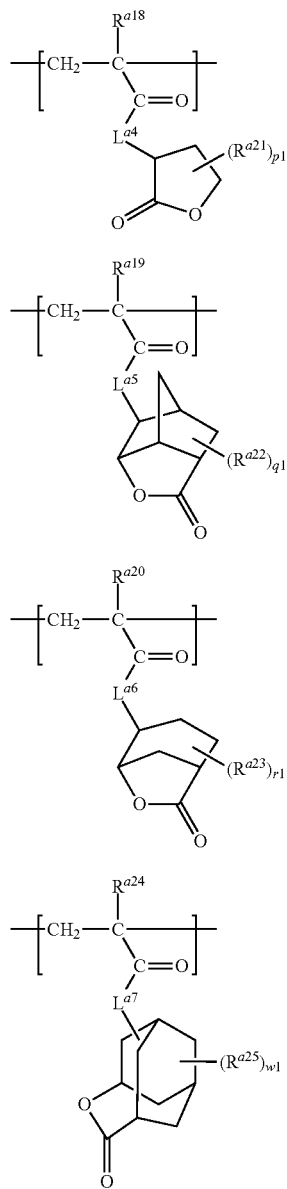

In the formula, $L^{a4}$, $L^{a5}$ and $L^{a6}$ each independently represent *—O— or *—O—$(CH_2)_{k3}$—CO—O—, k3 represents an integer of 1 to 7, * represents a binding position to a carbonyl group, $L^{a7}$ represents —O—, *—O-$L^{a8}$-O—, *—O-$L^{a8}$-CO—O—, *—O-$L^{a8}$-CO—O-$L^{a9}$-CO—O— or *—O-$L^{a8}$-O—CO-$L^{a9}$-O— where * represents a binding position to a carbonyl group, $L^{a8}$ and $L^{a9}$ each independently represent a C1 to C6 alkanediyl group, and $R^{a18}$, $R^{a19}$ and $R^{a20}$ each independently represent a hydrogen atom or a methyl group, $R^{a24}$ represents a hydrogen atom, a halogen atom or a C1 to C6 alkyl group which can have a halogen atom, $R^{a21}$ each occurrence represents a C1 to C4 aliphatic hydrocarbon group, $R^{a22}$, $R^{a23}$ and $R^{a25}$ in each occurrence represent a carboxy group, a cyano group or a C1 to C4 aliphatic hydrocarbon group, p1 represents an integer of 0 to 5, q1 represents an integer of 0 to 3, r1 represents an integer of 0 to 3, and w1 represents an integer of 0 to 8. Examples of the aliphatic hydrocarbon group for $R^{a21}$, $R^{a2}$ and $R^{a23}$ include an alkyl group such as methyl, ethyl, n-propyl, isopropyl, n-butyl, sec-butyl, tert-butyl, n-pentyl and n-hexyl groups.

Examples of a halogen atom for $R^{a24}$ include fluorine, chlorine, bromine and iodine atoms.

Examples of an alkyl group for $R^{a24}$ include methyl, ethyl, n-propyl, isopropyl, n-butyl, sec-butyl, tert-butyl, n-pentyl and n-hexyl groups, preferably methyl and ethyl groups.

Examples of the alkyl group having a halogen atom for $R^{a24}$ include trifluoromethyl, perfluoroethyl, perfluoropropyl, perfluoro-isopropyl, perfluorobutyl, perfluoro-sec-butyl, perfluoro-tert-butyl, perfluoropentyl, perfluorohexyl, tricloromethyl, tribromomethyl and triiodomethyl groups.

Examples of an alkanediyl group for $L^{a8}$ and $L^{a9}$ include methylene, ethylene, propane-1,3-diyl, propane-1,2-diyl, butane-1,4-diyl, pentane-1,5-diyl, hexane-1,6-diyl, butane-1,3-diyl, 2-methylpropane-1,3-diyl, 2-methylpropane-1,2-diyl, pentane-1,4-diyl and 2-methylbutane-1,4-diyl groups.

In formulae (a3-1) to (a3-3), $L^{a4}$ to $L^{a6}$ is independently preferably —O—, *—O—$(CH_2)_{k3'}$—CO—O—, here k3' represents an integer of 1 to 4, more preferably —O— or *—O—$CH_2$—CO—O—, and still more preferably —O—. $R^{a18}$ to $R^{a21}$ are preferably a methyl group.

In formula (a3-4), $R^{a24}$ is preferably a hydrogen atom or a C1 to C4 alkyl group, more preferably a hydrogen atom, a methyl group or an ethyl group, and still preferably a hydrogen atom or a methyl group. $L^{a7}$ is preferably —O—, or *—O-$L^{a8}$-CO—O—, more preferably —O—, *—O—$CH_2$—CO—O—, or *—O—$(CH_2)_2$—CO—O—.

In formulae (a3-1), (a3-2) and (a3-4), $R^{a22}$, $R^{a23}$ and $R^{a25}$ are independently preferably a carboxy group, a cyano group or a methyl group.

In formulae (a3-1) to (a3-4), p1, q1, r1 and w1 are independently preferably an integer of 0 to 2, and more preferably 0 or 1.

The structural unit represented by formula (a3-4) is preferably one represented by formula (a3-4)'.

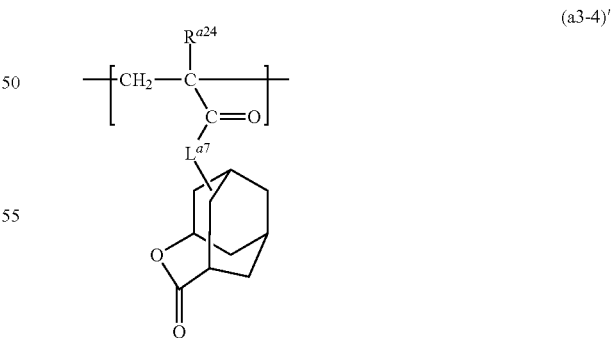

In the formula, $R^{a24}$ and $L^{a7}$ are as defined above.

Examples of the monomer from which the structural unit (a3) is derived include monomers described in JP 2010-204646A1, monomers described in JP2000-122294A and monomers described in JP2012-41274A1. The structural units are preferably structural units represented by the following formulae, more preferably a structural unit represented by formula (a3-1-1), (a3-2-3), (a3-4-1) to (a3-4-12), and still more preferably a structural unit represented by any one of formulae (a3-4-1) to (a3-4-6).
(a3-1-1)
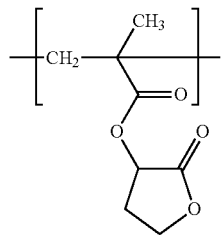
(a3-1-2)
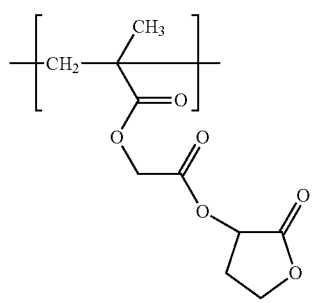
(a3-2-1)
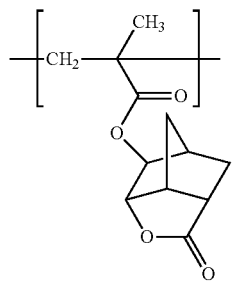
(a3-2-2)
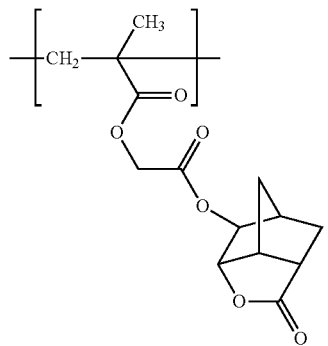
(a3-2-3)
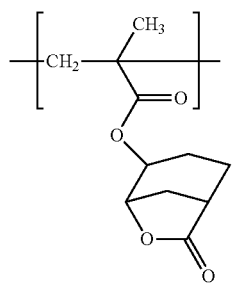
(a3-2-4)
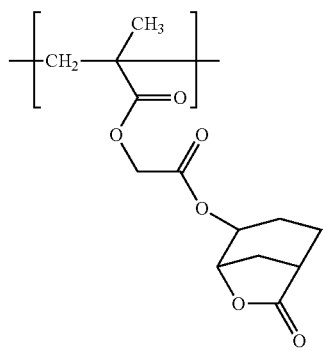
(a3-4-1)
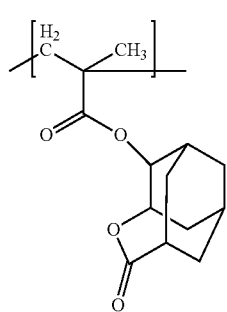
(a3-4-2)
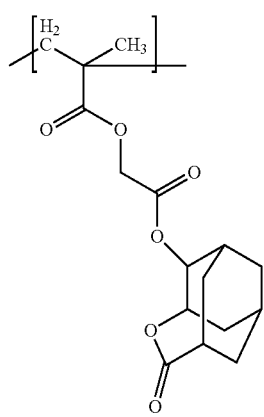
(a3-4-3)
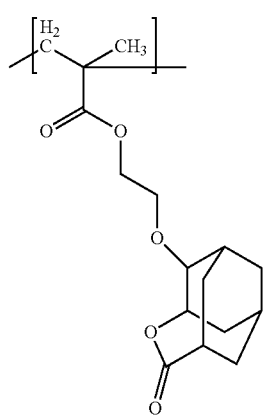

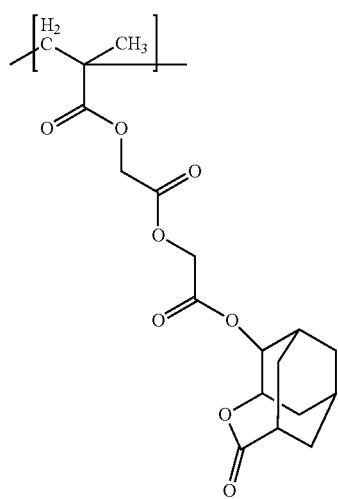
(a3-4-4)
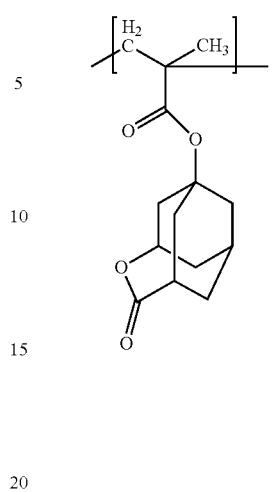
(a3-4-7)
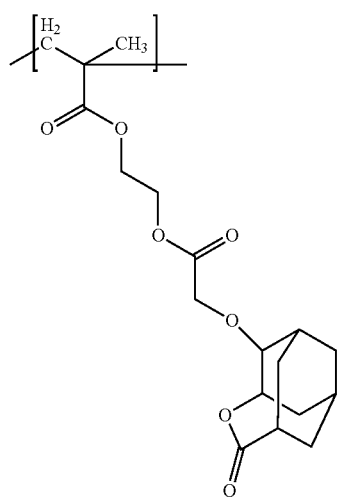
(a3-4-5)
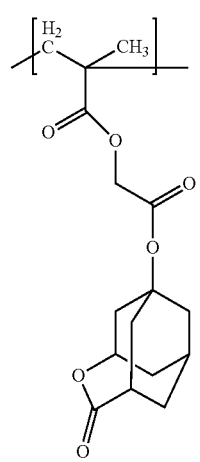
(a3-4-8)
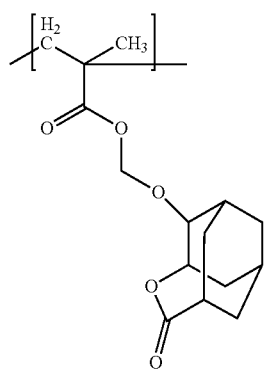
(a3-4-6)
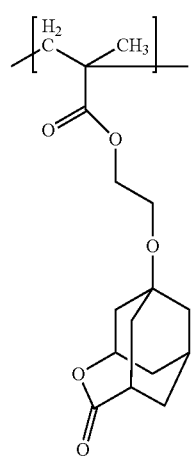
(a3-4-9)

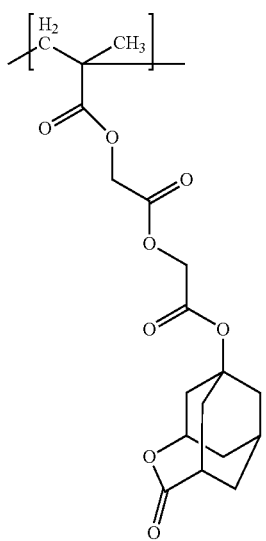

(a3-4-10)

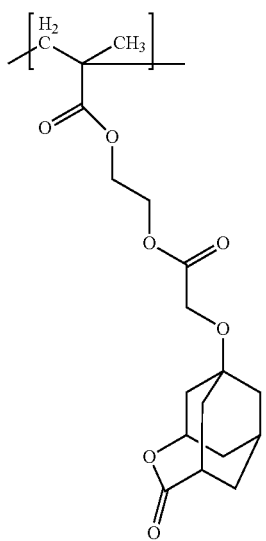

(a3-4-11)

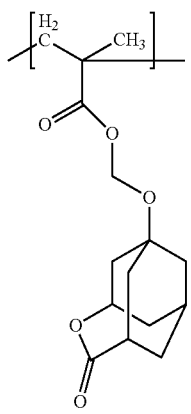

(a3-4-12)

Examples of the structural unit (a3) also include those represented by formulae (a3-1-1), (a3-1-2), (a3-2-1) to (a3-1-4) and (a3-4-1) to (a3-4-12) in which a methyl group has been replaced by a hydrogen atom.

When Resin (A) has the structural unit (a3), the total proportion thereof is preferably 5% by mole to 70% by mole, more preferably 10% by mole to 65% by mole, still more preferably 10% by mole to 60% by mole, with respect to the total structural units (100% by mole) constituting Resin (A). The proportion of each structural unit represented by formula (a3-1), formula (a3-2), formula (a3-3) and formula (a3-4) is preferably 5% by mole to 60% by mole, more preferably 5% by mole to 50% by mole, still more preferably 10% by mole to 50% by mole, further still more preferably 40% by mole to 55% by mole, with respect to the total structural units (100% by mole) constituting Resin (A).

<Structural Unit (t)>

Examples of the structural unit further include a structural unit which can have a halogen atom (which is sometimes referred to as "structural unit (a4)"), and a structural unit having a non-leaving hydrocarbon group (which is sometimes referred to as "structural unit (a5)"). Hereinafter, the structural units (a4) and (a5) are collectively referred to as "structural unit (t)".

<Structural Unit (a4)>

Examples of the structural unit (a4) include the structural units represented by formula (a4-0).

$$\left[\begin{array}{c} H_2 \\ C \end{array} \begin{array}{c} R^5 \\ \phantom{C} \\ \phantom{C}=O \end{array}\right]$$
$$\phantom{XXX} O \\ \phantom{XXX} L^5 \\ \phantom{XXXX} L^3 \\ \phantom{XXXXX} R^6$$

(a4-0)

In the formula, $R^5$ represents a hydrogen atom or a methyl group, $L^5$ represent a single bond or a C1 to C4 saturated aliphatic hydrocarbon group, $L^3$ represents a C1 to C8 perfluoroalkanediyl group or a C3 to C12 perfluorocycloalkanediyl group, and $R^6$ represents a hydrogen atom or a fluorine atom.

Examples of the saturated aliphatic hydrocarbon group for $L^5$ include a liner alkanediyl group such as methylene, ethylene, propane-1,3-diyl, butane-1,4-diyl, and a branched alkanediyl group such as ethane-1,1-diyl, propane-1,2-diyl, butane-1,3-diyl, 2-methylpropane-1,3-diyl and 2-methylpropane-1,2-diyl groups.

Examples of the perfluoroalkanediyl group for $L^3$ include difluoromethylene, perfluoroethylene, perfluoroethylmethylene, perfluoropropane-1,3-diyl, perfluoropropane-1,2-diyl, perfluoropropane-2,2-diyl, perfluorobutane-1,4-diyl, perfluorobutane-2,2-diyl, perfluorobutane-1,2-diyl, perfluoropentane-1,5-diyl, perfluoropentane-2,2-diyl, perfluoropentane-3,3-diyl, perfluorohexane-1,6-diyl, perfluorohexane-2,2-diyl, perfluorohexane-3,3-diyl, perfluoroheptane-1,7-diyl, perfluoroheptane-2,2-diyl, perfluoroheptane-3,4-diyl, perfluoroheptane-4,4-diyl, perfluorooctan-1,8-diyl, perfluorooctan-2,2-diyl, perfluorooctan-3,3-diyl and perfluorooctan-4,4-diyl groups.

Examples of the perfluorocycloalkanediyl group for $L^3$ include perfluorocyclohexanediyl, perfluorocyclopentanediyl, perfluorocycloheptanediyl and perfluoroadamantanediyl groups.

$L^5$ is preferably a single bond, a methylene or an ethylene group, and more preferably a single bond or a methylene group.

$L^3$ is preferably a C1 to C6 perfluoroalkanediyl group, more preferably a C1 to C3 perfluoroalkanediyl group.

Examples of the structural unit (a4-0) include structural units represented by formula (a4-0-1) to formula (a4-0-16).
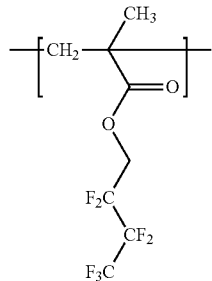
(a4-0-1)
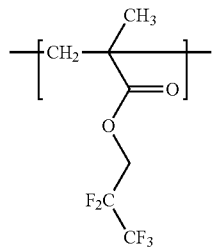
(a4-0-2)
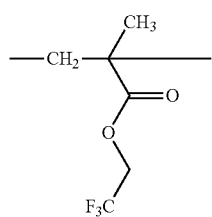
(a4-0-3)
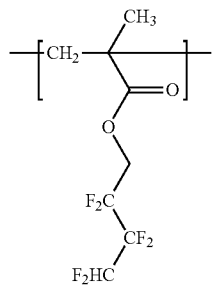
(a4-0-4)
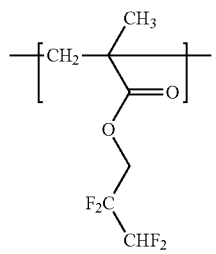
(a4-0-5)
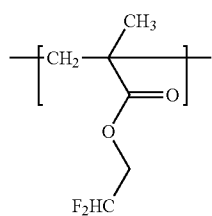
(a4-0-6)
-continued
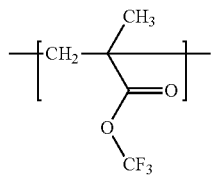
(a4-0-7)
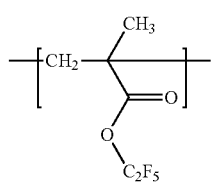
(a4-0-8)
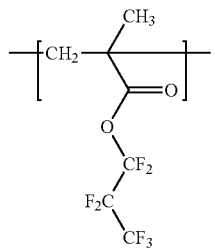
(a4-0-9)
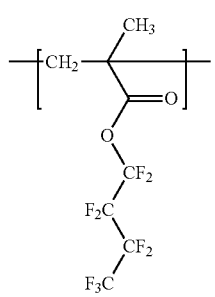
(a4-0-10)
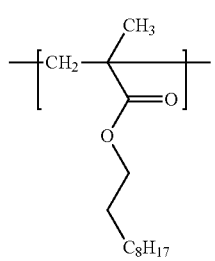
(a4-0-11)
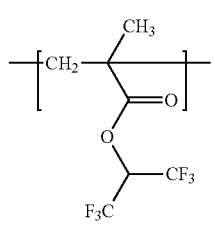
(a4-0-12)
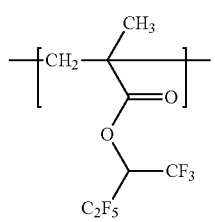
(a4-0-13)

-continued

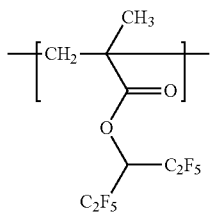
(a4-0-14)

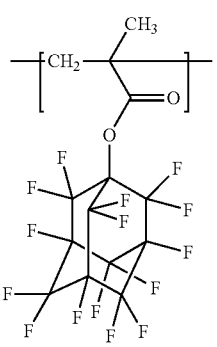
(a4-0-15)

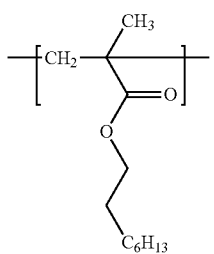
(a4-0-16)

Examples of the structural unit (a4) also include those represented by formulae (a4-0-1) to (a4-0-16) in which a methyl group has been replaced by a hydrogen atom.

Examples of the structural unit (a4) include the structural units represented by formula (a4-1).

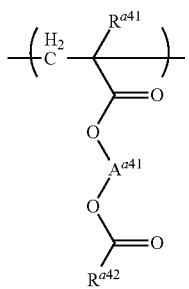
(a4-1)

In the formula, $R^{a41}$ represents a hydrogen atom or a methyl group, $R^{a42}$ represents an optionally substituted C1 to C20 hydrocarbon group where a methylene group can be replaced by an oxygen atom or a carbonyl group, and $A^{a41}$ represents an optionally substituted C1 to C6 alkanediyl group or a group represented by formula (a-g1):

**—$A^{a42}$—(—$X^{a41}$—$A^{a43}$—)$_s$—$X^{a42}$—$A^{a44}$—*      (a-g1)

wherein s represents 0 or 1, $A^{a42}$ and $A^{a44}$ independently represent an optionally substituted C1 to C5 divalent aliphatic hydrocarbon group, $A^{a43}$ in occurrence represents a single bond or an optionally substituted C1 to C5 divalent aliphatic hydrocarbon group, and $X^{a41}$ and $X^{a42}$ independently represent —O—, —CO—, —CO—O— or —O—CO—, provided that the total number of the carbon atoms contained in the group of $A^{a42}$, $A^{a43}$, $A^{a44}$, $X^{a41}$ and $X^{a42}$ is 7 or less, and at least one of $A^{a41}$ and $R^{a42}$ has a halogen atom as a substituent, and * and ** represent a binding position, and * represents a binding position to —O—CO—$R^{a42}$.

The hydrocarbon group for $R^{a42}$ includes a chain aliphatic hydrocarbon group, a cyclic aliphatic hydrocarbon group, an aromatic hydrocarbon group and a combination thereof.

The hydrocarbon group may have a carbon-carbon unsaturated bond, is preferably a chain aliphatic hydrocarbon group, a cyclic saturated aliphatic hydrocarbon group and a combination thereof.

The saturated aliphatic hydrocarbon group is preferably a liner or a branched alkyl group, a monocyclic or a polycyclic alicyclic hydrocarbon group, and an aliphatic hydrocarbon group combining an alkyl group with an alicyclic hydrocarbon group.

Examples of the chain aliphatic hydrocarbon group include an alkyl group such as methyl, ethyl, n-propyl, n-butyl, n-pentyl, n-hexyl, n-heptyl, n-octyl, n-decyl, n-dodecyl, n-pentadecyl, n-hexadecyl, n-heptadecyl and n-octadecyl groups. Examples of the cyclic aliphatic hydrocarbon group include a monocyclic hydrocarbon group, i.e., cycloalkyl group such as cyclopentyl, cyclohexyl, cycloheptyl, cyclooctyl groups; and polycyclic hydrocarbon groups such as decahydronaphtyl, adamantyl and norbornyl groups as well as groups below. * represents a binding position.

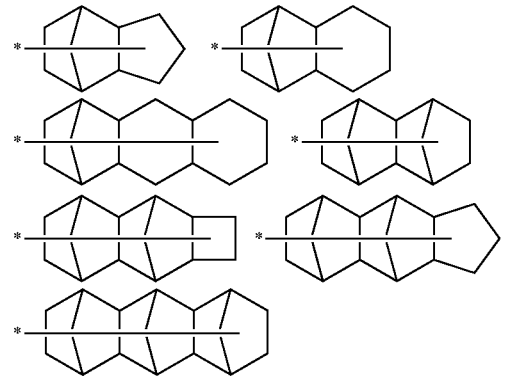

Examples of the aromatic hydrocarbon group include an aryl group such as phenyl, naphthyl, anthryl, biphenyl, phenanthryl and fluorenyl groups. Examples of the substituent of $R^{a42}$ include a halogen atom or a group represented by formula (a-g3).

*—$X^{a43}$-$A^{a45}$      (a-g3)

In the formula, $X^{a43}$ represent an oxygen atom, a carbonyl group, a carbonyloxy group or an oxycarbonyl group, $A^{a45}$ represents a C1 to C17 aliphatic hydrocarbon group that has a halogen atom, and * represents a binding position.

Examples of the halogen atom include fluorine, chlorine, bromine and iodine atom, and a fluorine atom is preferred.

Examples of the aliphatic hydrocarbon group for $A^{a45}$ are the same examples as the group of $R^{a42}$.

$R^{a42}$ is preferably an aliphatic hydrocarbon group which can have a halogen atom, and more preferably an alkyl group having a halogen atom and/or an aliphatic hydrocarbon group having the group represented by formula (a-g3). When $R^{a42}$ is an aliphatic hydrocarbon group having a halogen atom, an aliphatic hydrocarbon group having a fluorine atom is preferred, a perfluoroalkyl group or a perfulorocycloalkyl group are more preferred, a C1 to C6 perfluoroalkyl group is still more preferred, a C1 to C3 perfluoroalkyl group is particularly preferred.

Examples of the perfluoroalkyl group include perfluoromethyl, perfluoroethyl, perfluoropropyl, perfluorobutyl, perfluoropentyl, perfluorohexyl, perfluoroheptyl and perfluorooctyl groups. Examples of the perfluorocycloalkyl group include perfluorocyclohexyl group. When $R^{a42}$ is an aliphatic hydrocarbon group having the group represented by formula (a-g3), the total number of the carbon atoms contained in the aliphatic hydrocarbon group including the group represented by formula (a-g3) is preferably 15 or less, more preferably 12 or less. The number of the group represented by formula (a-g3) is preferably one when the group represented by formula (a-g3) is the substituent.

Preferred structures represented by formula (a-g3) include the following ones.

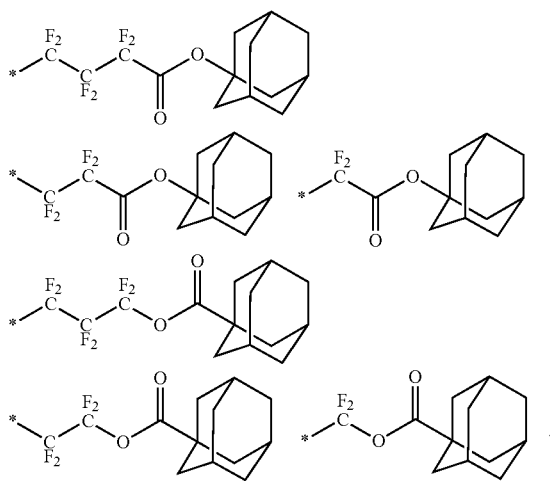

Examples of the alkanediyl group for $A^{a41}$ include a liner alkanediyl group such as methylene, ethylene, propane-1,3-diyl, butane-1,4-diyl, pentane-1,5-diyl and hexane-1,6-diyl groups;

a branched alkanediyl group such as propane-1,2-diyl, butan-1,3-diyl, 2-methylpropane-1,2-diyl, 1-methylpropane-1,4-diyl, 2-methylbutane-1,4-diyl groups.

Examples of the substituent of the alkanediyl group of $A^{a41}$ include a hydroxy group and a C1 to C6 alkoxy group.

Examples of the substituent of the alkanediyl of $A^{a41}$ include a hydroxy group and a C1 to C6 alkoxy group.

$A^{a41}$ is preferably a C1 to C4 alkanediyl group, more preferably a C2 to C4 alkanediyl group, and still more preferably an ethylene group.

In the group represented by formula (a-g1) (which is sometimes referred to as "group (a-g1)"), the aliphatic hydrocarbon group for $A^{a42}$, $A^{a43}$ and $A^{a44}$ may have a carbon-carbon unsaturated bond, is preferably a saturated aliphatic hydrocarbon group.

The saturated aliphatic hydrocarbon group is preferably a liner or a branched alkyl group, a monocyclic or a polycyclic alicyclic hydrocarbon group, and an aliphatic hydrocarbon group combining an alkyl group with an alicyclic hydrocarbon group.

Examples of the aliphatic hydrocarbon group for $A^{a42}$, $A^{a43}$ and $A^{a44}$ include methylene, ethylene, propane-1,3-diyl, propane-1,2-diyl, butane-1,4-diyl, 1-methylpropane-1,3-diyl, 2-methylpropane-1,3-diyl and 2-methylpropane-1,2-diyl groups.

Examples of the substituent of the aliphatic hydrocarbon group of $A^{a42}$, $A^{a43}$ and $A^{a44}$ include a hydroxy group and a C1 to C6 alkoxy group.

s is preferably 0.

Examples of the group (a-g1) in which $X^{a42}$ represents an oxygen atom, a carbonyl group, a carbonyloxy group or an oxycarbonyl group include the following ones. In the formula, * and  each represent a binding position, and  represents a binding position to —O—CO—$R^{a42}$.

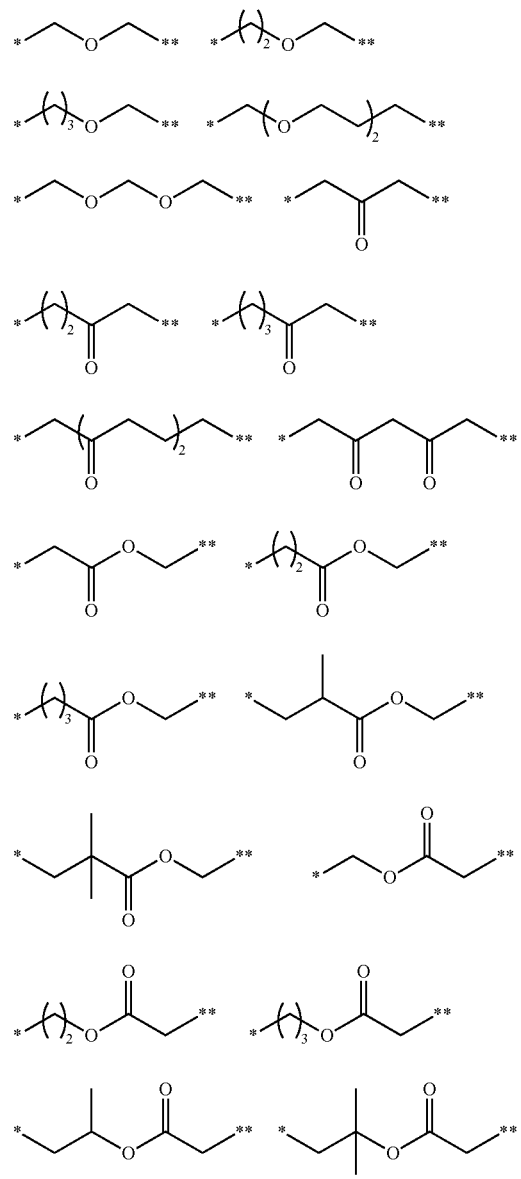

Examples of the structural unit represented by formula (a4-1) include structural units represented by the formulae and those represented by the formulae in which a methyl group has been replaced by a hydrogen atom.

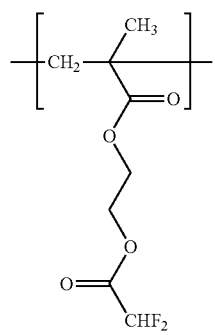
(a4-1-1)
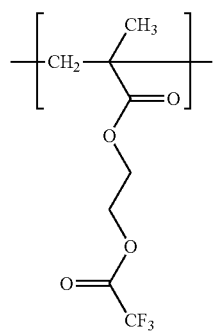
(a4-1-2)
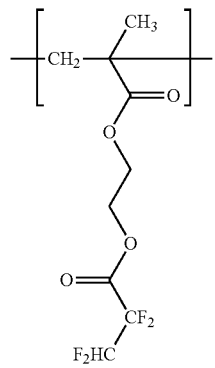
(a4-1-3)
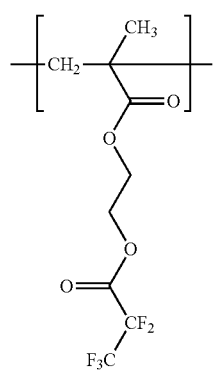
(a4-1-4)
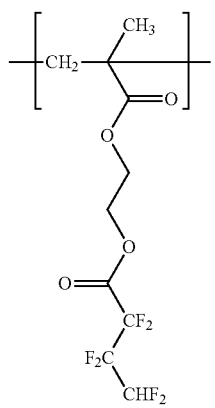
(a4-1-5)
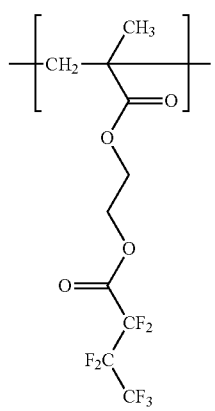
(a4-1-6)
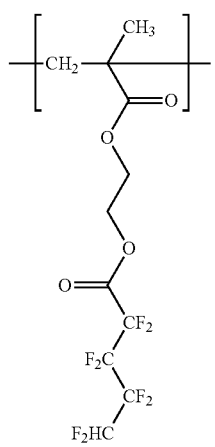
(a4-1-7)

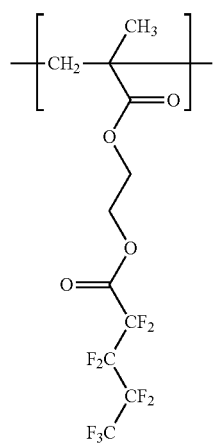
(a4-1-8)
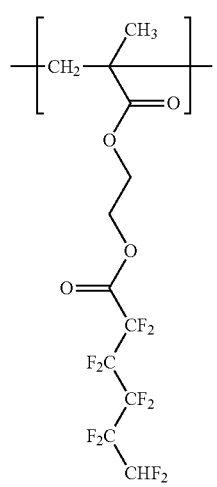
(a4-1-9)
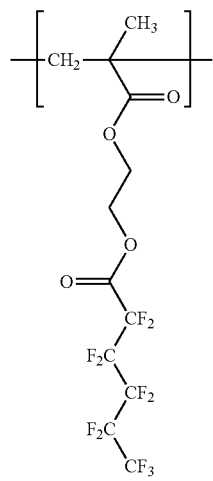
(a4-1-10)
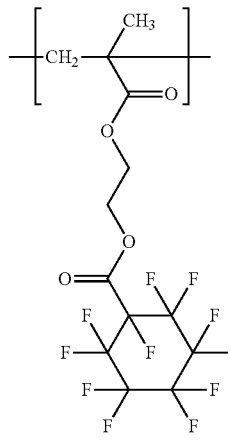
(a4-1-11)
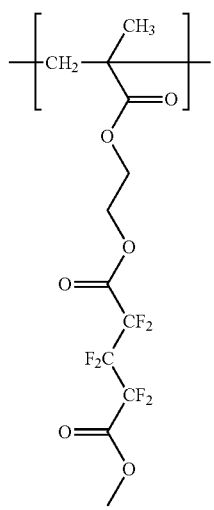
(a4-1'-1)
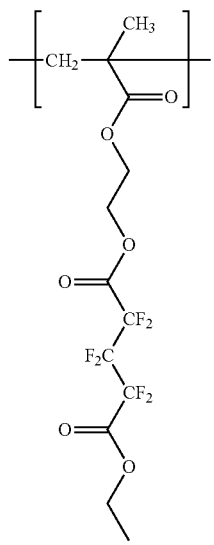
(a4-1'-2)

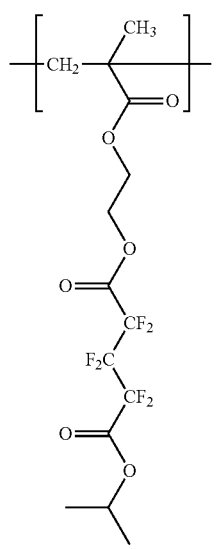
(a4-1'-3)
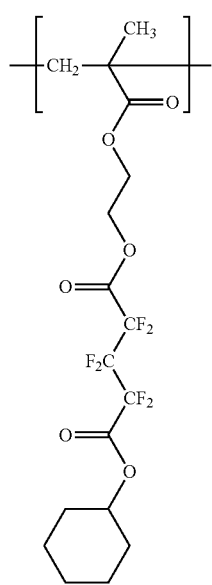
(a4-1'-4)
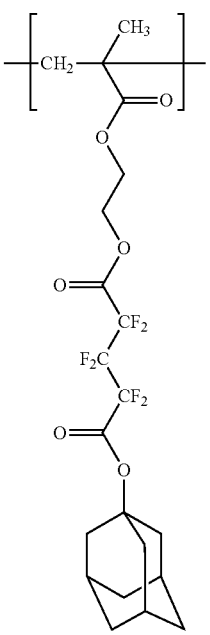
(a4-1'-5)
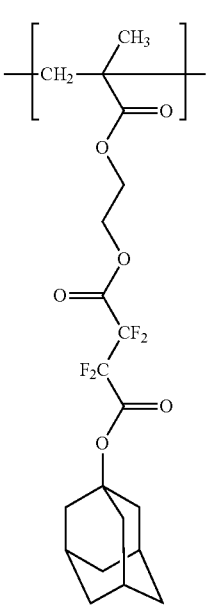
(a4-1'-6)

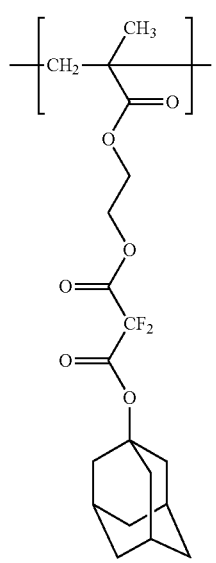
(a4-1'-7)
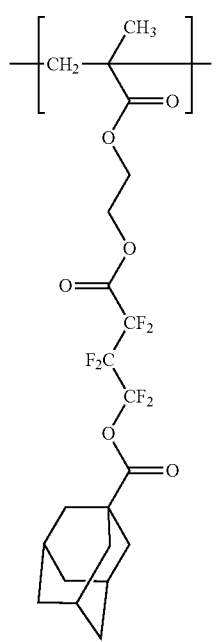
(a4-1'-8)
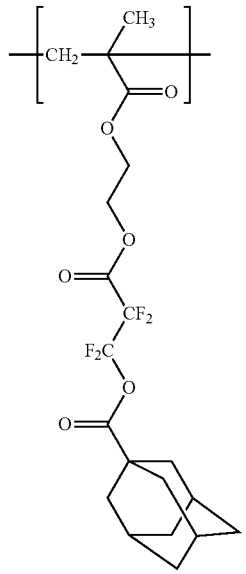
(a4-1'-9)
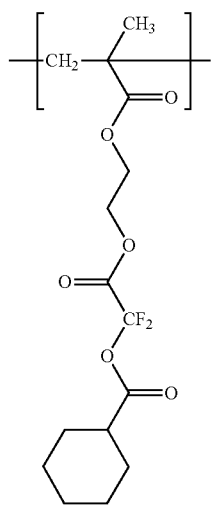
(a4-1'-10)
(a4-1'-11)

Examples of the structural unit (a4) further include a structural unit presented by formula (a4-4):

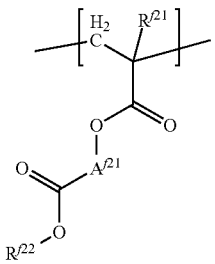

(a4-4)

wherein $R^{f21}$ represents a hydrogen atom or a methyl group, $A^{f21}$ represents —$(CH_2)_{j1}$—$(CH_2)_{j2}$—O—$(CH_2)_{j3}$— or —$(CH_2)_{j4}$—CO—O—$(CH_2)_{j5}$—, j1 to j5 independently represents an integer of 1 to 6, and $R^{f22}$ represents a C1 to C10 hydrocarbon group having a fluorine atom. Examples of the hydrocarbon group having a fluorine atom for $R^{f22}$ include a C1 to C10 alkyl group having a fluorine atom and a C3 to C10 alicyclic hydrocarbon group having a fluorine atom.

Specific examples of $R^{f22}$ include a difluoromethyl group, a trifluoromethyl group, 1,1-difluoroethyl group, 2,2-difluoroethyl group, a 2,2,2-trifluoroethyl group, a perfluoroethyl group, a 1,1,2,2-tetrafluoropropyl group, a 1,1,2,2,3,3-hexafluoropropyl group, a perfluoroethylmethyl group 1-(trifluoromethyl)-1,2,2,2-tetrafluoroethyl group, 1-(trifluoromethyl)-2,2,2-trifluoroethyl group, a perfluoroethyl group, 1,1,2,2-tetrafluorobutyl, 1,1,2,2,3,3-hexafluorobutyl, 1,1,2,2,3,3,4,4-octafluorobutyl, a perfluorobuthyl group, 1,1-bis(trifluoro) methyl-2,2,2-trifluoroethyl group, 2-(perfluoropropyl) ethyl group, 1,1,2,2,3,3,4,4-octafluoropentyl group, a perfluoropentyl group, 1,1,2,2,3,3,4,4,5,5-fluorodecapentyl group, 1,1-(trifluoromethyl)-2,2,3,3,3-pentafluoropropyl group, 2-(perfluorobuthyl) ethyl group, 1,1,2,2,3,3,4,4,5,5-decafluorohexyl group, a 1,1,2,2,3,3,4,4,5,5,6,6-dodecafluorohexyl group, diperfluoropentylmethyl group, a perfluorohexyl group, a perfluorocyclohexyl group and a perfluoroadamantyl group.

$R^{f22}$ is preferably a C1 to C10 alkyl group having a fluorine atom or a C3 to C10 alicyclic hydrocarbon group having a fluorine atom, more preferably a C1 to C10 alkyl group having a fluorine atom, and still more preferably a C1 to C6 alkyl group having a fluorine atom.

In the formula (a4-4), $A^{f21}$ is preferably —$(CH_2)_{j1}$—, more preferably a methylene group or an ethylene group, and still more preferably a methylene group.

Examples of the structural unit represented by formula (a4-4) include the following ones and those represented by the following formulae in which a methyl group corresponding to $R^{f21}$ has been replaced by a hydrogen atom.

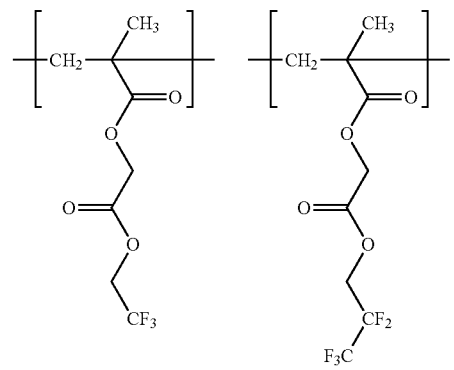

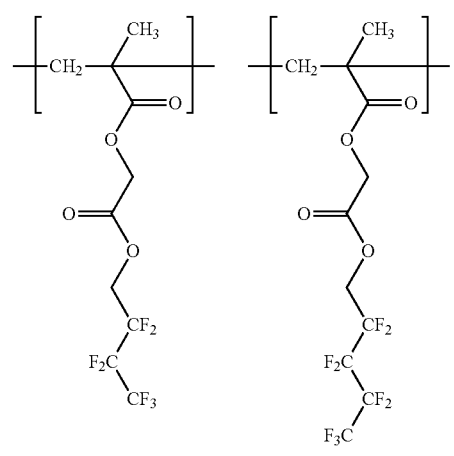

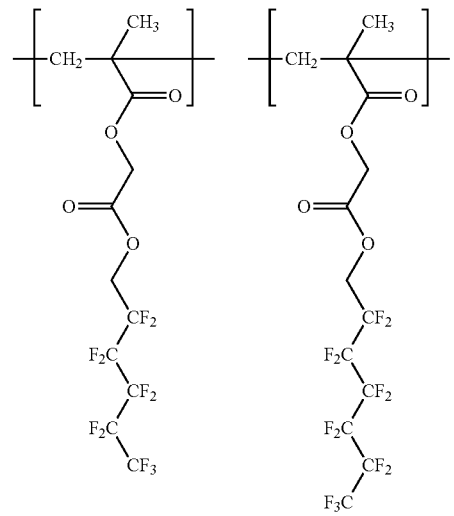

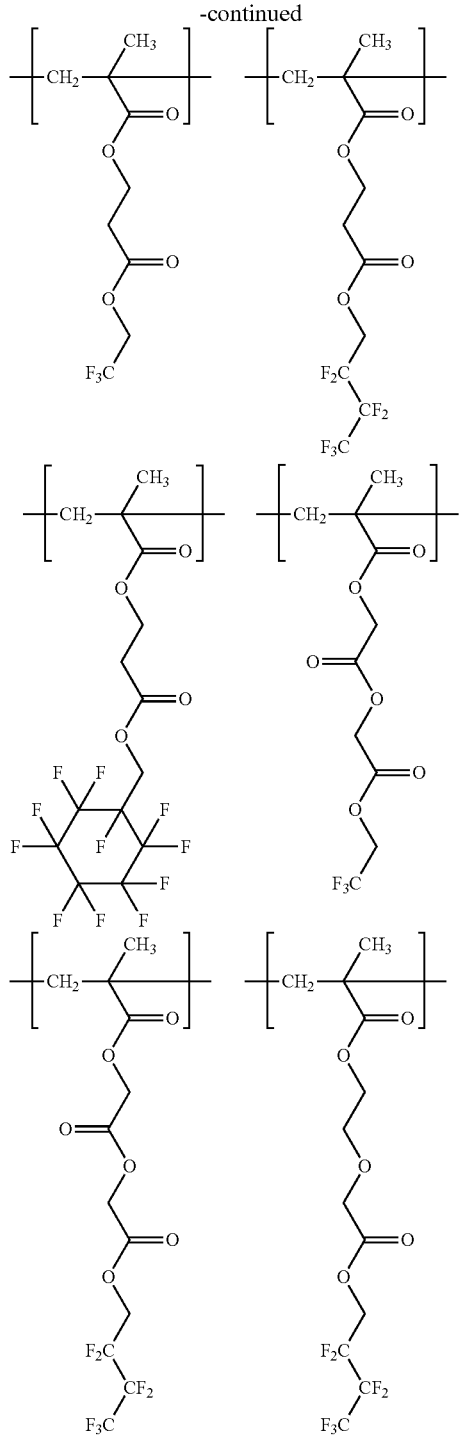

When Resin (A) has the structural unit (a4), the proportion thereof is preferably 1 to 20% by mole, more preferably 2 to 15% by mole, still more preferably 3 to 10% by mole, with respect to the total structural units (100% by mole) of Resin (A).

<Structural Unit (a5)>

Examples of the non-leaving hydrocarbon group in the structural unit (a5) include a chain, branched or cyclic hydrocarbon group. Among them, the structural unit (a5) is preferably a structural unit containing an alicyclic hydrocarbon group.

The structural unit (a5) is, for example, a structural unit represented by formula (a5-1):

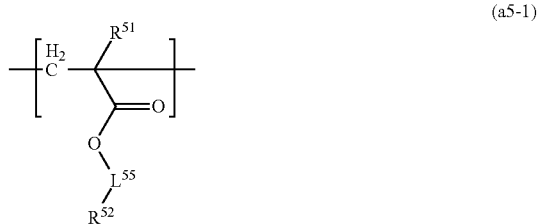

(a5-1)

wherein $R^{51}$ represents a hydrogen atom or a methyl group,
$R^{52}$ represents a C3 to C18 alicyclic hydrocarbon group where a hydrogen atom can be replaced by a C1 to C8 aliphatic hydrocarbon group or a hydroxy group, provided that a hydrogen atom contained in the carbon atom bonded to $L^{55}$ is not replaced by the C1 to C8 aliphatic hydrocarbon group, and $L^{55}$ represents a single bond or a C1 to C18 divalent saturated hydrocarbon group where a methylene group can be replaced by an oxygen atom or a carbonyl group.

Examples of the alicyclic hydrocarbon group of $R^{52}$ include a monocyclic group or polycyclic group. Examples of the monocyclic alicyclic hydrocarbon group include cyclopropyl, cyclobutyl, cyclopentyl and cyclohexyl groups. Examples of the polycyclic hydrocarbon group include adamantyl and norbornyl groups.

Examples of the C1 to C8 aliphatic hydrocarbon group include an alkyl group such as methyl, ethyl, n-propyl, isopropyl, n-butyl, sec-butyl, tert-butyl, n-pentyl, n-hexyl, n-heptyl, 2-ethylhexyl and n-octyl groups. Examples of the alicyclic hydrocarbon group having a substituent include 3-hydroxyadamantyl and 3-methyladamantyl.

$R^{52}$ is preferably an unsubstituted C3 to C18 alicyclic hydrocarbon group, and more preferably adamantyl, norbornyl and cyclohexyl groups. Examples of the divalent saturated hydrocarbon group of $L^{55}$ include a divalent aliphatic saturated hydrocarbon group and a divalent alicyclic saturated hydrocarbon group, and a divalent aliphatic saturated hydrocarbon group is preferred.

Examples of the divalent aliphatic saturated hydrocarbon group include an alkanediyl group such as methylene, ethylene, propanediyl, butanediyl and pentanediyl groups.

Examples of the divalent alicyclic saturated hydrocarbon group include a monocyclic group and a polycyclic group. Examples of the monocyclic alicyclic saturated hydrocarbon groups include cycloalkanediyl such as cyclopentanediyl and cyclohexanediyl groups. Examples of the polycyclic saturated hydrocarbon groups include adamantanediyl and norbornanediyl groups.

Examples of the saturated hydrocarbon group in which a methylene group has been replaced by an oxygen atom or a carbonyl group include groups represented by formula (L1-1) to formula (L1-4). In the formula (L1-1) to formula (L1-4), * represents a binding position to an oxygen atom.

(L1-1)

(L1-2)

-continued

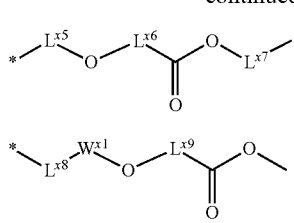
(L1-3)

(L1-4)

In the formula, $X^{X1}$ represents an oxycarbonyl group or a carbonyloxy group, $L^{X1}$ represents a C1 to C16 divalent saturated aliphatic hydrocarbon group, $L^{X2}$ represents a single bond or a $C_1$ to $C_{is}$ divalent saturated hydrocarbon group, provided that the total number of the carbon atoms contained in the group of $L^{X1}$ and $L^{X2}$ is 16 or less;

$L^{X3}$ represents a single bond or a C1 to C17 divalent saturated aliphatic hydrocarbon group, $L^{X4}$ represents a single bond or a C1 to C16 divalent saturated hydrocarbon group, provided that the total number of the carbon atoms contained in the group of $L^{X3}$ and $L^{X4}$ is 17 or less;

$L^{X5}$ represents a $C_1$ to $C_{is}$ divalent saturated aliphatic hydrocarbon group, and $L^{X7}$ independently represent a single bond or a $C_1$ to $C_{14}$ divalent saturated hydrocarbon group, provided that the total number of the carbon atoms contained in the group of $L^{X5}$, $L^{X6}$ and $L^{X7}$ is 15 or less, $L^{X8}$ and $L^{X9}$ independently represent a single bond or a C1 to C12 divalent saturated hydrocarbon group, $W^{X1}$ represents a $C_3$ to $C_{15}$ divalent saturated alicyclic hydrocarbon group, provided that the total number of the carbon atoms contained in the group of $L^{X8}$, $L^{X9}$ and $W^{X1}$ is 15 or less.

$L^{X1}$ is preferably a C1 to C8 divalent saturated aliphatic hydrocarbon group, and more preferably a methylene group or an ethylene group.

$L^{X2}$ is preferably a single bond or a C1 to C8 divalent saturated aliphatic hydrocarbon group, and more preferably a single bond.

$L^{X3}$ is preferably a C1 to C8 divalent saturated aliphatic hydrocarbon group.

$L^{X4}$ is preferably a single bond or a C1 to C8 divalent saturated aliphatic hydrocarbon group.

$L^{X5}$ is preferably a C1 to C8 divalent saturated aliphatic hydrocarbon group, and more preferably a methylene group or an ethylene group.

$L^{X6}$ is preferably a single bond or a C1 to C8 divalent saturated aliphatic hydrocarbon group, and more preferably a methylene group or an ethylene group. $L^{X7}$ is preferably a single bond or a C1 to C8 divalent saturated aliphatic hydrocarbon group. $L^{X8}$ is preferably a single bond or a C1 to C8 divalent saturated aliphatic hydrocarbon group, and more preferably a single bond or a methylene group. $L^{X9}$ is preferably a single bond or a C1 to C8 divalent saturated aliphatic hydrocarbon group, and more preferably a single bond or a methylene group. $W^{X1}$ is preferably a C3 to C10 divalent saturated alicyclic hydrocarbon group, and more preferably a cyclohexanediyl group or an adamantanediyl group.

Examples of the group represented by $L^{55}$ include the following ones.

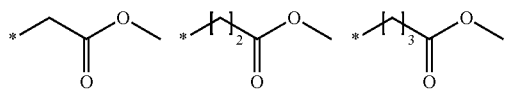

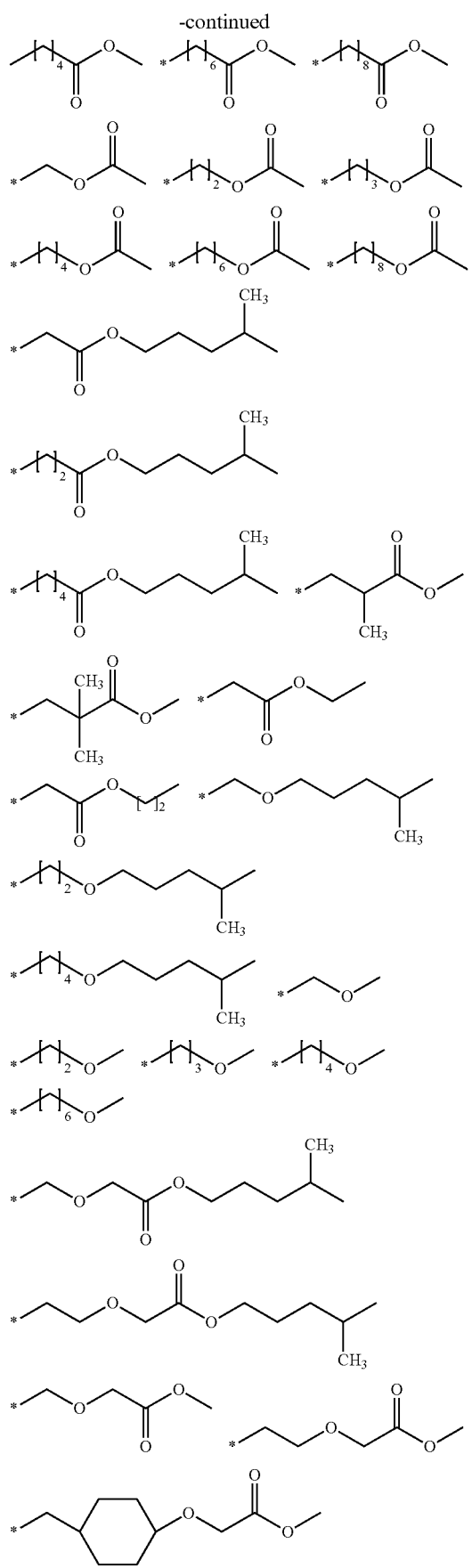

-continued
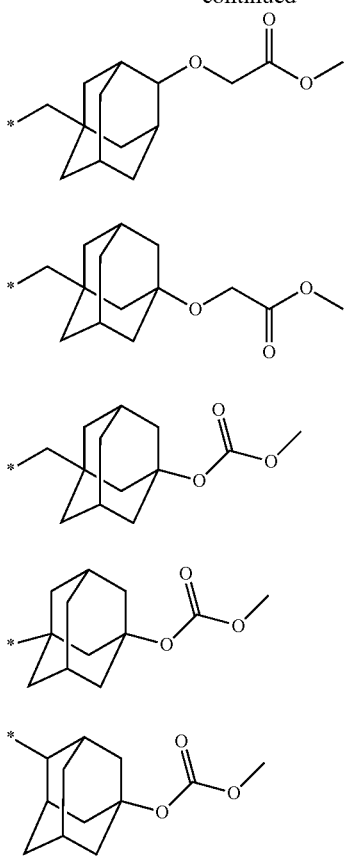
L$^{55}$ is preferably a single bond, a methylene group, an ethylene group or the groups represented by formula (L1-1), and more preferably a single bond or the groups represented by formula (L1-1).
Examples of the structural unit (a5-1) include the following ones.
(a5-1-1)
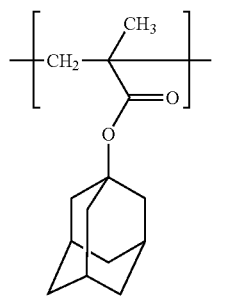
(a5-1-2)
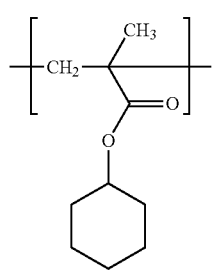
(a5-1-3)
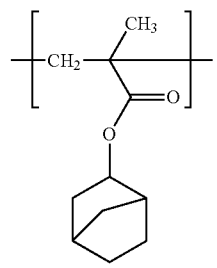
(a5-1-4)
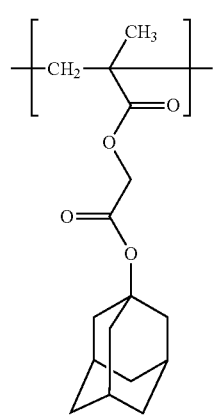
(a5-1-5)
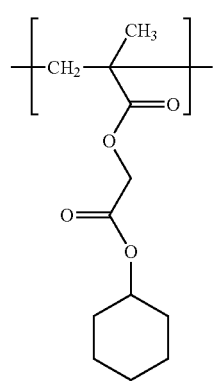
(a5-1-6)
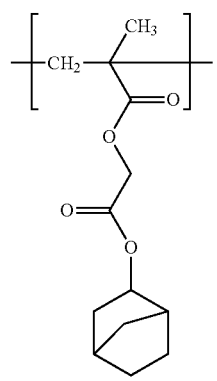

(a5-1-7) 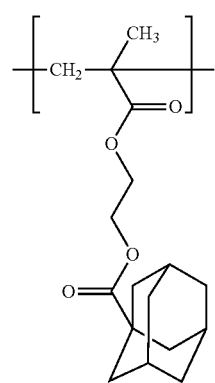
(a5-1-11) 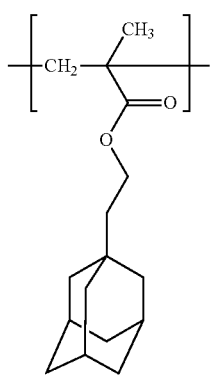
(a5-1-8) 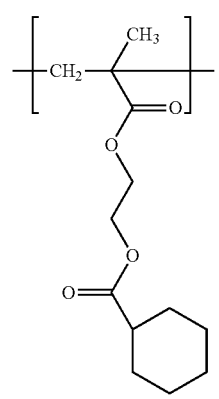
(a5-1-12) 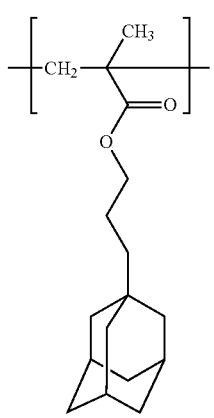
(a5-1-9) 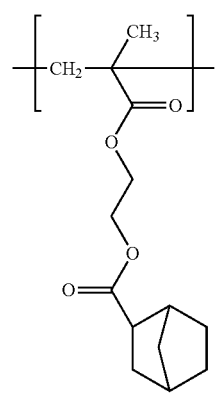
(a5-1-13) 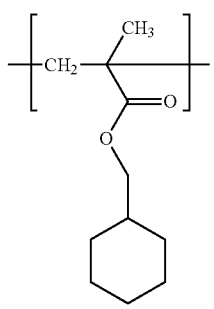
(a5-1-10) 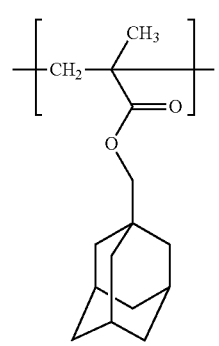
(a5-1-14) 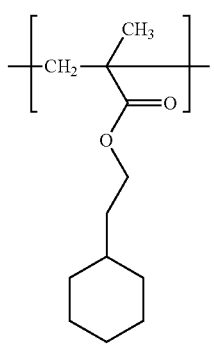

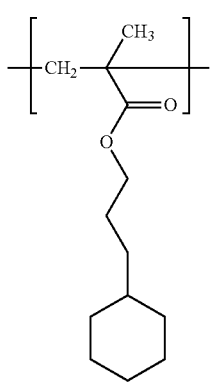

(a5-1-15)

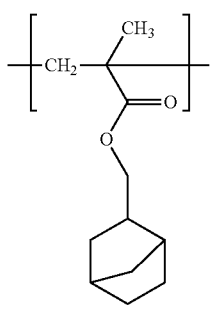

(a5-1-16)

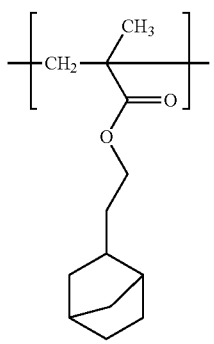

(a5-1-17)

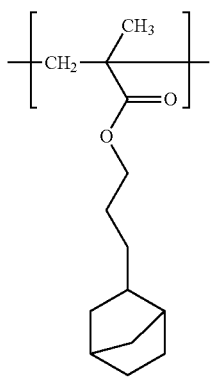

(a5-1-18)

Examples of the structural unit (a5) include the structural units of the formulae (a5-1-1) to (a5-1-18) in which a methyl group corresponding to $R^{51}$ has been replaced by a hydrogen atom.

When Resin (A) has the structural unit (a5), the proportion thereof is preferably 1 to 30% by mole, more preferably 2 to 20% by mole, and still more preferably 3 to 15% by mole, with respect to the total structural units (100% by mole) of Resin (A).

Resin (A) preferably has a resin which has the structural unit (a1) and the structural unit (s) such as the structural unit (a2), the structural unit (a3) and the structural unit (t), more preferably a resin which has the structural unit (a1) and at least one of the structural unit (a2) and the structural unit (a3).

In Resin (A), the structural unit (a1) is preferably at least one of the structural unit (a1-1) and the structural unit (a1-2) (preferably the structural unit having a cyclohexyl group or a cyclopentyl group), and more preferably is the structural unit (a1-1). Resin (A) preferably has both the structural unit (a1-1) and the structural unit (a1-2).

Resin (A) has preferably at least one of the structural unit (a2) and the structural unit (a3). The structural unit (a2) is preferably the structural unit represented by formula (a2-1). The structural unit (a3) is preferably at least one of the structural units (a3-1), (a3-2) and (a3-4).

The structural unit (t) is preferably the structural unit (a4) such as a structural unit which has a fluorine atom.

The proportion of the structural unit derived from the monomer having an adamantyl group (in particular, the structural unit (a1-1)) in the resin (A) is preferably 15% by mole or more with respect to the structural units (a1). As the mole ratio of the structural unit derived from the monomer having an adamantyl group increases within this range, the dry etching resistance of the resulting resist improves.

Resin (A) can be produced by a known polymerization method, for example, radical polymerization method, using one or more kinds of monomers as described above. The proportions of the structural units in Resin (A) can be adjusted by changing the amount of a monomer used in polymerization. The weight average molecular weight of Resin (A) is preferably 2,000 or more (more preferably 2,500 or more, and still more preferably 3,000 or more), and 50,000 or less (more preferably 30,000 or less, and still more preferably 15,000 or less).

The weight average molecular weight is a value determined by gel permeation chromatography using polystyrene as the standard product. The detailed condition of this analysis is described in Examples.

<Resin (X)>

Examples of Resin (X) include one having the structural unit (t), preferably a resin which has the structural unit (a4) and no structural unit (a1), and preferably a resin which has the structural unit (a4) having a fluorine atom.

When the Resin (X) has the structural unit (a4), the proportion thereof is preferably 40% by mole or more, more preferably 45% by mole or more, and still more preferably 50% by mole or more, with respect to the total structural units (100% by mole) of the Resin (X).

Resin (X) can further have the structural unit (a2), the structural unit (a3), the structural unit (a5) and/or the well-known structural unit in the art. Resin (X) preferably consists of the structural units (t), more preferably comprises the structural units (a4) and the structural units (a5) as the structural units (t), still more preferably comprises the structural units (a4) having a fluorine atom as the structural units (t). Resin (X) can be produced by a known polymerization method, for example, radical polymerization method, using one or more kinds of monomers as described above. The proportions of the structural units in the Resin (X) can be adjusted by changing the amount of a monomer used in polymerization.

The weight average molecular weight of Resin (X) is preferably 8,000 or more (more preferably 10,000 or more), and 80,000 or less (more preferably 60,000 or less).

When the photoresist composition further contains Resin (X), the proportion thereof is preferably 1 to 60 parts by mass, more preferably 1 to 50 parts by mass, and still more preferably 1 to 40 parts by mass, further more preferably 2 to 30 parts by mass, still further more preferably 2 to 8 parts by mass, with respect to 100 parts by mass of Resin (A).

The photoresist composition preferably further contains Resin (X) which has a structural unit having a fluorine atom and no acid-labile group. The total proportion of Resin (A) and the Resin (X) is preferably 80% by mass to 99% by mass, more preferably 90% by mass to 99% by mass, with respect to the total amount of solid components of the photoresist composition. The proportion of the solid components in the photoresist composition and that of the resins in the solid components can be measured with a known analytical method such as liquid chromatography and gas chromatography.

<Acid Generator>

The photoresist composition of the present disclosure contains one or more of acid generators (I) as an acid generator. The photoresist composition can contain another acid generator than an acid generator (I) (Such another acid generator is sometimes referred to as "acid generator (B)"). Preferably, all of the acid generators contained in the photoresist composition are an acid generator (I). If the photoresist composition contains both of the acid generator (I) and the acid generator (B), the weight ratio of them, i.e., [the weight of the acid generator (I)]: [the weight of the acid generator (B)], is usually 1:99 to 99:1, preferably 2:98 to 98:2, more preferably 5:95 to 95:5.

The acid generator (I) generates an acid which shows Hansen solubility parameters as described above. The acid generator (I) can be an ionic acid generator or a non-ionic acid generator.

Examples of the nonionic compounds for the acid generator include organic halogenated compounds; sulfonate esters, e.g. 2-nitrobenzylester, aromatic sulfonates, oximesulfonate, N-sulfonyloxyimide, sulfonyloxyketone, and diazonaphtoquione 4-sulfonate; sulfones, e.g., disulfone, ketosulfone, and sulfonium diazomethane. The ionic compounds for the acid generator include onium salts having an onium cation, e.g., diazonium salts, phosphonium salts, sulfonium salts and iodonium salts. Examples of the anions of onium salts include a sulfonic acid anion, a sulfonylimide anion, and sulfonylmethide anion.

An acid generated from the acid generator (I), i.e., the acid (I) or the acid (II), preferably has a cyclic structure comprising a —O—SO—O— moiety. Specifically the acid is preferably one which has a structure represented by formula (aa):

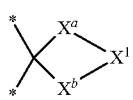

(aa)

wherein $X^a$ and $X^b$ each independently represent an oxygen atom or a sulfur atom, $X^1$ represents a divalent group which has a cyclic structure comprising a —O—SO—O— moiety, and * represents a binding site.

$X^a$ and $X^b$ are preferably the same atom, preferably an oxygen atom.

$X^1$ can have one or more of cyclic structures containing a —O—SO—O— moiety.

$X^1$ can be a monocyclic or condensed ring, a divalent heterocyclic ring composed of a spiro ring and another ring, a combination of the heterocyclic ring with an alkanediyl group, or a combination of two or more of the heterocyclic rings with one or more of alkanediyl groups.

Preferred examples of the group represented by formula (aa) include the following ones.

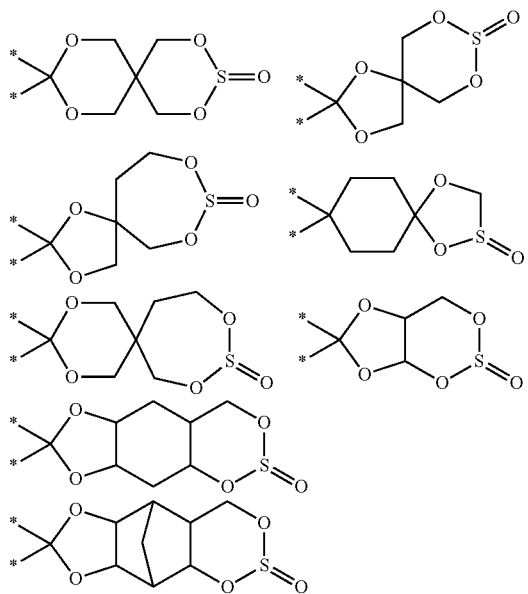

The acid generator (I) preferably has a structure represented by formula (aa1):

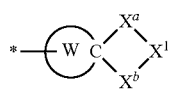

(aa1)

wherein $X^a$, $X^b$ and $X^1$ are as defined above, and ring W represents a C3 to C36 alicyclic hydrocarbon group where a methylene group can be replaced by an oxygen atom, a sulfur atom, a carbonyl group or a sulfonyl group, and * represents a binding site.

The alicyclic hydrocarbon group of the ring W can have a substituent such as one selected from the following group A.

Group A: a hydroxy group, a C1 to C12 alkyl group, a C1 to C12 alkoxy group, a C2 to C12 alicyclic hydrocarbon group, a C6 to C10 aromatic hydrocarbon group, and combination of any one of them with another.

The alicyclic hydrocarbon group of the ring W is preferably a C3 to C18 alicyclic hydrocarbon group, more preferably rings represented by the formulae (Ia1-1) to (Ia1-12), and still more preferably rings represented by the formula (Ia1-1), the formula (Ia1-2) and the formula (Ia1-3).

(Ia1-1)

-continued (Ia1-2)
(Ia1-3)
(Ia1-4)
(Ia1-5)
(Ia1-6)
(Ia1-7)
(Ia1-8)
(Ia1-9)
(Ia1-10)
(Ia1-11)
(Ia1-12)

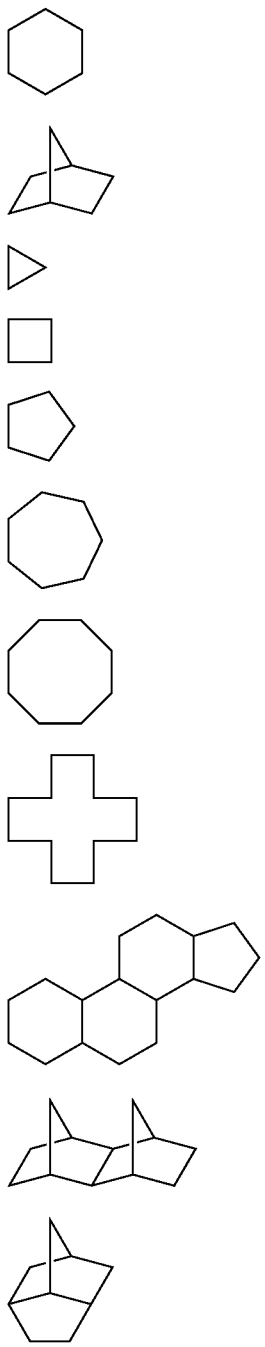

In each of the formulae (Ia1-1) to (Ia1-12), a methylene group can be replaced by an oxygen atom, a carbonyl group, a sulfur atom or a sulfonyl group, and a hydrogen atom can be replaced by the group A.

In the alicyclic hydrocarbon group, the position of a binding site is not limited to any specific positions.

As to the group A, examples of the alkyl group include a methyl group, an ethyl group, a propyl group, a butyl group, a pentyl group, a hexyl group, a heptyl group, an octyl group, a nonyl group, a decyl group, an undecyl group and a dodecyl group.

As to the group A, examples of the alicyclic hydrocarbon group include groups described below.

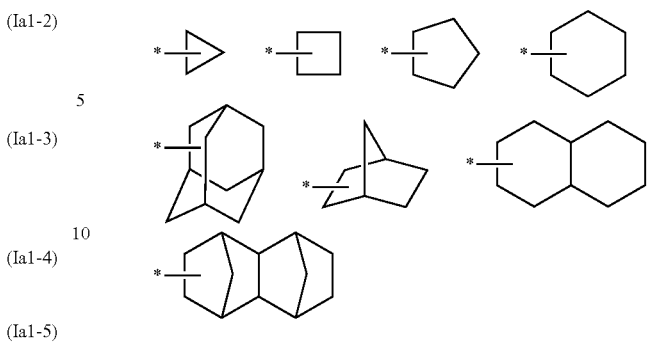

* represent a binding site to the ring.

Examples of the aromatic hydrocarbon include phenyl and naphtyl groups.

The acid generator (I) is preferably one which has an organic cation, more preferably one which has an organic cation and an anion having a group represented by formula (aa), still more preferably one which has an organic cation and an anion having a group represented by formula (aa1).

The acid generator (I) preferably has an anion represented by formula (aa2):

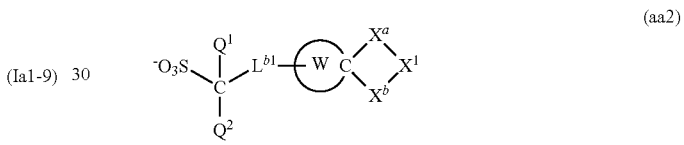

(aa2)

wherein $X^a$, $X^b$, $X^1$ and W are as defined above, $Q^1$ and $Q^2$ independently each represent a fluorine atom or a C1 to C6 perfluoroalkyl group, and $L^{b1}$ represents a C1-C24 divalent saturated hydrocarbon group in which a methylene group can be replaced by —O— or —CO— and in which a hydrogen atom can be replaced by a hydroxyl group or a fluorine atom.

As to $Q^1$ and $Q^2$, examples of the perfluoroalkyl group include a trifluoromethyl group, a perfluoroethyl group, a perfluoropropyl group, a perfluoroisopropyl group, a perfluorobutyl group, a perfluoro-sec-butyl group, a perfluoro-tert-butyl group, a perfluoropentyl group and a perfluorohexyl group.

$Q^1$ and $Q^2$ independently each represent preferably a fluorine atom or a trifluoromethyl group, more preferably fluorine atoms.

As to $L^{b1}$, examples of the divalent saturated hydrocarbon group include an alkanediyl group, a divalent monocyclic or polycyclic saturated hydrocarbon group, and a combination of any one of them with another.

Specific examples of the divalent saturated hydrocarbon group include a linear alkanediyl group such as a methylene group, an ethylene group, a propane-1,3-diyl group, a propane-1,2-diyl group, a butane-1,4-diyl group, a butane-1,3-diyl group, a pentane-1,5-diyl group, a hexane-1,6-diyl group, a heptane-1,7-diyl group, an octane-1,8-diyl group, a nonane-1,9-diyl group, a decane-1,10-diyl group, a undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, a heptadecane-1,17-diyl group;

a C2-C17 branched alkanediyl group such as an ethane-1,1-diyl group, a propane-1,1-diyl group and a propane-2,2- diyl group, a butane-1,3-diyl group, a 2-methylpropane-1,3-diyl group, a 2-methylpropane-1,2-diyl group, a pentane-1,4-diyl group and a 2-methylbutane-1,4-diyl group;
a divalent monocyclic saturated hydrocarbon group such as a cyclobutane-1,3-diyl group, a cyclopentane-1,3-diyl group, a cyclohexane-1,2-diyl group, a 1-methylcyclohexane-1,2-diyl group, a cyclohexane-1,4-diyl group, a cyclooctane-1,2-diyl group and a cyclooctane-1,5-diyl group; and a divalent polycyclic saturated hydrocarbon group such as a norbornane-2,3-diyl group, a norbornane-1,4-diyl group, a norbornane-2,5-diyl group, an adamantane-1,2-diyl group, an adamantane-1,5-diyl group and an adamantane-2,6-diyl group; and a group formed by combining two or more groups selected from the group consisting of the above-mentioned groups.

Examples of the saturated hydrocarbon group of $L^{b1}$ in which a methylene group has been replaced by an oxygen atom or a carbonyl group include the following groups represented by formula (b1-1) to formula (b1-3):

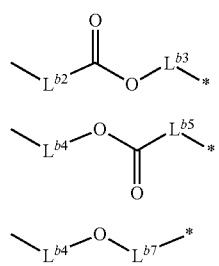

wherein $L^{b2}$ represents a single bond or a C1 to C22 divalent saturated hydrocarbon group where a hydrogen atom can be replaced by a fluorine atom;
$L^{b3}$ represents a single bond or a C1 to C22 divalent saturated hydrocarbon group where a hydrogen atom can be replaced by a fluorine atom or a hydroxy group, and a methylene group can be replaced by an oxygen atom or a carbonyl group; provided that the total number of the carbon atoms contained in the group of $L^{b2}$ and $L^{b3}$ is 22 or less;
$L^{b4}$ represents a single bond or a C1 to C22 divalent saturated hydrocarbon group where a hydrogen atom can be replaced by a fluorine atom;
$L^{b5}$ represents a single bond or a C1 to C22 divalent saturated hydrocarbon group where a hydrogen atom can be replaced by a fluorine atom or a hydroxy group, and a methylene group can be replaced by an oxygen atom or a carbonyl group; provided that the total number of the carbon atoms contained in the group of $L^{b4}$ and $L^{b5}$ is 22 or less;
$L^{b6}$ represents a single bond or a C1 to C23 divalent saturated hydrocarbon group where a hydrogen atom can be replaced by a fluorine atom or a hydroxy group; $L^{b7}$ represents a single bond or a C1 to C23 divalent saturated hydrocarbon group where a hydrogen atom can be replaced by a fluorine atom or a hydroxy group, and a methylene group can be replaced by an oxygen atom or a carbonyl group; provided that the total number of the carbon atoms contained in the group of $L^{b6}$ and $L^{b7}$ is 23 or less, and * represents a binding position to W.

In formula (b1-1) to formula (b1-3), when a methylene group has been replaced by an oxygen atom or a carbonyl group, the carbon number of the saturated hydrocarbon group corresponds to the number of the carbon atom before replacement.

Examples of the divalent saturated hydrocarbon group are the same examples as the divalent saturated hydrocarbon group of $L^{b1}$.
$L^{b2}$ is preferably a single bond.
$L^{b3}$ is preferably a C1 to C4 divalent saturated hydrocarbon group.
$L^{b4}$ is preferably a C1 to C8 divalent saturated hydrocarbon group where a hydrogen atom can be replaced by a fluorine atom.
$L^{b5}$ is preferably a single bond or a C1 to C8 divalent saturated hydrocarbon group.
$L^{b6}$ is preferably a single bond or a C1 to C4 divalent saturated hydrocarbon group where a hydrogen atom can be replaced by a fluorine atom.
$L^{b7}$ is preferably a single bond or a C1 to C18 divalent saturated hydrocarbon group where a hydrogen atom can be replaced by a fluorine atom or a hydroxy group, and where a methylene group can be replaced by an oxygen atom or a carbonyl group.

Among these, the group represented by the formula (b1-1) or the formula (b1-3) is preferred.

Examples of the divalent group represented by the formula (b1-1) include the following groups represented by formula (b1-4) to formula (b1-8):

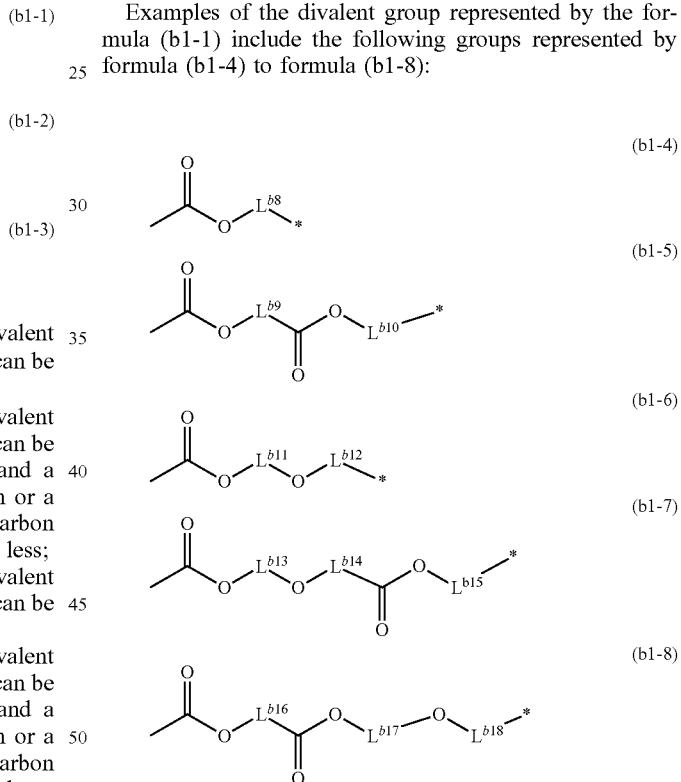

wherein $L^{b8}$ represents a single bond or a C1 to C22 divalent saturated hydrocarbon group where a hydrogen atom can be replaced by a fluorine atom or a hydroxy group;
$L^{b9}$ represents a C1 to C20 divalent saturated hydrocarbon group;
$L^{b10}$ represents a single bond or a C1 to C19 divalent saturated hydrocarbon group where a hydrogen atom can be replaced by a fluorine atom or a hydroxy group; provided that the total number of the carbon atoms contained in the group of $L^{b9}$ and $L^{b10}$ is 20 or less;
$L^{b11}$ represents a C1 to C21 divalent saturated hydrocarbon group;
$L^{b12}$ represents a single bond or a C1 to C20 divalent saturated hydrocarbon group where a hydrogen atom can be replaced by a fluorine atom or a hydroxy group; provided that the total number of the carbon atoms contained in the group of $L^{b11}$ and $L^{b12}$ is 21 or less;
$L^{b13}$ represents a C1 to C19 divalent saturated hydrocarbon group;
$L^{b14}$ represents a single bond or a C1 to C18 divalent saturated hydrocarbon group; $L^{b15}$ represents a single bond or a C1 to C18 divalent saturated hydrocarbon group where a hydrogen atom can be replaced by a fluorine atom or a hydroxy group; provided that the total number of the carbon atoms contained in the group of $L^{b13}$, $L^{b14}$ and $L^{b15}$ is 19 or less;
$L^{b16}$ represents a C1 to C18 divalent saturated hydrocarbon group; $L^{b17}$ represents a C1 to C18 divalent saturated hydrocarbon group; $L^{b18}$ represents a single bond or a C1 to C17 divalent saturated hydrocarbon group where a hydrogen atom can be replaced by a fluorine atom or a hydroxy group; provided that the total number of the carbon atoms contained in the group of $L^{b16}$, $L^{b17}$ and $L^{b18}$ is 19 or less, and
* represents a binding position to W.

$L^{b8}$ is preferably a C1 to C4 divalent saturated hydrocarbon group.
$L^{b9}$ is preferably a C1 to C8 divalent saturated hydrocarbon group.
$L^{b10}$ is preferably a single bond or a C1 to C19 divalent saturated hydrocarbon group, and more preferably a single bond or a C1 to C8 divalent saturated hydrocarbon group.
$L^{b11}$ is preferably a C1 to C8 divalent saturated hydrocarbon group.
$L^{b12}$ is preferably a single bond or a C1 to C8 divalent saturated hydrocarbon group.
   $L^{b13}$ is preferably a C1 to C12 divalent saturated hydrocarbon group.
$L^{b14}$ is preferably a single bond or a C1 to C6 divalent saturated hydrocarbon group.
   $L^{b15}$ is preferably a single bond or a C1 to C18 divalent saturated hydrocarbon group, and more preferably a single bond or a C1 to C8 divalent saturated hydrocarbon group.
$L^{b16}$ is preferably a C1 to C12 divalent saturated hydrocarbon group.
$L^{b17}$ is preferably a C1 to C6 divalent saturated hydrocarbon group.
$L^{b18}$ is preferably a single bond or a C1 to C17 divalent saturated hydrocarbon group, and more preferably a single bond or a C1 to C4 divalent saturated hydrocarbon group.

Examples of the divalent group represented by the formula (b1-3) include the following groups represented by formula (b1-9) to formula (b1-11):

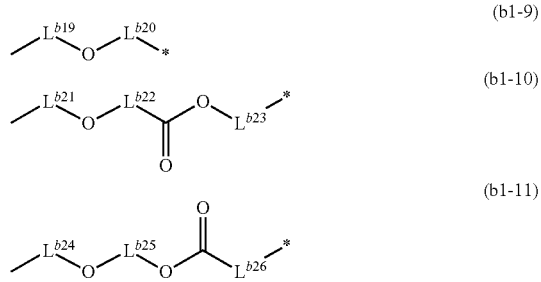

(b1-9)

(b1-10)

(b1-11)

wherein $L^{b19}$ represents a single bond or a C1 to C23 divalent saturated hydrocarbon group where a hydrogen atom can be replaced by a fluorine atom;

$L^{b20}$ represent a single bond or a C1 to C23 divalent saturated hydrocarbon group where a hydrogen atom can be replaced by a fluorine atom, a hydroxy group or an acyloxy group, and a methylene group contained in an acyloxy group can be replaced by an oxygen atom or a carbonyl group, and a hydrogen atom contained in an acyloxy group can be replaced by a hydroxy group, provided that the total number of the carbon atoms contained in the group of $L^{b19}$ and $L^{b20}$ is 23 or less;
$L^{b21}$ represents a single bond or a C1 to C21 divalent saturated hydrocarbon group where a hydrogen atom can be replaced by a fluorine atom;
$L^{b22}$ represents a single bond or a C1 to C21 divalent saturated hydrocarbon group;
$L^{b23}$ represents a single bond or a C1 to C21 divalent saturated hydrocarbon group where a hydrogen atom can be replaced by a fluorine atom, a hydroxy group or an acyloxy group, and a methylene group contained in an acyloxy group can be replaced by an oxygen atom or a carbonyl group, and a hydrogen atom contained in an acyloxy group can be replaced by a hydroxy group, provided that the total number of the carbon atoms contained in the group of $L^{b21}$, $L^{b22}$ and $L^{b23}$ is 21 or less;
$L^{b24}$ represents a single bond or a C1 to C20 divalent saturated hydrocarbon group where a hydrogen atom can be replaced by a fluorine atom;
$L^{b25}$ represents a single bond or a C1 to C21 divalent saturated hydrocarbon group;
$L^{b26}$ represents a single bond or a C1 to C20 divalent saturated hydrocarbon group where a hydrogen atom can be replaced by a fluorine atom, a hydroxy group or an acyloxy group, and a methylene group contained in an acyloxy group can be replaced by an oxygen atom or a carbonyl group, and a hydrogen atom contained in an acyloxy group can be replaced by a hydroxy group, provided that the total number of the carbon atoms contained in the group of $L^{b24}$, $L^{b25}$ and $L^{b26}$ is 21 or less; and * represents a binding position to W.

In formula (b1-9) to formula (b1-11), when a hydrogen atom has been replaced by an acyloxy group, the carbon number of the saturated hydrocarbon group corresponds to the number of the carbon atom, CO and O in addition to the carbon number of the saturated hydrocarbon group.

For formula (b1-9) to formula (b1-11), examples of the divalent saturated hydrocarbon group include an alkanediyl and a monocyclic or polycyclic divalent saturated hydrocarbon group, and a combination of two or more such groups.

Examples of the acyloxy group include acetyloxy, propionyloxy, butyryloxy, cyclohexylcarbonyloxy and adamantylcarbonyloxy groups.

Examples of the acyloxy group having a substituent include oxoadamantylcarbonyloxy, hydroxyadamantylcarbonyloxy, oxocyclohexylcarbonyloxy and hydroxycyclohexylcarbonyloxy groups.

Examples of the group represented by the formula (b1-4) include the following ones.

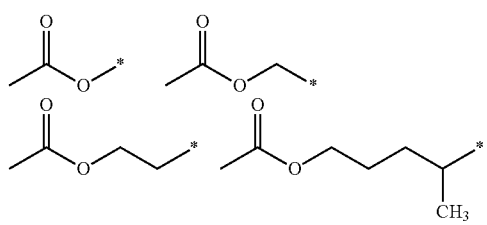

Examples of the group represented by the formula (b1-5) include the following ones.

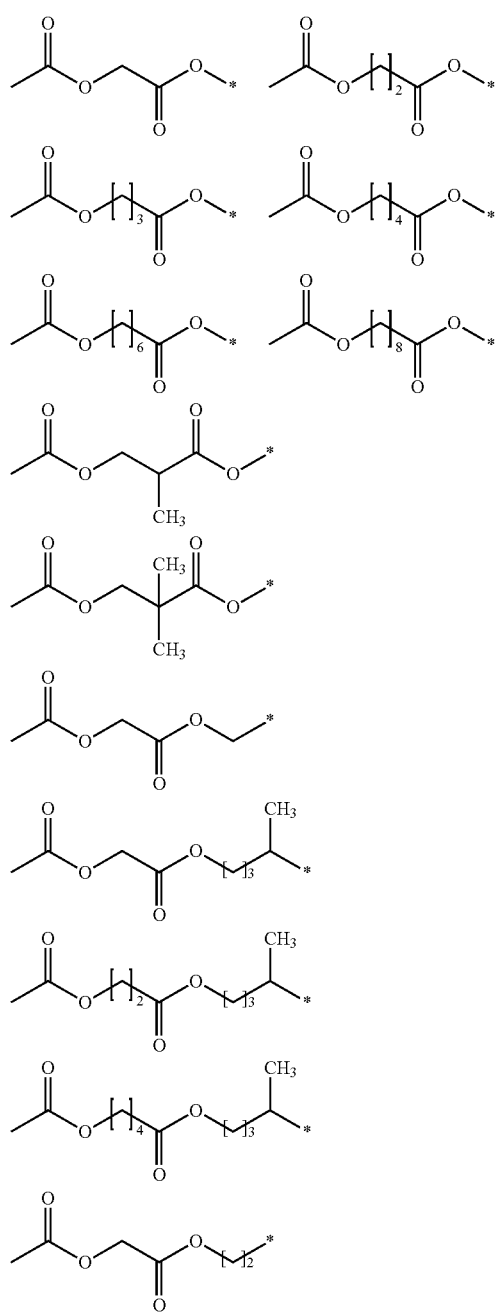
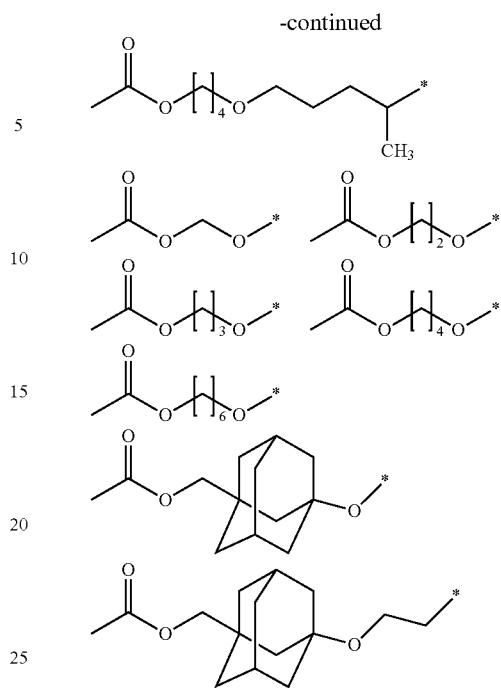
Examples of the group represented by the formula (b1-6) include the following ones.
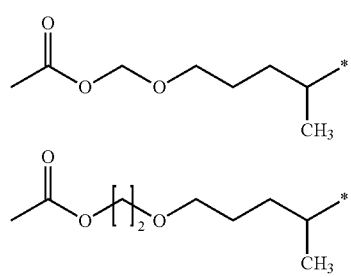
Examples of the group represented by the formula (b1-7) include the following ones.
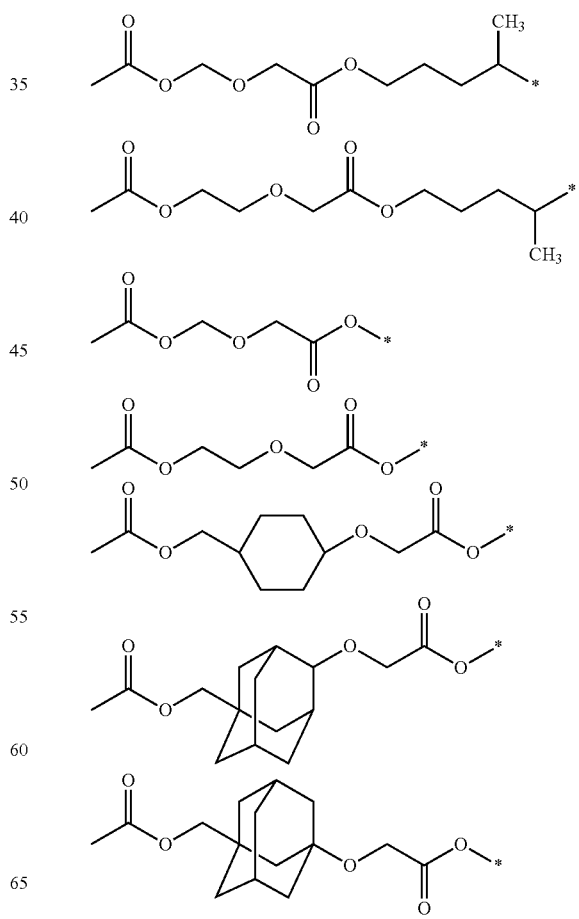

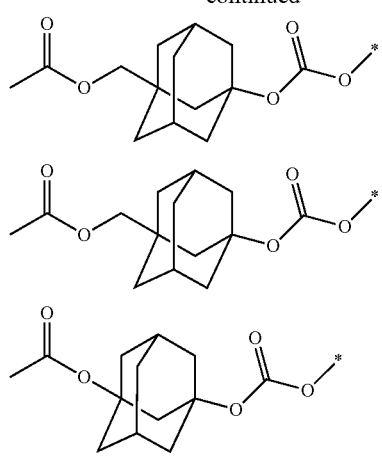
Examples of the group represented by the formula (b1-8) include the following ones.
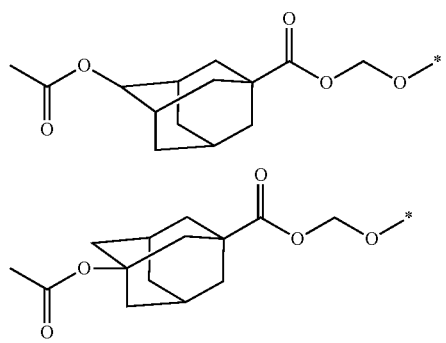
Examples of the group represented by the formula (b1-2) include the following ones.
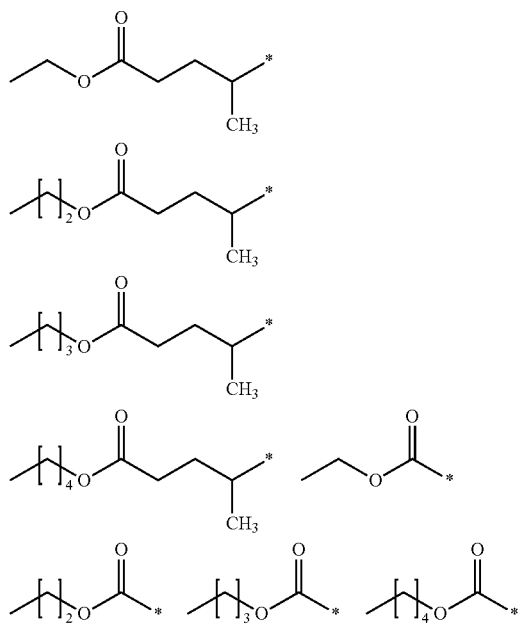
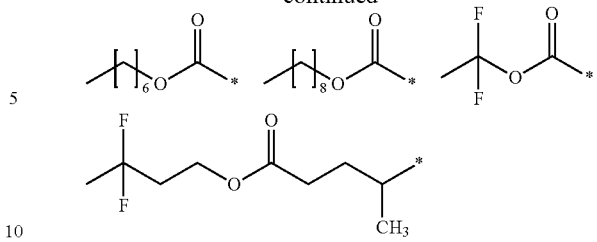
Examples of the group represented by the formula (b1-9) include the following ones.
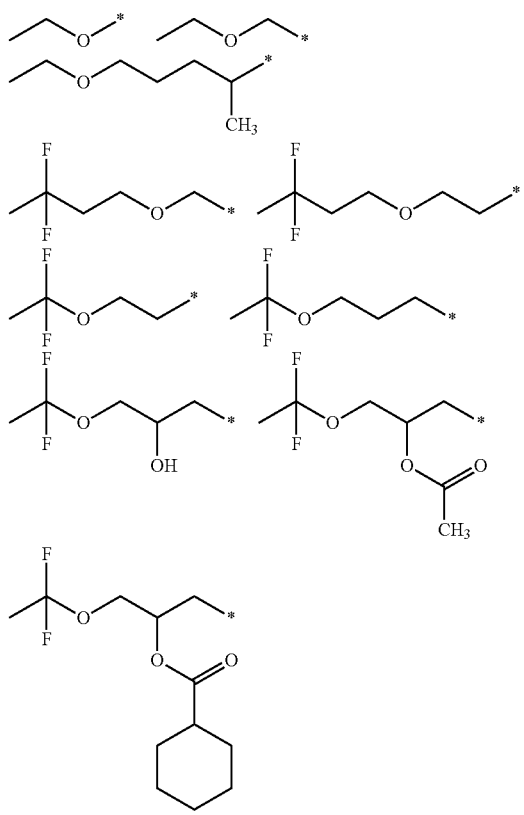
Examples of the group represented by the formula (b1-10) include the following ones.
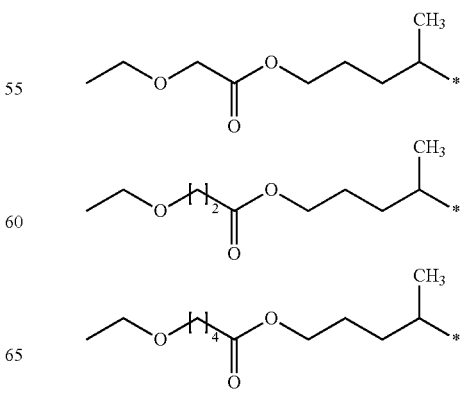

Examples of the group represented by the formula (b1-11) include the following ones.

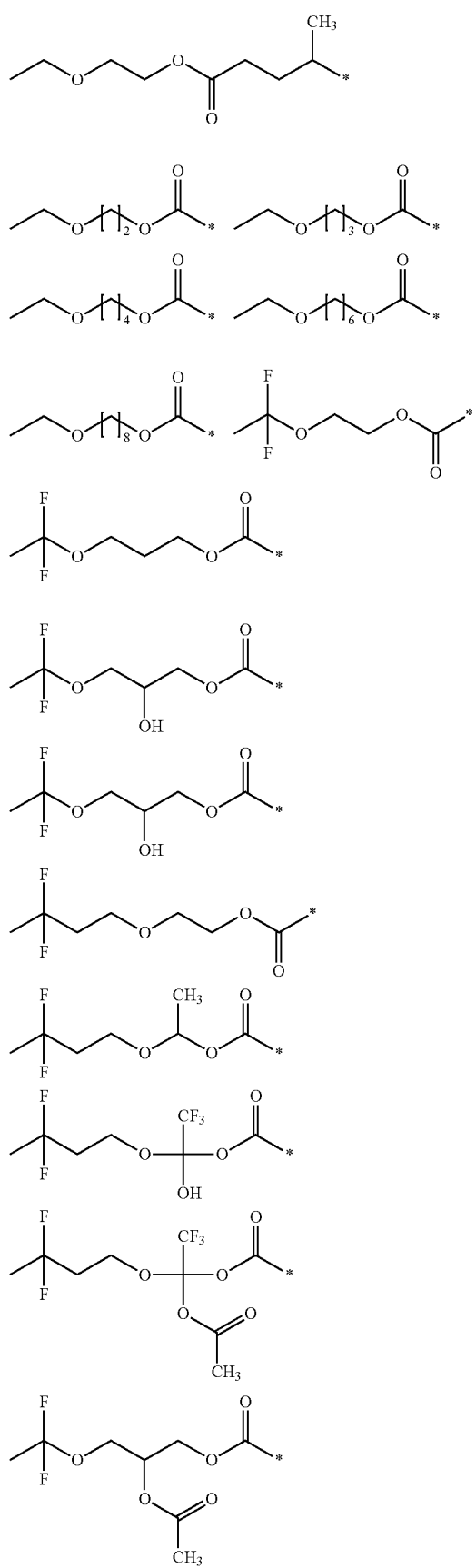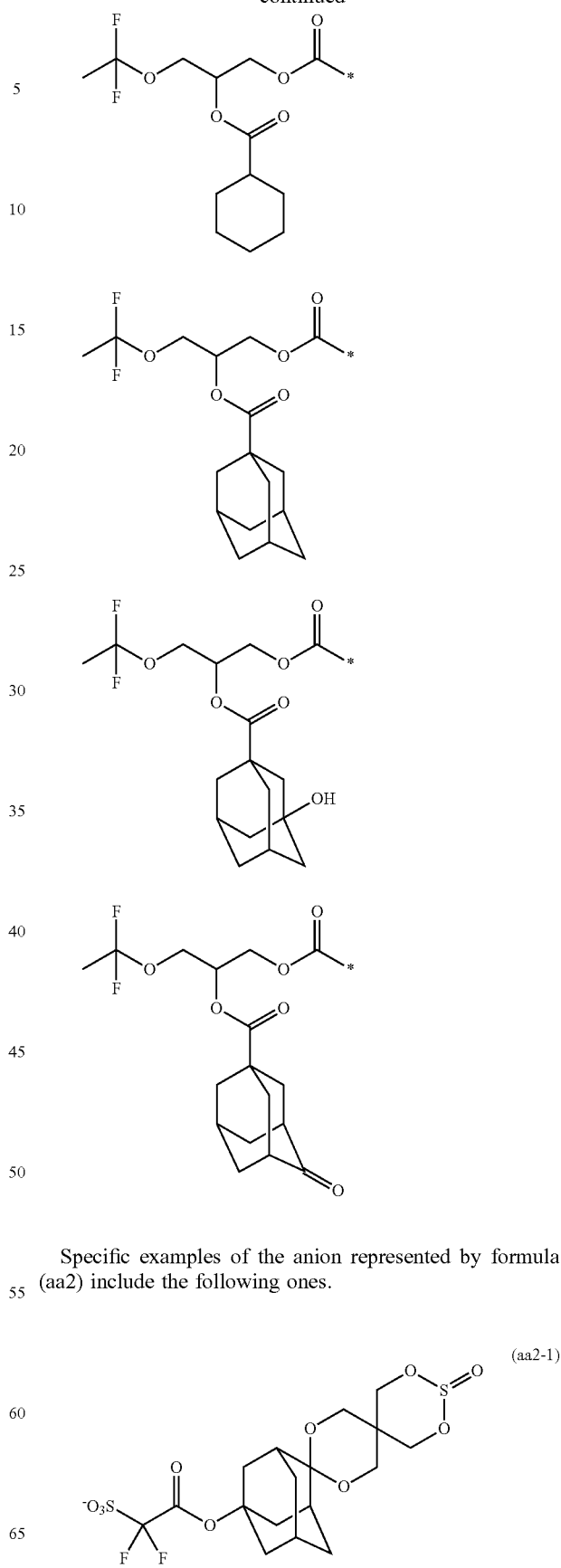
Specific examples of the anion represented by formula (aa2) include the following ones.

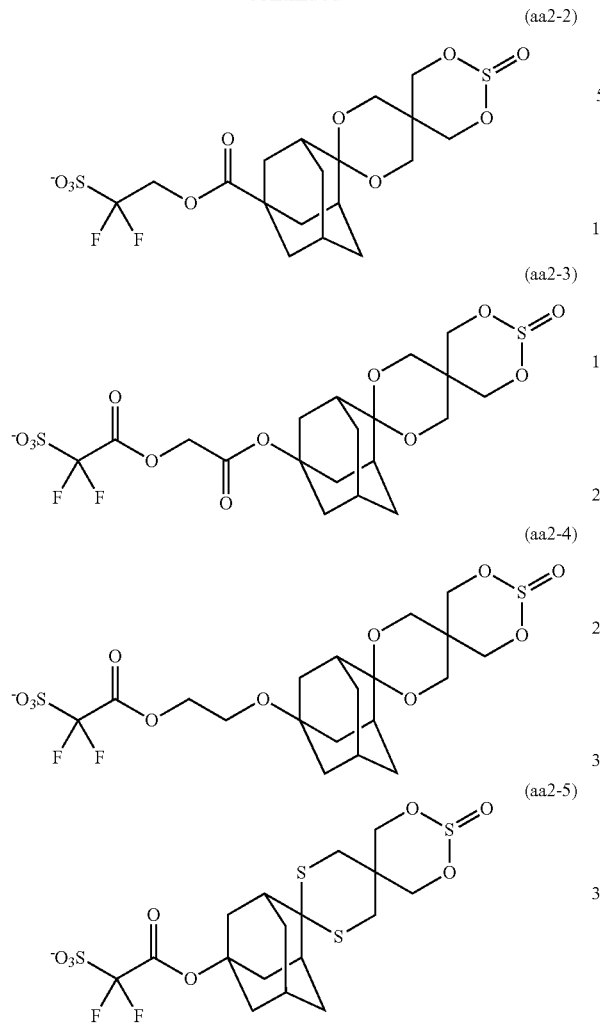

(aa2-2)

(aa2-3)

(aa2-4)

(aa2-5)

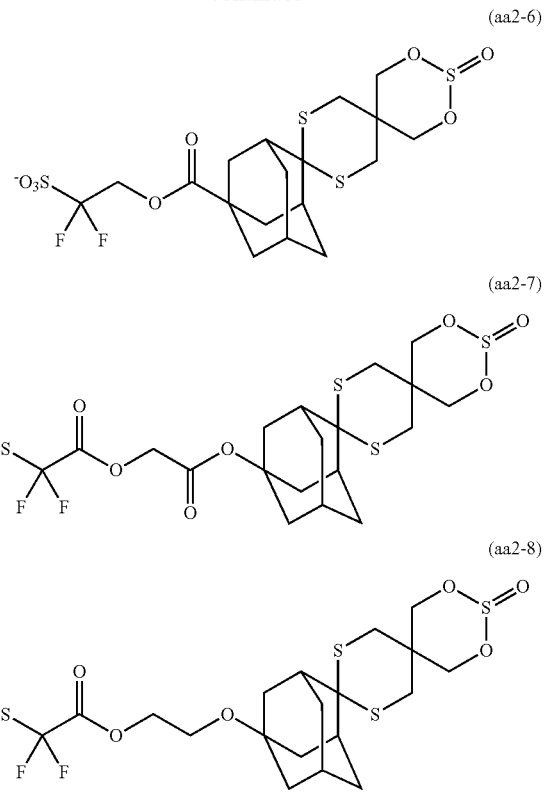

(aa2-6)

(aa2-7)

(aa2-8)

Examples of the organic cation of the acid generator (I) include an organic onium cation such as an organic sulfonium cation, an organic iodonium cation, an organic ammonium cation, a benzothiazolium cation and an organic phosphonium cation, and an organic sulfonium cation and an organic iodonium cation are preferred, and an arylsulfonium cation is more preferred. The organic cation is preferably represented by any of the formula (b2-1) to the formula (b2-4):

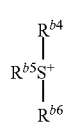

(b2-1)

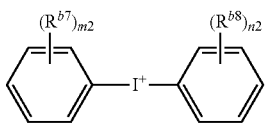

(b2-2)

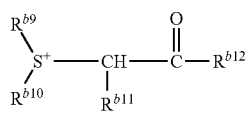

(b2-3)

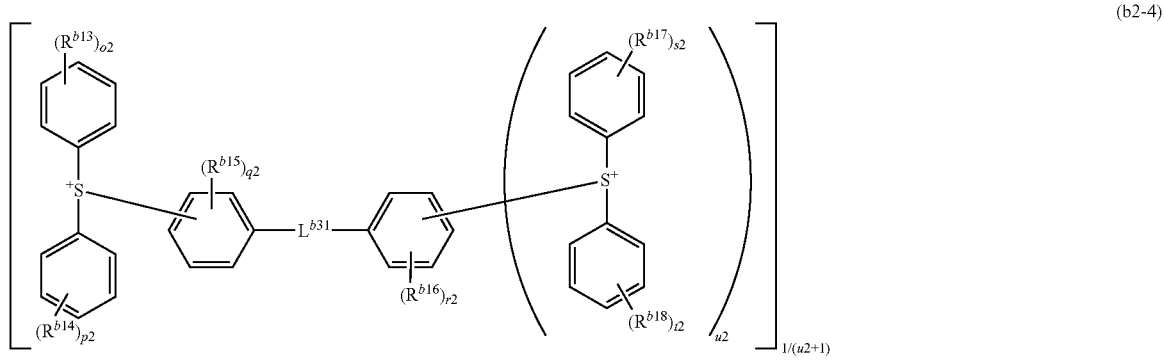

(b2-4)

wherein $R^{b4}$, $R^{b5}$ and $R^{b6}$ independently represent a C1 to C30 aliphatic hydrocarbon group, a C3 to C36 alicyclic hydrocarbon group or a C6 to C36 aromatic hydrocarbon group, a hydrogen atom contained in an aliphatic hydrocarbon group can be replaced by a hydroxy group, a C1 to C12 alkoxy group, a C3 to C12 alicyclic hydrocarbon group or a C6 to C18 aromatic hydrocarbon group, a hydrogen atom contained in an alicyclic hydrocarbon group can be replaced by a halogen atom, a C1 to C18 aliphatic hydrocarbon group, a C2 to C4 acyl group or a glycidyloxy group, a hydrogen atom contained in an aromatic hydrocarbon group can be replaced by a halogen atom, a hydroxy group or a C1 to C12 alkoxy group, or $R^{b4}$ and $R^{b5}$ can be bonded together with a sulfur atom bonded thereto to form a sulfur-containing ring, a methylene group contained in the ring can be replaced by an oxygen atom, a —SO— or a carbonyl group;

$R^{b7}$ and $R^{b8}$ in each occurrence independently represent a hydroxy group, a C1 to C12 aliphatic hydrocarbon group or a C1 to C12 alkoxy group, m2 and n2 independently represent an integer of 0 to 5;

$R^{b9}$ and $R^{b10}$ each independently represent a C1 to C36 aliphatic hydrocarbon group or a C3 to C36 alicyclic hydrocarbon group, or $R^{b9}$ and $R^{b10}$ can be bonded together with a sulfur atom bonded thereto to form a sulfur-containing ring, and a methylene group contained in the ring can be replaced by an oxygen atom, a —SO— or a carbonyl group;

$R^{b11}$ represents a hydrogen atom, a C1 to C36 aliphatic hydrocarbon group, a C3 to C36 alicyclic hydrocarbon group or a C6 to C18 aromatic hydrocarbon group;

$R^{b12}$ represents a C1 to C12 aliphatic hydrocarbon group, a C3 to C18 alicyclic hydrocarbon group and a C6 to C18 aromatic hydrocarbon group, a hydrogen atom contained in an aliphatic hydrocarbon group can be replaced by a C6 to C18 aromatic hydrocarbon group, and a hydrogen atom contained in an aromatic hydrocarbon group can be replaced by a C1 to C12 alkoxy group or a C1 to C12 alkyl carbonyloxy group;

$R^{b11}$ and $R^{b12}$ can be bonded together with —CH—CO— bonded thereto to form a ring, and a methylene group contained in the ring can be replaced by an oxygen atom, a —SO— or a carbonyl group;

$R^{b13}$, $R^{b14}$, $R^{b15}$, $R^{b16}$, $R^{b17}$ and $R^{b18}$ in each occurrence independently represent a hydroxy group, a C1 to C12 aliphatic hydrocarbon group or a C1 to C12 alkoxy group;

$L^{b13}$ represents —S— or —O—;

o2, p2, s2 and t2 independently represent an integer of 0 to 5;

q2 or r2 independently represent an integer of 0 to 4; and u2 represents an integer of 0 or 1.

Examples of the aliphatic group preferably include methyl, ethyl, n-propyl, isopropyl, n-butyl, sec-butyl, tert-butyl, n-pentyl, n-hexyl, n-octyl and 2-ethylhexyl groups. Among these, the aliphatic hydrocarbon group of $R^{b9}$ to $R^{b12}$ is preferably a C1 to C12 aliphatic hydrocarbon group.

Examples of the alicyclic hydrocarbon group preferably include monocyclic groups such as a cycloalkyl group, i.e., cyclopropyl, cyclobutyl, cyclopentyl, cyclohexyl, cycloheptyl, cyclooctyl, cyclodecyl groups; and polycyclic groups such as decahydronaphtyl, adamantyl and norbornyl groups as well as the following groups. * represents a binding position.

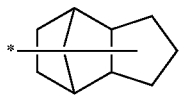 

-continued

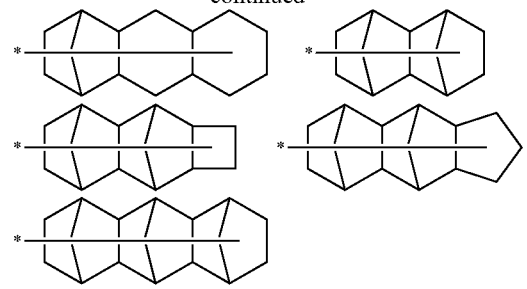

Among these, the alicyclic hydrocarbon group of $R^{b9}$ to $R^{b12}$ is preferably a C3 to C18 alicyclic hydrocarbon group, and more preferably a C4 to C12 alicyclic hydrocarbon group.

Examples of the alicyclic hydrocarbon group where a hydrogen atom can be replaced by an aliphatic hydrocarbon group include methylcyclohexyl, dimethylcyclohexyl, 2-alkyladamantane-2-yl, methylnorbornyl and isobornyl groups. In the alicyclic hydrocarbon group where a hydrogen atom can be replaced by an aliphatic hydrocarbon group, the total number of the carbon atoms of the alicyclic hydrocarbon group and the aliphatic hydrocarbon group is preferably 20 or less.

Examples of the aromatic hydrocarbon group preferably include an aryl group such as phenyl, tolyl, xylyl, cumenyl, mesityl, p-ethylphenyl, p-tert-butylphenyl, p-cyclohexylphenyl, p-adamantylphenyl, biphenyl, naphthyl, phenanthryl, 2,6-diethylphenyl and 2-methyl-6-ethylphenyl groups.

When the aromatic hydrocarbon includes an aliphatic hydrocarbon group or an alicyclic hydrocarbon group, a C1 to C18 aliphatic hydrocarbon group or a C3 to C18 alicyclic hydrocarbon group is preferred.

Examples of the aromatic hydrocarbon group where a hydrogen atom can be replaced by an alkoxy group include a p-methoxyphenyl group.

Examples of the aliphatic hydrocarbon group where a hydrogen atom can be replaced by an aromatic hydrocarbon group include an aralkyl group such as benzyl, phenethyl phenylpropyl, trityl, naphthylmethyl and naphthylethyl groups.

Examples of the alkoxy group include methoxy, ethoxy, propoxy, butoxy, pentyloxy, hexyloxy, heptyloxy, octyloxy, and dodecyloxy groups. Examples of the acyl group include acetyl, propionyl and butyryl groups.

Examples of the halogen atom include fluorine, chlorine, bromine and iodine atoms.

Examples of the alkylcarbonyloxy group include methylcarbonyloxy, ethylcarbonyloxy, n-propylcarbonyloxy, isopropylcarbonyloxy, n-butylcarbonyloxy, sec-butylcarbonyloxy, tert-butyl carbonyloxy, pentylcarbonyloxy, hexylcarbonyloxy, octylcarbonyloxy and 2-ethylhexylcarbonyloxy groups.

The sulfur atom-containing ring which is formed by $R^{b4}$ and $R^{b5}$ can be a monocyclic or polycyclic group, which may be an aromatic or non-aromatic group, and which may be a saturated or unsaturated group. The ring is preferably a ring having 3 to 18 carbon atoms, and more preferably a ring having 4 to 13 carbon atoms. Examples of the sulfur atom-containing ring include a 3- to 12-membered ring, preferably a 3- to 7-membered ring, examples thereof include the following rings.

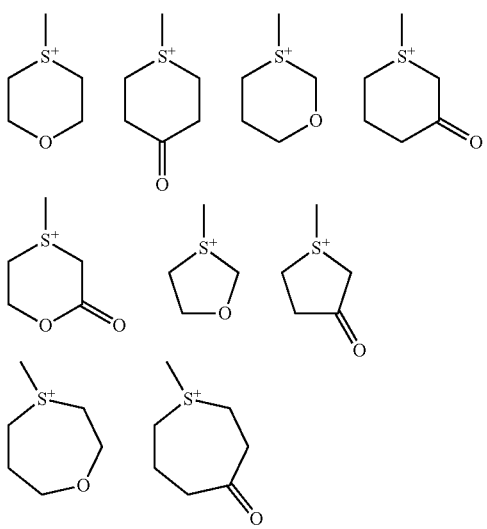
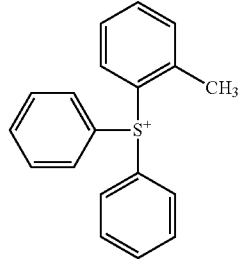
(b2-c-3)

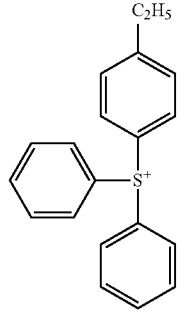
(b2-c-4)

Examples of the ring formed by $R^{b9}$ and $R^{b10}$ include any of monocyclic, polycyclic, aromatic, non-aromatic, saturated and unsaturated rings. The ring may be a 3- to 12-membered ring, preferably a 3- to 7-membered ring. Examples of the ring include thiolane-1-ium ring (tetrahydrothiophenium ring), thian-1-ium ring and 1,4-oxathian-4-ium ring.

Examples of the ring formed by $R^{b11}$ and $R^{b12}$ may be any of monocyclic, polycyclic, aromatic, non-aromatic, saturated and unsaturated rings. The ring may be a 3- to 12-membered ring, preferably a 3- to 7-membered ring.

Examples of the ring include oxocycloheptane ring, oxocyclohexane ring, oxonorbornane ring and oxoadamantane ring.

Among the cations represented by formula (b2-1) to formula (b2-4), the cation represented by formula (b2-1) is preferred.

Examples of the cation represented by formula (b2-1) include the following ones.

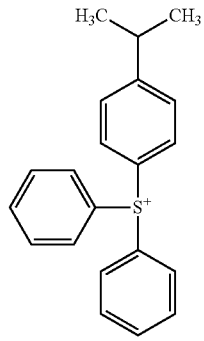
(b2-c-5)

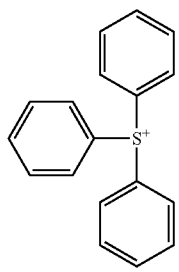
(b2-c-1)

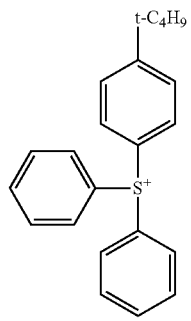
(b2-c-6)

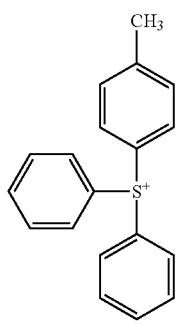
(b2-c-2)

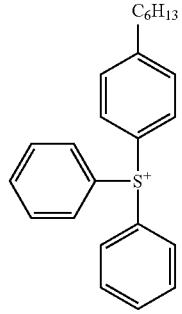
(b2-c-7)

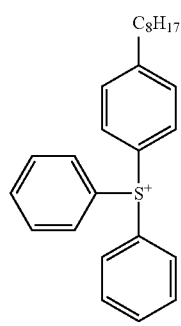 (b2-c-8)
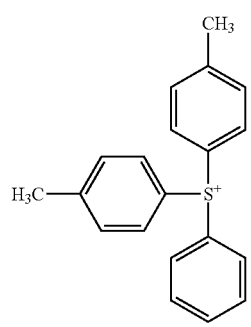 (b2-c-9)
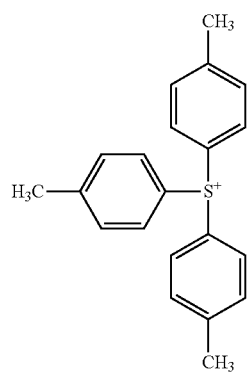 (b2-c-10)
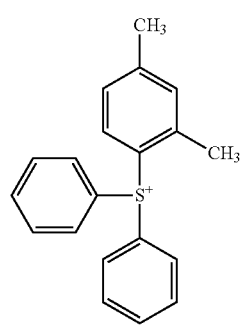 (b2-c-11)
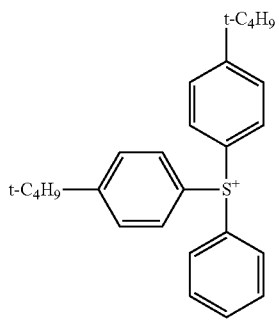 (b2-c-12)
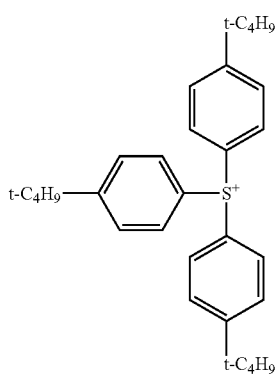 (b2-c-13)
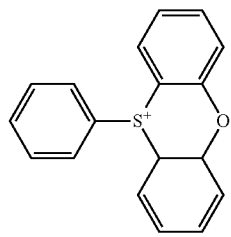 (b2-c-14)
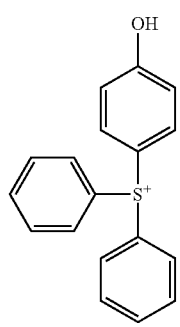 (b2-c-15)
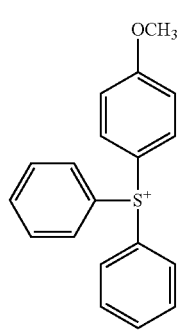 (b2-c-16)

(b2-c-17) 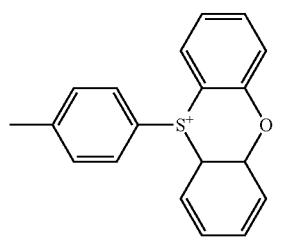
(b2-c-18) 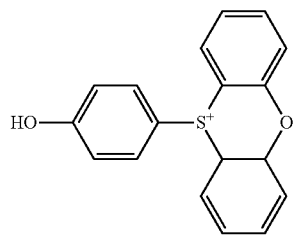
(b2-c-19) 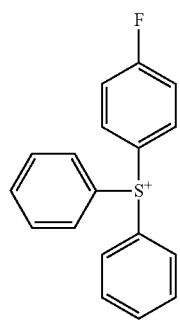
(b2-c-20) 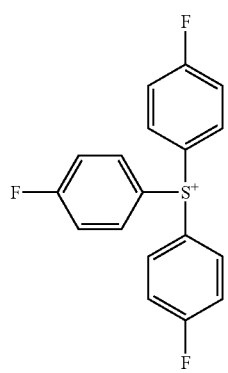
(b2-c-21) 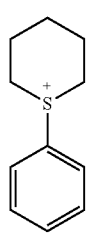
(b2-c-22) 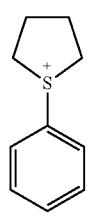
(b2-c-23) 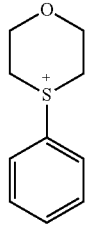
(b2-c-24) 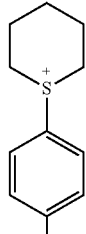
(b2-c-25) 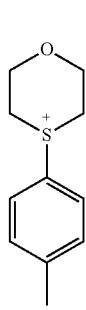
(b2-c-26) 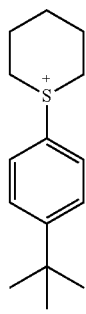
(b2-c-27) 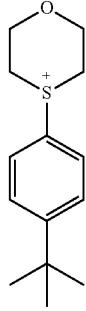
Examples of the cation represented by formula (b2-2) include the following ones.

(b2-c-28)
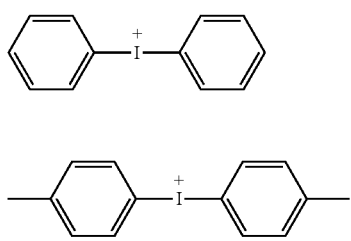
(b2-c-29)
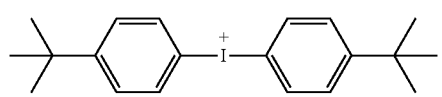
(b2-c-30)
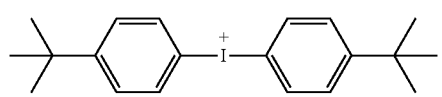
Examples of the cation represented by formula (b2-3) include the following ones.
(b2-c-31)
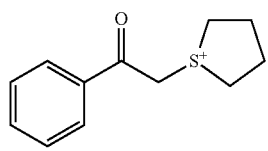
(b2-c-32)
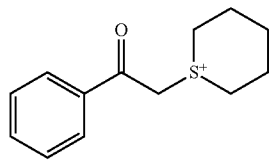
(b2-c-33)
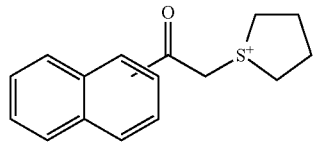
(b2-c-34)
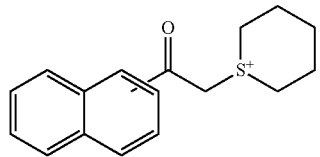
Examples of the cation represented by formula (b2-4) include the following ones.
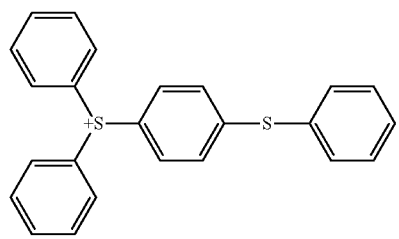
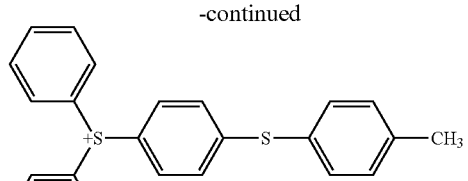
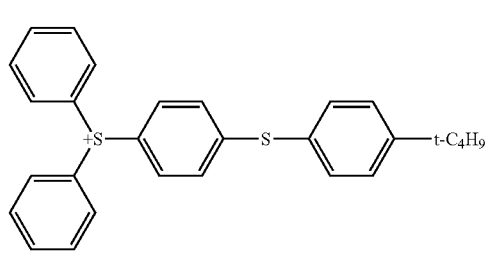
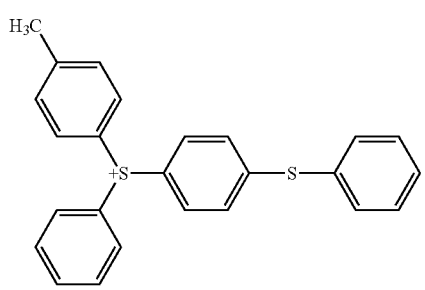
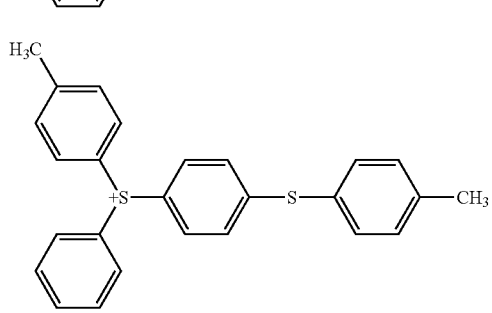
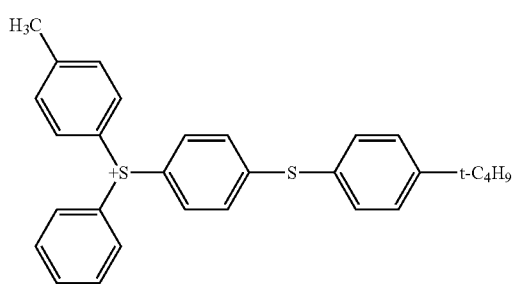
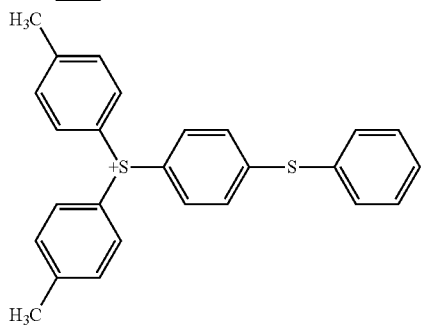

-continued

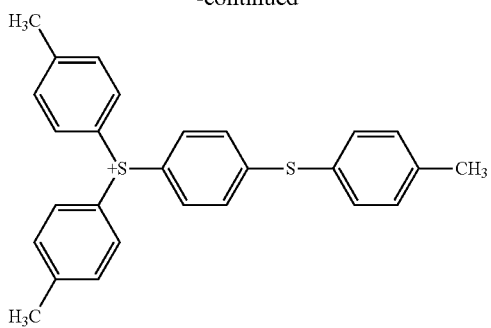

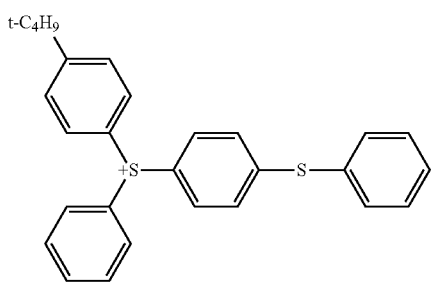

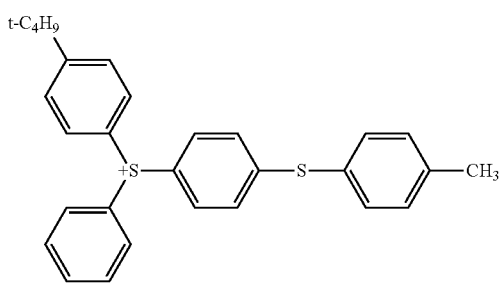

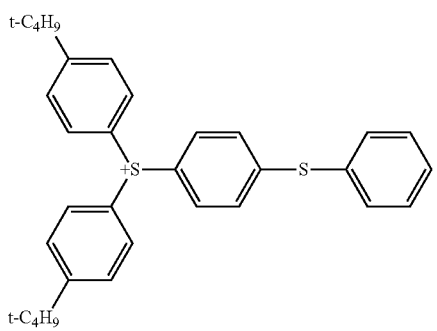

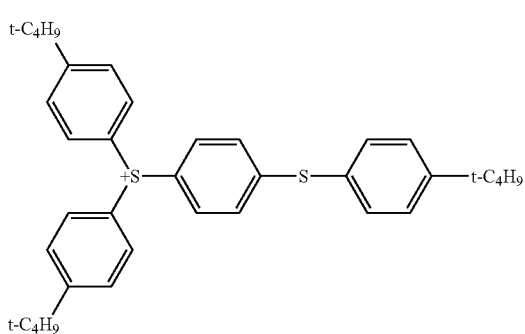

The acid generator (I) can be a salt which consists of the above sulfonate anion and an organic cation.

Specific examples of the acid generators (I) include those as listed in Table 1. In the table, a symbol in each column shows a formula representing an anion or cation. For example, the salt (I-1) consists of an anion represented by formula (aa2-1) and a cation represented by formula (b2-c-1), which is represented the following formula.

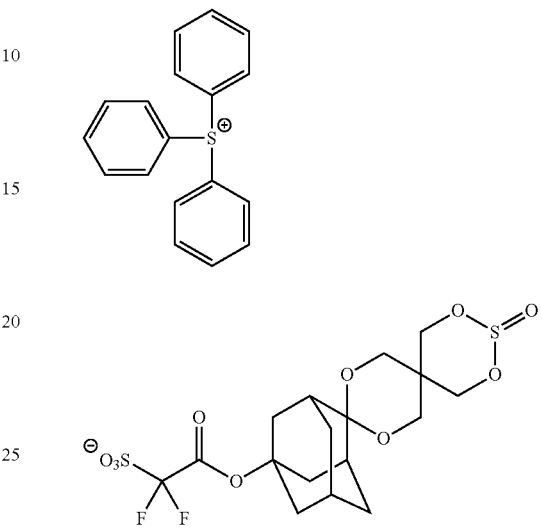

TABLE 1

| Salt   | Anion    | Cation    |
|--------|----------|-----------|
| (I-1)  | (aa2-1)  | (b2-c-1)  |
| (I-2)  | (aa2-2)  | (b2-c-1)  |
| (I-3)  | (aa2-3)  | (b2-c-1)  |
| (I-4)  | (aa2-4)  | (b2-c-1)  |
| (I-5)  | (aa2-5)  | (b2-c-1)  |
| (I-6)  | (aa2-6)  | (b2-c-1)  |
| (I-7)  | (aa2-7)  | (b2-c-1)  |
| (I-8)  | (aa2-8)  | (b2-c-1)  |
| (I-9)  | (aa2-1)  | (b2-c-10) |
| (I-10) | (aa2-2)  | (b2-c-10) |
| (I-11) | (aa2-3)  | (b2-c-10) |
| (I-12) | (aa2-4)  | (b2-c-10) |
| (I-13) | (aa2-5)  | (b2-c-10) |
| (I-14) | (aa2-6)  | (b2-c-10) |
| (I-15) | (aa2-7)  | (b2-c-10) |
| (I-16) | (aa2-8)  | (b2-c-10) |
| (I-17) | (aa2-1)  | (b2-c-27) |
| (I-18) | (aa2-2)  | (b2-c-27) |
| (I-19) | (aa2-3)  | (b2-c-27) |
| (I-20) | (aa2-4)  | (b2-c-27) |
| (I-21) | (aa2-5)  | (b2-c-27) |
| (I-22) | (aa2-6)  | (b2-c-27) |
| (I-23) | (aa2-7)  | (b2-c-27) |
| (I-24) | (aa2-8)  | (b2-c-27) |
| (I-25) | (aa2-1)  | (b2-c-30) |
| (I-26) | (aa2-2)  | (b2-c-30) |
| (I-27) | (aa2-3)  | (b2-c-30) |
| (I-28) | (aa2-4)  | (b2-c-30) |
| (I-29) | (aa2-5)  | (b2-c-30) |
| (I-30) | (aa2-6)  | (b2-c-30) |
| (I-31) | (aa2-7)  | (b2-c-30) |
| (I-32) | (aa2-8)  | (b2-c-30) |

Among the salts as listed in the table, preferred are (I-1), salt(I-2), salt(I-3), salt(I-4), salt(I-9), salt(I-10), salt(I-11), salt(I-12), salt(I-17), salt(I-18), salt(I-19), salt(I-20), salt(I-25), salt(I-26), salt(I-27) and salt(I-28).

The acid generator which consists of an anion represented by formula (aa2) and an organic cation can be produced by reacting a salt represented by the formula (I1-a) with a compound represented by the formula (I1-b) in a solvent such as chloroform, acetonitrile or dimethylformamide in the presence of a base catalyst such as triethylamine.

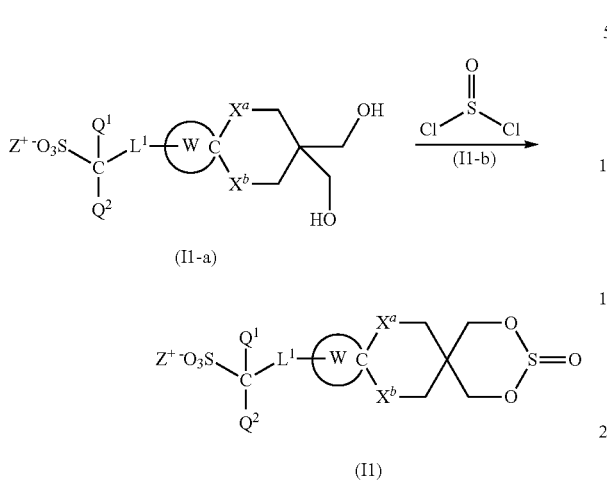

[In each formula, $Q^1$, $Q^2$, $L^1$, W, $X^a$ and $X^b$ are as defined above. $Z^+$ is an organic cation selected from among formulae (b2-1), (b2-2), (b2-3) and (b2-4).]

The temperature for the reaction is usually 0 to 80° C. The reaction time is usually 0.5 to 12 hours.

The salt represented by the formula (I1-a) can be produced by reacting a salt represented by the formula (I1-c) with a compound represented by the formula (I1-d) in a solvent such as chloroform, acetonitrile or dimethylformamide in the presence of an acid catalyst such as p-toluenesulfoneamide.

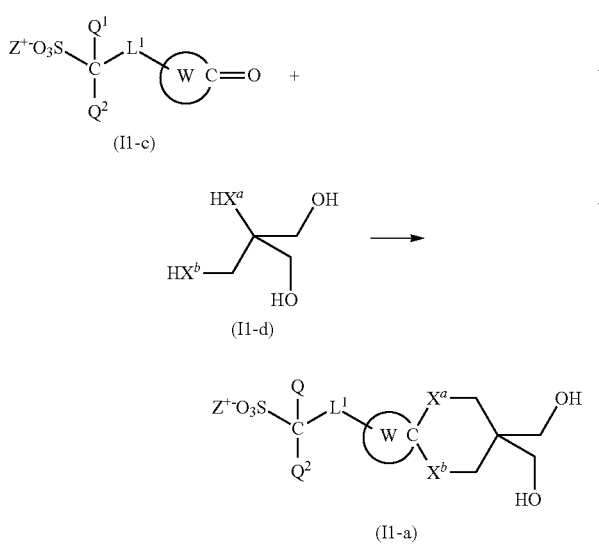

[In each formula, $Z^+$, $Q^1$, $Q^2$, L1, W, $X^a$ and $X^b$ are as defined above.] The temperature for the reaction is usually 0 to 80° C. The reaction time is usually 0.5 to 12 hours.

The salt represented by the formula (I1-c) can be produced according to methods recited in JP2007-224008A1 and JP2012-224611A1. Specific examples of the salt represented by the formula (I1-c) include the following ones.

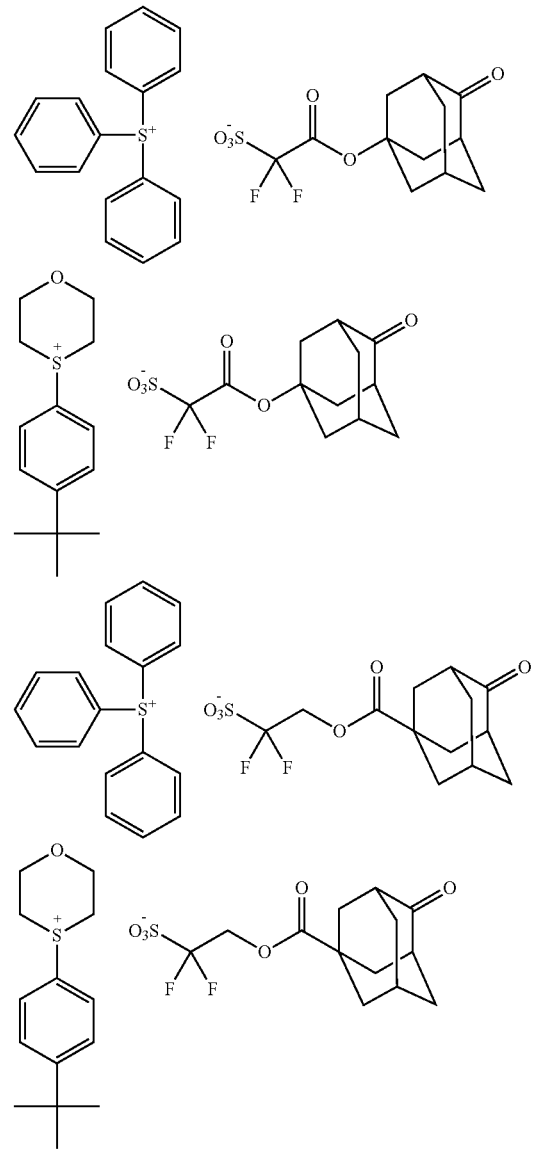

Specific examples of the salt represented by the formula (I1-d) include the following one, which are available on the market.

The photoresist composition can contain one or more of the acid generators (B).

As the acid generator (B), the compounds giving an acid by radiation can be used, which are mentioned in JP2013-68914A1, JP2013-3155A1, JP2013-1905A1, or the like. The acid generator for the photoresist composition can be produced by the method described in the above-mentioned documents.

The acid generator is preferably a fluorine-containing compound, more preferably a salt represented by formula (B1) (which is sometimes referred to as "acid generator (B1)"):

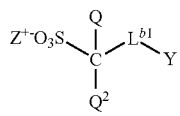
(B1)

wherein $Q^1$, $Q^2$, $L^{b1}$ and $Z^+$ are as defined above, and Y represents an optionally substituted methyl group or an optionally substituted C3 to C18 alicyclic hydrocarbon group where a methylene group can be replaced by an oxygen atom, a carbonyl group or a sulfonyl group.

Examples of the monovalent alicyclic hydrocarbon group of Y include groups represented by formula (Y1) to formula (Y11) and formula (Y36) to formula (Y38). Examples of the monovalent alicyclic hydrocarbon group of Yin which a methylene group has been replaced by an oxygen atom, a carbonyl group or a sulfonyl group include groups represented by formula (Y12) to formula (Y38).

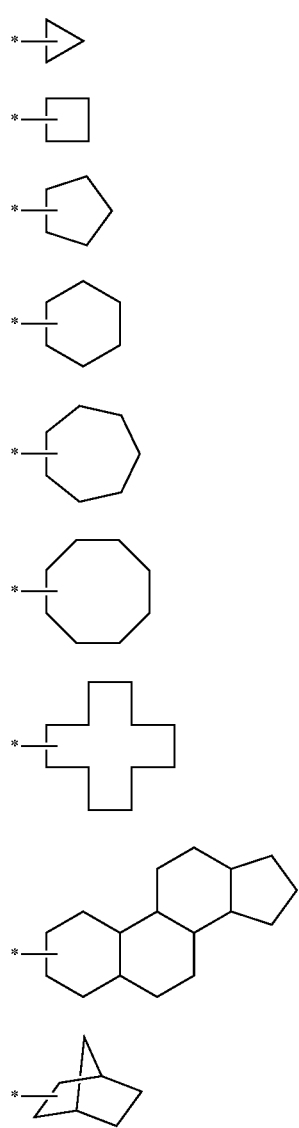

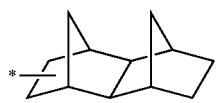 (Y10)

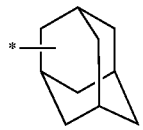 (Y11)

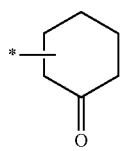 (Y12)

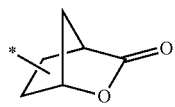 (Y13)

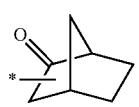 (Y14)

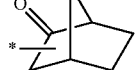 (Y15)

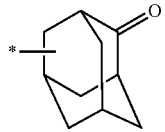 (Y15)

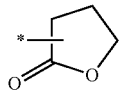 (Y16)

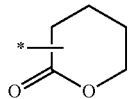 (Y17)

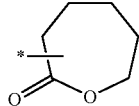 (Y18)

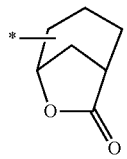 (Y19)

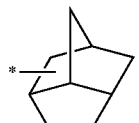 (Y20)

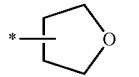 (Y21)

(Y22) 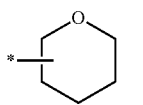

(Y23) 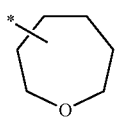

(Y24) 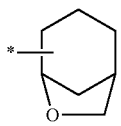

(Y25) 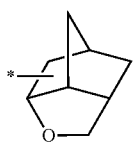

(Y26) 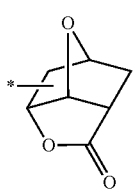

(Y27) 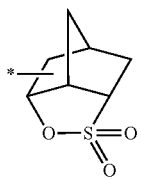

(Y28) 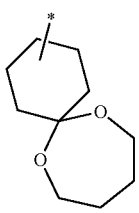

(Y29) 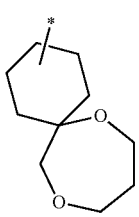

(Y30) 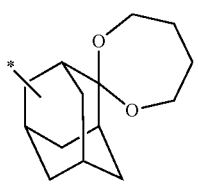

(Y31) 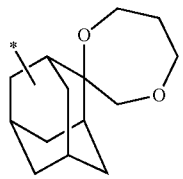

(Y32) 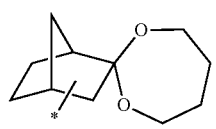

(Y33) 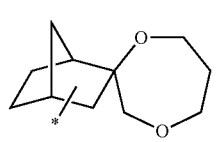

(Y34) 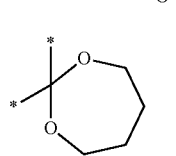

(Y35) 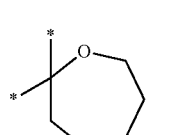

(Y36) 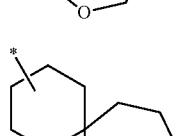

(Y37) 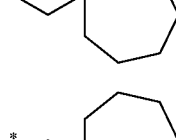

(Y38) 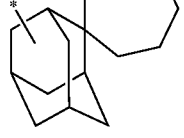

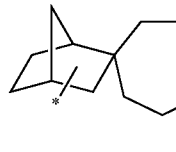

The ketal ring generally has two oxygen atoms each bonded to a carbon atom different to one another. When Y is a spiro ring represented by any of formula (Y28) to (Y33), the alkanediyl group between two oxygen atoms preferably has a fluorine atom. In the ketal ring, a methylene group bonded to the oxygen atom preferably has no fluorine atom.

Examples of the substituent for the alicyclic group of Y include a halogen atom, a hydroxyl group, a C1 to C12 alkyl group, a hydroxy group-containing C1 to C12 alkyl group, a C3 to C16 alicyclic hydrocarbon group, a C1 to C12 alkoxy group, a C6 to C18 aromatic hydrocarbon group, a C7 to C21 aralkyl group, a C2 to C4 acyl group, a glycidyloxy group and —(CH$_2$)$_{j2}$—O—CO—R$^{b1}$— in which R$^{b1}$ represents an C1 to C16 alkyl group, a C3 to C16 alicyclic hydrocarbon group, or a C6 to C18 aromatic hydrocarbon group, and j2 represents an integer of 0 to 4.

Y is preferably a C3 to C18 alicyclic hydrocarbon group which can have a substituent, more preferably an adamantyl group which may have a substituent and in which methylene group can be replaced by an oxygen atom, a carbonyl group or a sufonyl group, and still more preferably an adamantyl group, a hydroxyadamantyl group, and an oxoadamantyl group.

Specific examples of the acid generators (B1) include those represented by formulae (B1-1) to (B1-48). Among them, the acid generators (B1) represented by formulae (B1-1), (B1-2), (B1-3), (B1-5) to (B1-7), (B1-11) to (B1-14), (B1-20), (B1-25), (B1-26), (B1-29), (B1-31) to (B1-48), which contain an arylsulfonium cation, are preferred. In addition to these acid generators, the examples of them include a salt having an anion represented by formula (aa2) and being different from the acid generator (I).

(B1-1)

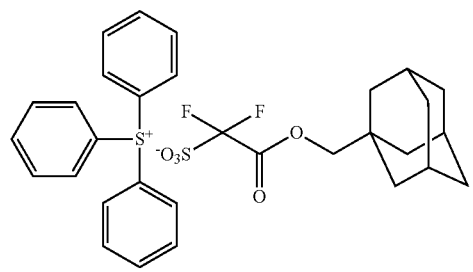

(B1-2)

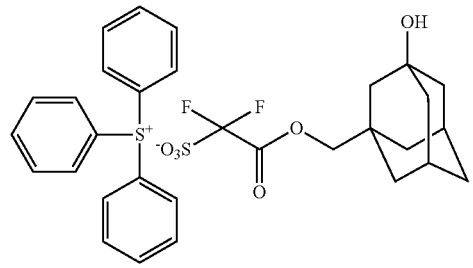

(B1-3)

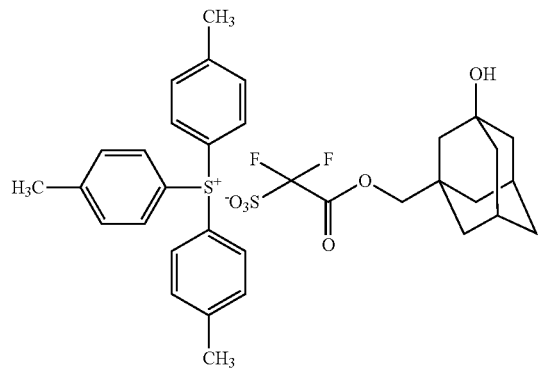

(B1-4)

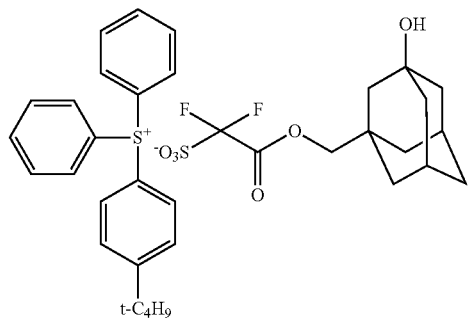

(B1-5)

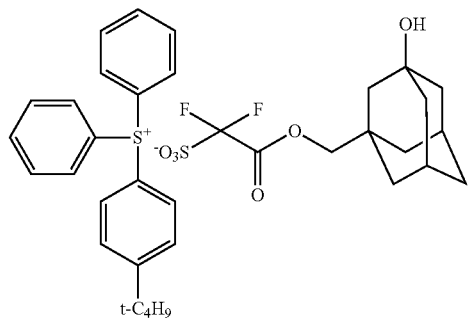

(B1-6)

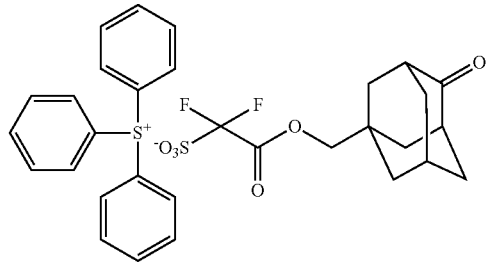

(B1-7)

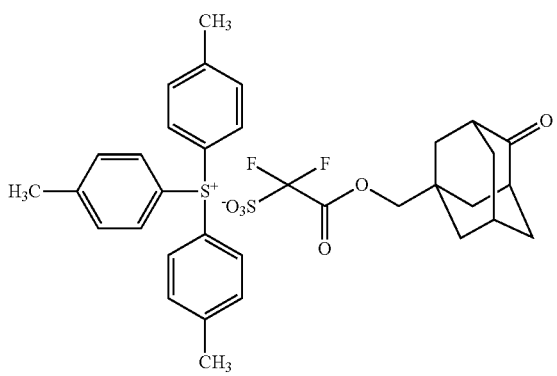

(B1-8)
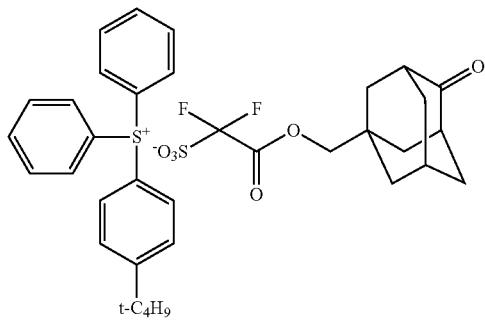
(B1-9)
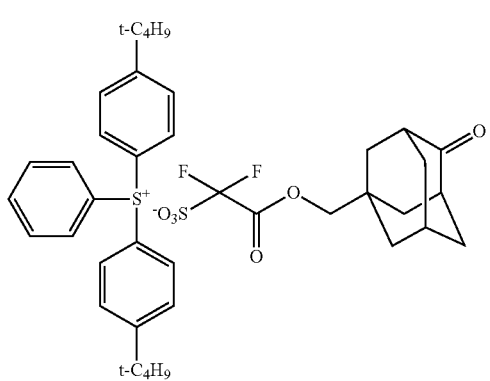
(B1-10)
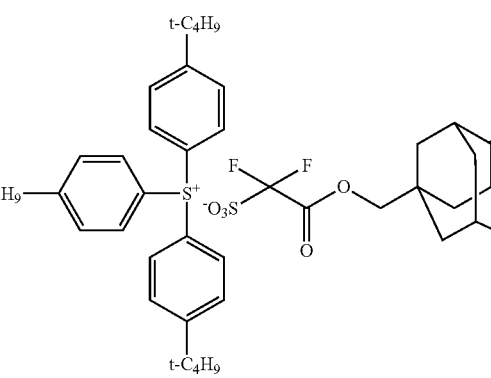
(B1-11)
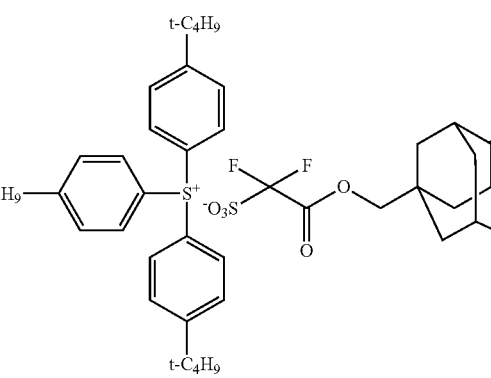
(B1-12)
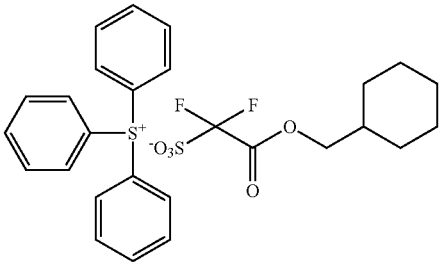
(B1-13)
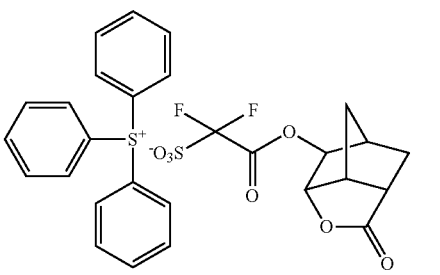
(B1-14)
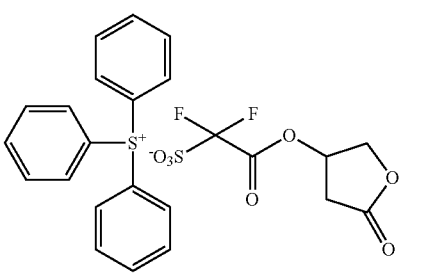
(B1-15)
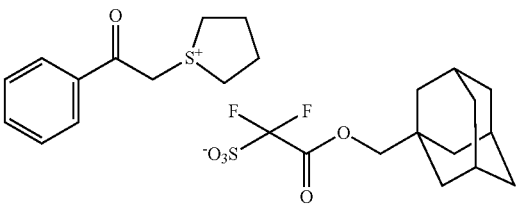
(B1-16)
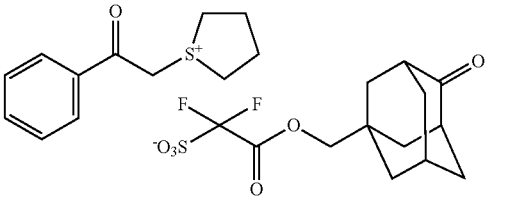
(B1-17)
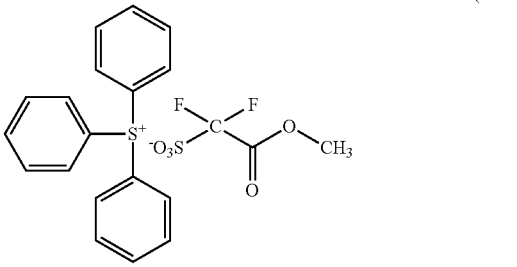

-continued
(B1-18)
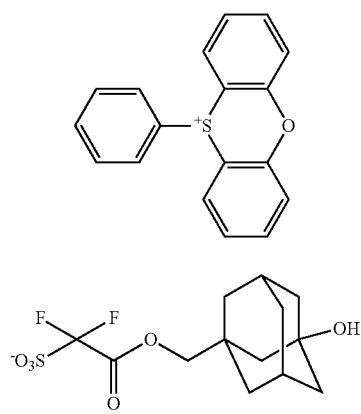
(B1-23)
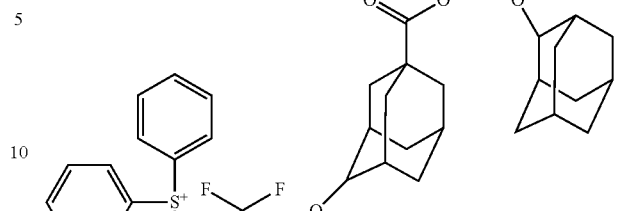
(B1-19)
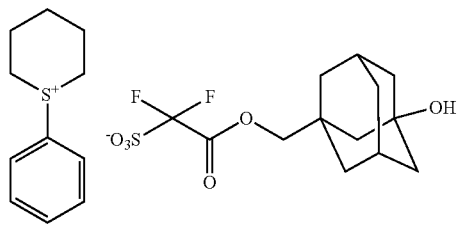
(B1-20)
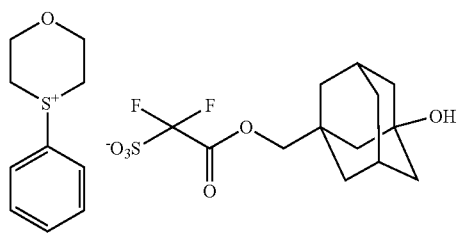
(B1-24)
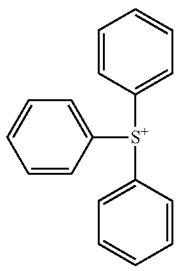
(B1-21)
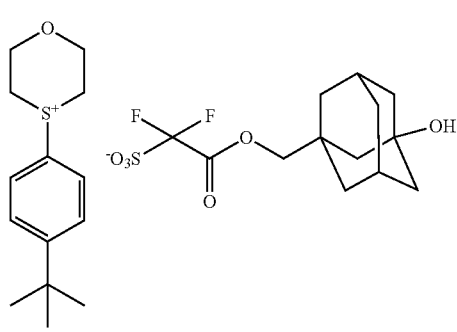
(B1-22)
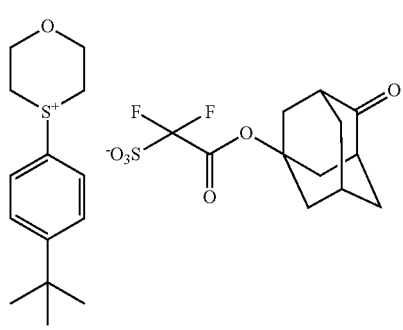
(B1-25)
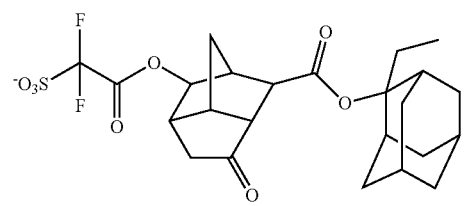

(B1-26)
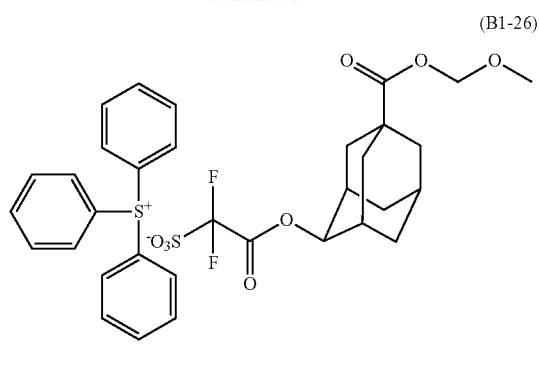
(B1-30)
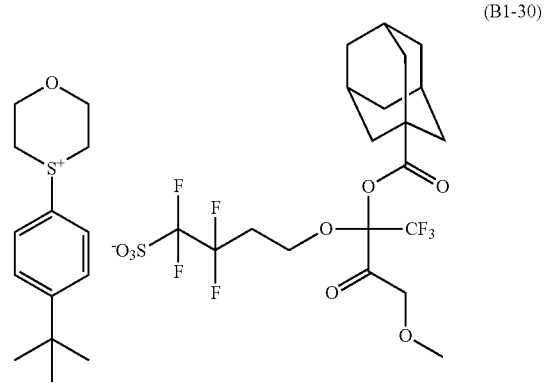
(B1-27)
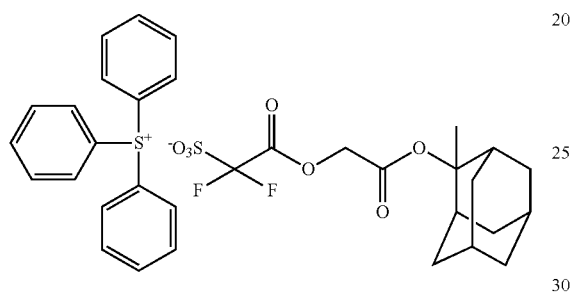
(B1-31)
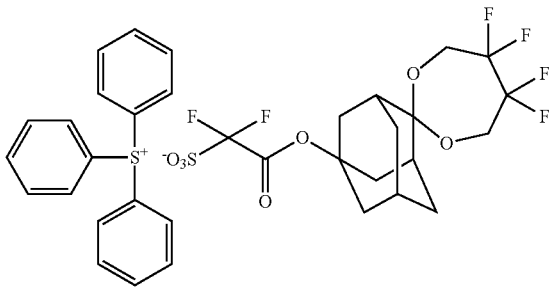
(B1-28)
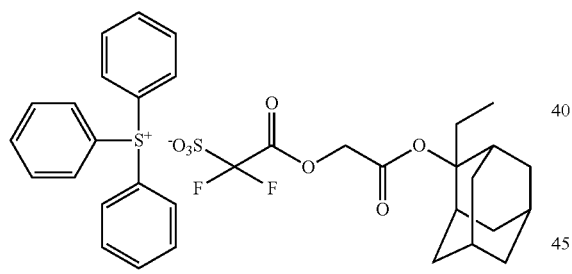
(B1-32)
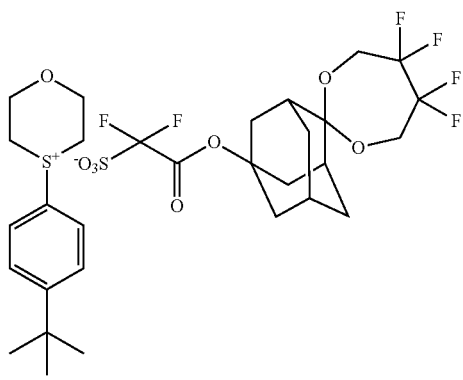
(B1-29)
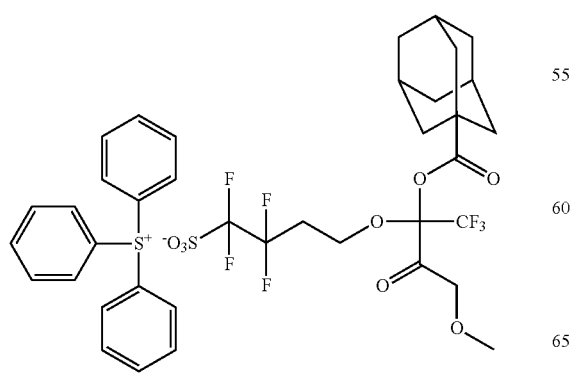
(B1-33)
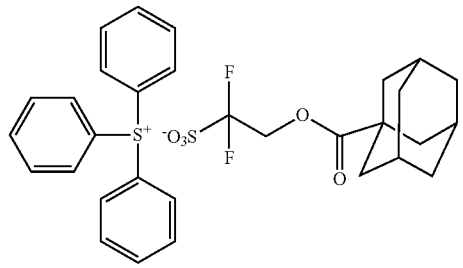

(B1-34)
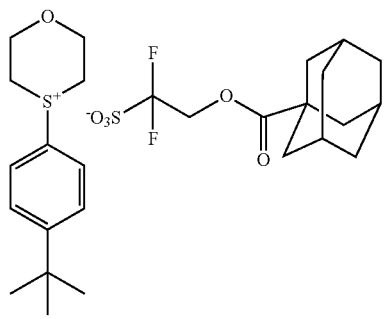
(B1-35)
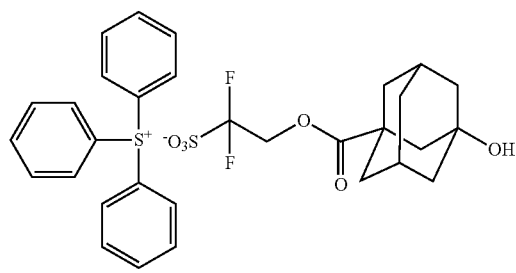
(B1-36)
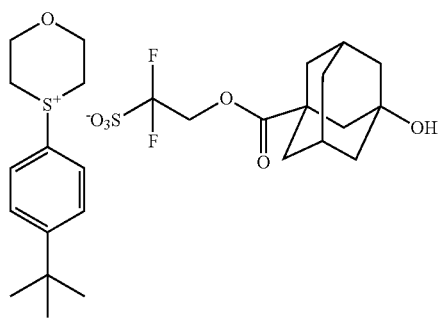
(B1-37)
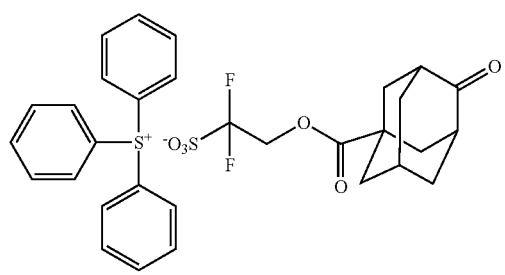
(B1-38)
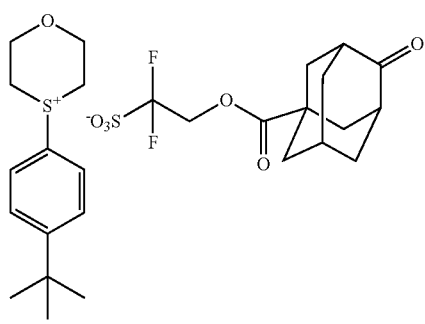
(B1-39)
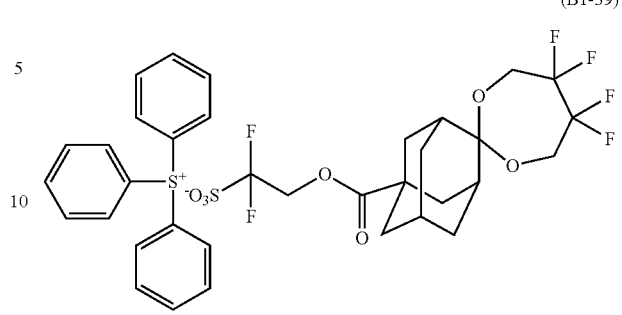
(B1-40)
(B1-41)
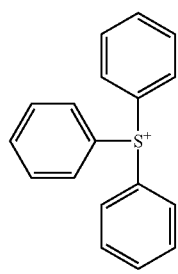
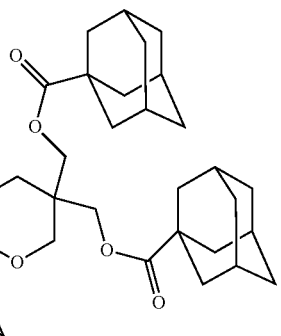

(B1-42)
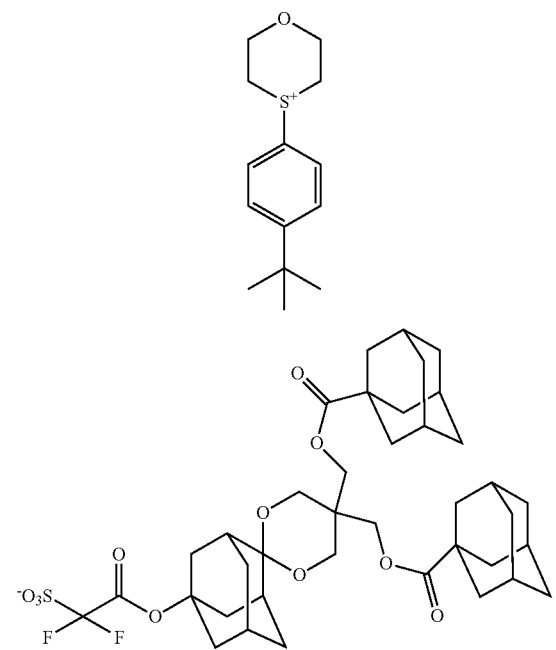
(B1-44)
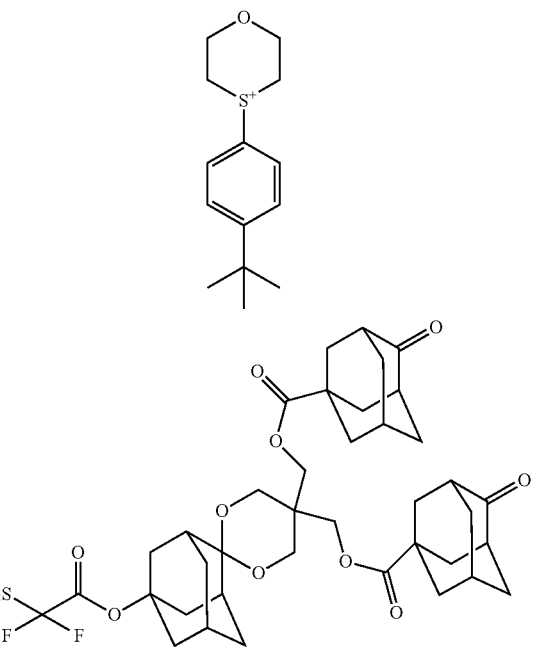
(B1-43)
(B1-45)
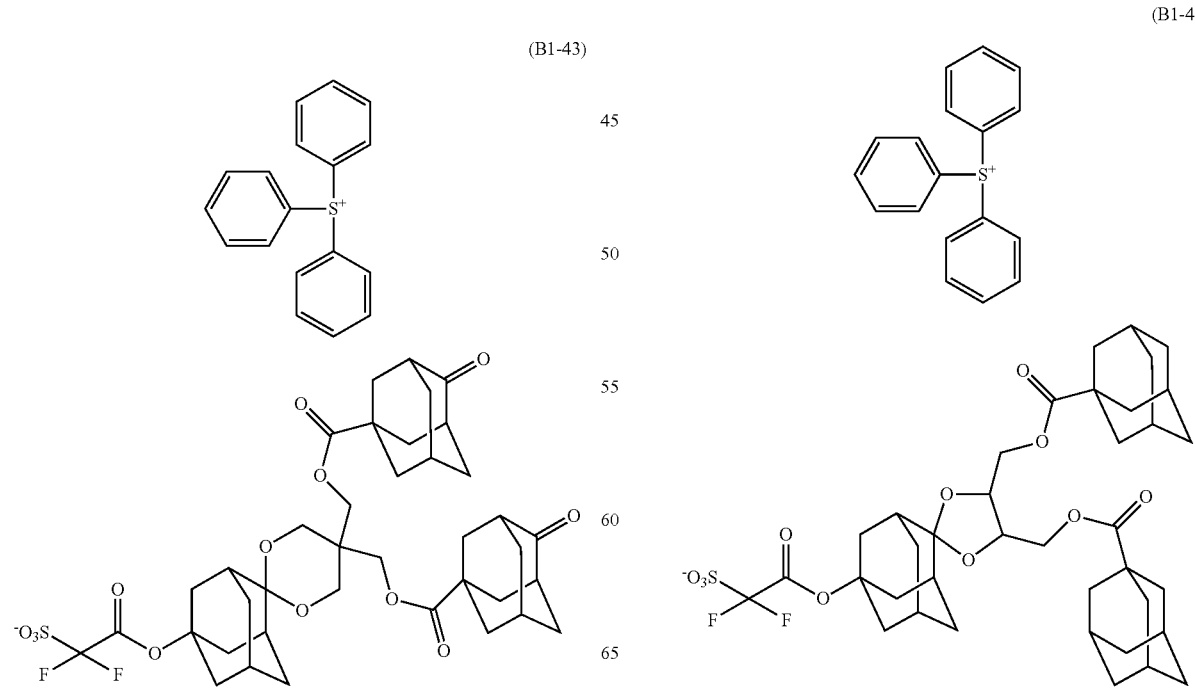

(B1-46)

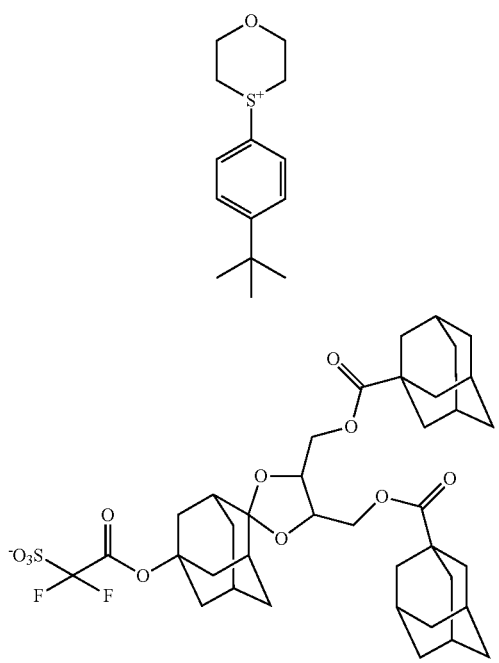

(B1-47)

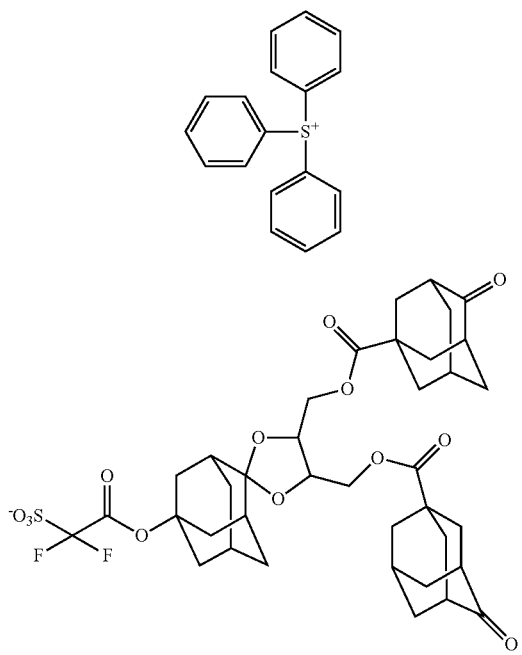

(B1-48)

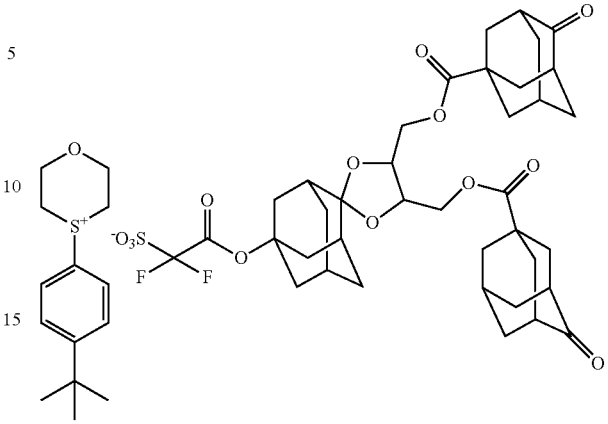

In the photoresist composition of the disclosure, the proportion of the acid generator (B) is preferably 1 part by mass or more and more preferably 3 parts by mass or more, and preferably 20 parts by mass or less and more preferably 15 parts by mass or less with respect to 100 parts by mass of Resin (A).

In the photoresist composition, the total content of the acid generators is preferably 1.5 parts by mass or more and more preferably 3 parts by mass or more, and preferably 40 parts by mass or less and more preferably 35 parts by mass or less with respect to 100 parts by mass of Resin (A).

<Solvent (E)>

The total proportion of a solvent (E) is 90% by mass or more, preferably 92% by mass or more, and more preferably 94% by mass or more, and also preferably 99% by mass or less and more preferably 99.9% by mass or less of the total amount of the photoresist composition. The proportion of the solvent (E) can be measured with a known analytical method such as, for example, liquid chromatography and gas chromatography.

Examples of the solvent (E) include glycol ether esters such as ethylcellosolve acetate, methylcellosolve acetate and propyleneglycolmonomethylether acetate; glycol ethers such as propyleneglycolmonomethylether; esters such as ethyl lactate, butyl acetate, amyl acetate and ethyl pyruvate; ketones such as acetone, methyl isobutyl ketone, 2-heptanone and cyclohexanone; and cyclic esters such as γ-butyrolactone. These solvents may be used as a single solvent or as a mixture of two or more solvents.

The photoresist composition of the disclosure contains preferably γ-butyrolactone as a solvent (E) in view of solubility of the acid generator (I). If a photoresist composition contains an acid generator (I) generating an acid (II), the composition preferably γ-butyrolactone. However, if the composition contains γ-butyrolactone in excessive quantities, a photoresist pattern obtained from the composition is likely to have a shape with a round top. In view of the pattern's shape, the amount of γ-butyrolactone in the composition is preferably as small as possible while the solubility of the acid generator (I) is desirable.

The ratio of γ-butyrolactone with respect to the total amount of solvents (E) is preferably 0.1 to 5% by weight, more preferably 0.2 to 3% by weight, still more preferably 0.3 to 1.5% by weight.

In addition to γ-butyrolactone, the photoresist composition contains preferably at least one selected from the group consisting of propyleneglycolmonomethylether acetate, propyleneglycolmonomethylether and a ketone solvent, more preferably propyleneglycolmonomethylether acetate, propyleneglycolmonomethylether and a ketone solvent. Examples of the ketone solvent include those as mentioned above, preferably 2-heptanone and cyclohexanone, more preferably 2-heptanone.

<Quencher>

The photoresist composition of the present disclosure can further contain a quencher such as a basic nitrogen-containing organic compound or a salt which generates an acid lower in acidity than an acid generated from the acid generators and which is sometimes referred to as "weak acid salt". Examples of the basic nitrogen-containing organic compound include an amine and ammonium salts. The amine can be an aliphatic amine or an aromatic amine. The aliphatic amine includes any of a primary amine, secondary amine and tertiary amine.

Specific examples of the amine include 1-naphtylamine, 2-naphtylamine, aniline, diisopropylaniline, 2-, 3- or 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, dicyclohexylmethylamine, tris[2-(2-methoxyethoxy)ethyl]amine, triisopropanolamine, ethylene diamine, tetramethylene diamine, hexamethylene diamine, 4,4'-diamino-1,2-diphenylethane, 4,4'-diamino-3,3'-dimethyldiphenylmethane, 4,4'-diamino-3,3'-diethyldiphenylmethane, 2,2'-methylenebisaniline, imidazole, 4-methylimidazole, pyridine, 4-methylpyridine, 1,2-di(2-pyridyl)ethane, 1,2-di(4-pyridyl)ethane, 1,2-di(2-pyridyl)ethene, 1,2-di(4-pyridyl)ethene, 1,3-di(4-pyridyl)propane, 1,2-di(4-pyridyloxy)ethane, di(2-pyridyl)ketone, 4,4'-dipyridyl sulfide, 4,4'-dipyridyl disulfide, 2,2'-dipyridylamine, 2,2'-dipicolylamine and bipyridine. Among them, diisopropylaniline is preferred, particularly 2,6-diisopropylaniline is more preferred.

Specific examples of the ammonium salt include tetramethylammonium hydroxide, tetraisopropylammonium hydroxide, tetrabutylammonium hydroxide, tetrahexylammonium hydroxide, tetraoctylammonium hydroxide, phenyltrimethyl ammonium hydroxide, 3-(trifluoromethyl)phenyltrimethylammonium hydroxide, tetra-n-butyl ammonium salicylate and choline.

As to a weak acid salt, the "acidity" for a weak acid salt can be represented by acid dissociation constant, pKa, of an acid generated from the weak acid salt. Examples of the weak acid salt include a salt generating an acid of pKa represents generally more than −3, preferably −1 to 7, and more preferably 0 to 5.

Specific examples of the weak acid salt include the following salts, the weak acid inner salt of formula (D), and salts as disclosed in JP2012-229206A1, JP2012-6908A1, JP2012-72109A1, JP2011-39502A1 and JP2011-191745A1, preferably the salt of formula (D).

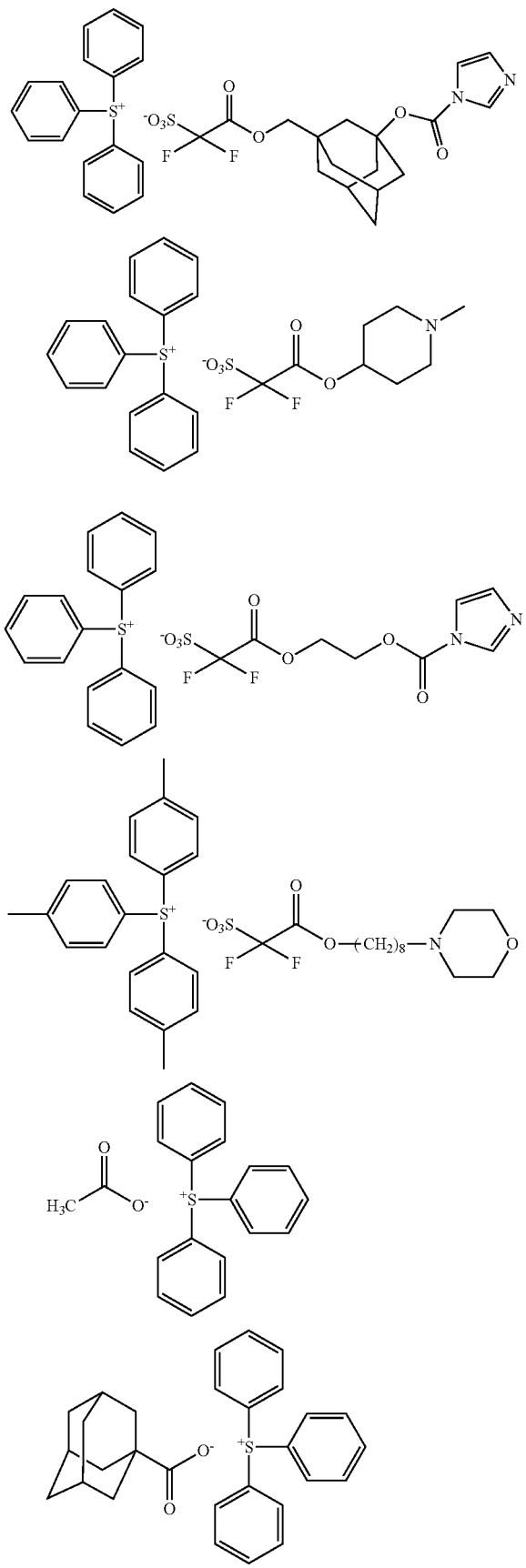

-continued
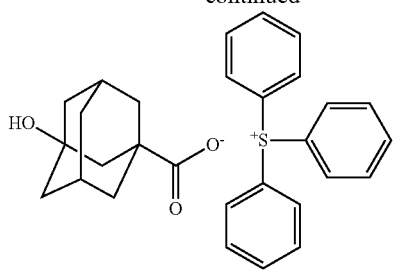
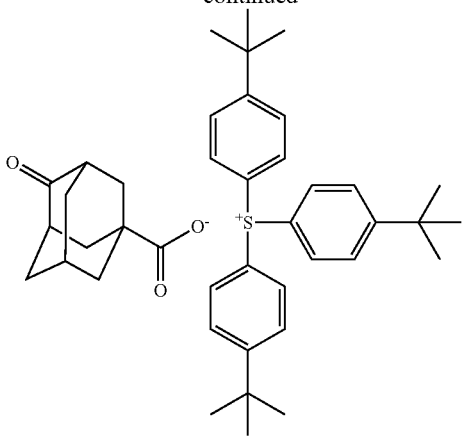
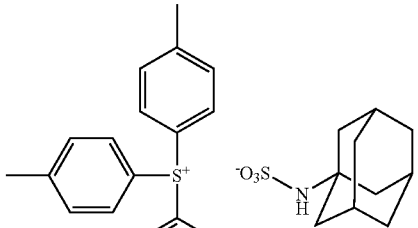
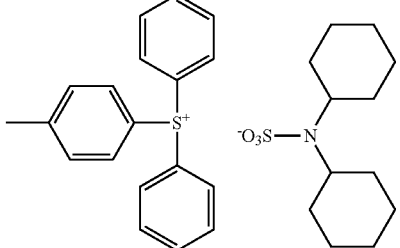
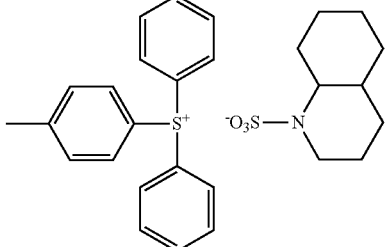
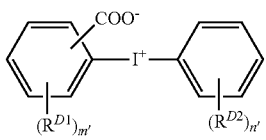
(D)
wherein $R^{D1}$ and $R^{D2}$ in each occurrence independently represent a C1 to C12 hydrocarbon group, a C1 to C6 alkoxy group, a C2 to C7 acyl group, a C2 to C7 acyloxy group, a C2 to C7 alkoxycarbonyl group, a nitro group or a halogen atom, and m' and n' independently represent an integer of 0 to 4.

The hydrocarbon group for $R^{D1}$ and $R^{D2}$ includes any of an aliphatic hydrocarbon group, an alicyclic hydrocarbon group, an aromatic hydrocarbon group and a combination thereof.

Examples of the aliphatic hydrocarbon group include an alkyl group such as methyl, ethyl, propyl, isopropyl, butyl, sec-butyl, tert-butyl, pentyl, hexyl and nonyl groups.

The alicyclic hydrocarbon group is any one of monocyclic or polycyclic hydrocarbon group, and saturated or unsaturated hydrocarbon group. Examples thereof include a cycloalkyl group such as cyclopropyl, cyclobutyl, cyclopentyl, cyclohexyl, cyclononyl and cyclododecyl groups; adamantyl and norbornyl groups. The alicyclic hydrocarbon group is preferably saturated hydrocarbon group.

Examples of the aromatic hydrocarbon group include an aryl group such as phenyl, 1-naphthyl, 2-naphthyl, 2-methylphenyl, 3-methylphenyl, 4-methylphenyl, 4-ethylphenyl, 4-propylphenyl, 4-isopropylphenyl, 4-butylphenyl, 4-tert-butylphenyl, 4-hexylphenyl, 4-cyclohexylphenyl, anthryl, p-adamantylphenyl, tolyl, xylyl, cumenyl, mesityl, biphenyl, phenanthryl, 2,6-diethylphenyl and 2-methyl-6-ethylphenyl groups.

Examples of the combination thereof include an alkyl-cycloalkyl group, a cycloalkyl-alkyl group, an aralkyl group such as phenylmethyl, 1-phenylethyl, 2-phenylethyl, 1-phenyl-1-propyl, 1-phenyl-2-propyl, 2-phenyl-2-propyl, 3-phenyl-1-propyl, 4-phenyl-1-butyl, 5-phenyl-1-pentyl and 6-phenyl-1-hexyl groups.

Examples of the alkoxy group include methoxy and ethoxy groups.

Examples of the acyl group include acetyl, propanonyl, benzoyl and cyclohexanecarbonyl groups.

Examples of the acyloxy group include a group in which oxy group (—O—) bonds to an acyl group.

Examples of the alkoxycarbonyl group include a group in which the carbonyl group (—CO—) bonds to the alkoxy group.

Examples of the halogen atom include a chlorine atom, a fluorine atom and bromine atom.

In the formula (D), $R^{D1}$ and $R^{D2}$ in each occurrence independently preferably represent a C1 to C8 alkyl group, a C3 to C10 cycloalkyl group, a C1 to C6 alkoxy group, a C2 to C4 acyl group, a C2 to C4 acyloxy group, a C2 to C4 alkoxycarbonyl group, a nitro group or a halogen atom.

m' and n' independently preferably represent an integer of 0 to 3, more preferably an integer of 0 to 2, and more preferably 0.

The proportion of the quencher is preferably 0.01% by mass to 5% by mass, more preferably 0.01% by mass to 4% by mass, still more preferably 0.01% by mass to 3% by mass, with respect to the total amount of solid components of the photoresist composition.

<Other Ingredients>

The photoresist composition can also include another ingredient (which is sometimes referred to as "other ingredient (F)"). The other ingredient (F) includes various additives such as sensitizers, dissolution inhibitors, surfactants, stabilizers, and dyes, as needed.

<Preparing a Photoresist Composition>

The photoresist composition of the disclosure can be prepared by mixing a resin (A) and an acid generator (I) as well as Resin (X), a quencher such as a weak acid inner salt (D), an acid generator (B), a solvent (E) and another ingredient (F), as needed. There is no particular limitation on the order of mixing. The mixing can be performed in an arbitrary order. The temperature of mixing may be adjusted to an appropriate temperature within the range of 10 to 40° C., depending on the kinds of the resin and solubility in the solvent (E) of the resin. The time of mixing may be adjusted to an appropriate time within the range of 0.5 to 24 hours, depending on the mixing temperature. There is no particular limitation to the tool for mixing. An agitation mixing may be adopted.

After mixing the above ingredients, the present photoresist compositions can be prepared by filtering the mixture through a filter having about 0.003 to 0.2 μm of its pore diameter.

<Method for Producing a Photoresist Pattern>

The method for producing a photoresist pattern of the present disclosure includes the steps of:

(1) applying a photoresist composition of the present disclosure onto a substrate;

(2) drying the applied composition to form a composition layer;

(3) exposing the composition layer;

(4) heating the exposed composition layer, and (5) developing the heated composition layer with butyl acetate.

Applying the photoresist composition onto a substrate can generally be carried out by using a photoresist application device, such as a spin coater known in the field of semiconductor microfabrication technique.

Examples of the substrate include inorganic substrates such as silicon, SiN, $SiO_2$ or SiN, and Spin-on glass [SOG] or other coated inorganic substrates. Substrate which can be used include washed one, and one on which an organic antireflection film formed before application of the photoresist composition. A commercially available antireflection composition can be used for the organic antireflection film.

The solvent evaporates from the photoresist composition to forma composition layer. Drying the composition on a substrate can be carried out using a heating device such as a hotplate (so-called "prebake"), a decompression device, or a combination thereof. The temperature is preferably within the range of 50 to 200° C. The time for heating is preferably 10 to 180 seconds, more preferably 30 to 120 seconds. The pressure is preferably within the range of 1 to $1.0 \times 10^5$ Pa.

The thickness of the composition layer is usually 20 to 1000 nm, preferably 50 to 400 nm. The thickness can be adjusted by changing conditions for a photoresist application device.

The composition layer thus obtained is generally exposed using an exposure apparatus or a liquid immersion exposure apparatus. The exposure is generally carried out using with various types of exposure light source, such as irradiation with ultraviolet lasers, i.e., KrF excimer laser (wavelength: 248 nm), ArF excimer laser (wavelength: 193 nm), $F_2$ excimer laser (wavelength: 157 nm), irradiation with harmonic laser light of far-ultraviolet or vacuum ultra violet wavelength-converted laser light from a solid-state laser source (YAG, semiconductor laser or the like), or irradiation with electron beam, EUV or the like. The composition layer is preferably exposed using a liquid immersion exposure apparatus with ArF excimer laser. In the specification, such exposure to radiation is sometimes referred to be collectively called as exposure. The exposure is generally carried out in the manner of immersion exposure, e.g., in such a way that liquid medium is placed in contact with a composition layer. When immersion exposure is conducted, the surface of composition layer can optionally be washed with an aqueous chemical before and/or after the exposure. The liquid immersion medium for liquid immersion exposure is preferably a liquid which can maintain transparent for exposing with ArF excimer laser and whose temperature coefficient of the refractive index is so as small to minimize the distortion of the optics image reflected on the composition layer. Preferred examples of such liquid immersion medium include water, specifically ultrapure water, owing to its availability.

When water is used for the liquid immersion medium, a small amount of an additive capable of decreasing surface tension of the water and increasing surface activity of the water can be added to the water.

As such additive, preferred is an additive which does not dissolve a composition layer and which has substantially no effect on optics coat at the undersurface of a lens element which the exposure apparatus has. The exposure amount or quantity can be controlled depending on the photoresist composition to be used, the photoresist pattern to be produced or the exposure source for the production. The exposure amount or quantity is preferably 5 to 50 mJ/cm$^2$.

Exposure can be conducted twice or more times. If exposure is conducted twice or more times, each step can be conducted using the same procedure and exposure source as those of another time or a different procedure and exposure source from those of another time.

After exposure, the composition layer is subjected to a heat treatment (so-called "post-exposure bake"). The heat treatment can be carried out using a heating device such as a hotplate. The heating temperature is generally in the range of 50 to 200° C., preferably in the range of 70 to 150° C. Temperature for heating is generally 5 to 60° C. The time for developing is preferably 10 to 180 seconds, more preferably 30 to 120 seconds.

The developing of the baked composition film is usually carried out with a developer using a development apparatus.

The development for obtaining a photoresist pattern is usually carried out with a developer containing butyl acetate. The developer can further include a solvent other than butyl acetate.

The solvent other than butyl acetate can be anyone of various organic solvents used in the art, examples of which include ketone solvents such as 2-hexanone, 2-heptanone; glycol ether ester solvents such as propyleneglycolmonomethylether acetate; ester solvents; glycol ether solvents such as the propyleneglycolmonomethylether; amide solvents such as N,N-dimethylacetamide; aromatic hydrocarbon solvents such as anisole. In the developer containing butyl acetate, the amount of butyl acetate is preferably 50% by mass to 100% by mass of the developer. The developer still more preferably consists essentially of butyl acetate.

Developers containing an organic solvent can contain a surfactant. The surfactant is not limited to a specific one, and examples of that include an ionic surfactant or a nonionic surfactant, specifically a fluorine-based surfactant and a silicon-based surfactant.

Developing can be conducted in the manner of dipping method, paddle method, spray method and dynamic dispensing method.

Examples of developing procedure include dipping method in which a post-exposure baked composition layer together with the substrate having the layer is immersed in a developing solution with which a vessel is filled for a certain period of time;

paddle method in which developing is conducted while a developer is heaped up and kept on a post-exposure baked composition layer by surface tension for a certain period of time;

spray method in which developing is conducted by spraying a developer to a post-exposure baked composition layer on its surface tension; and dynamic dispensing method in which dispensing a developer is conducted while adjusting a dispensing nozzle to a certain speed and rotating the substrate on which a post-exposure baked composition layer forms.

For the process of the present disclosure, the paddle method and the dynamic dispensing method are preferred, and the dynamic dispensing method is more preferred.

Developing temperature is preferably in the range of 5 to 60° C., more preferably in the range of 10 to 40° C. The time for developing is preferably 5 to 300 seconds, more preferably 5 to 90 seconds. For the dynamic dispensing method, the time for developing is preferably 5 to 30 seconds. For the paddle method, the time for developing is preferably 20 to 60 seconds.

After development, the photoresist pattern formed is preferably washed with a rinse agent. Such rinse agent is not limited as long as it is incapable of dissolving a photoresist pattern. Examples of the agent include solvents which contain organic solvents other than the above-mentioned developers, such as alcohol agents or ester agents. After washing, the residual rinse agent remained on the substrate or photoresist film is preferably removed therefrom.

<Application>

The photoresist composition of the present disclosure is useful for excimer laser lithography such as with ArF, KrF, electron beam (EB) exposure lithography or extreme-ultraviolet (EUV) exposure lithography, and is more useful for electron beam (EB) exposure lithography, ArF excimer laser exposure lithography and extreme-ultraviolet (EUV) exposure lithography. The photoresist composition of the present disclosure can be used in semiconductor microfabrication.

EXAMPLES

All percentages and parts expressing the contents or amounts used in the Examples and Comparative Examples are based on mass, unless otherwise specified.

The weight average molecular weight is a value determined by gel permeation chromatography.

Equipment: HLC-8120GPC type (Tosoh Co. Ltd.)

Column: TSK gel Multipore HXL-M x 3+guardcolumn (Tosoh Co. Ltd.)

Eluant: tetrahydrofuran

Flow rate: 1.0 mL/min.

Detecting device: RI detector

Column temperature: 40° C.

Injection amount: 100 μL

Standard material for calculating molecular weight: standard polystyrene (Tosoh Co. ltd.)

Structures of compounds were determined by mass spectrometry (Liquid Chromatography: 1100 Type, manufactured by AGILENT TECHNOLOGIES LTD., Mass Spectrometry: LC/MSD Type, manufactured by AGILENT TECHNOLOGIES LTD.).

Synthesis Example 1

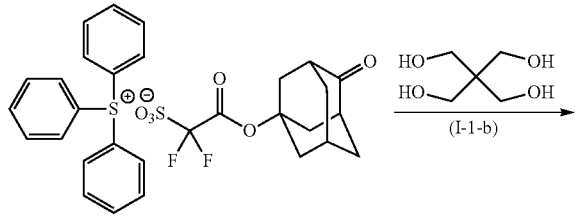

(I-1-a)

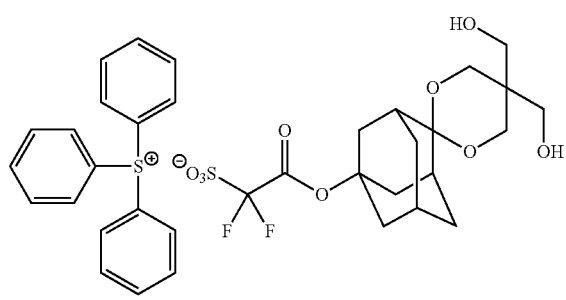

(I-1-c)

The salt represented by the formula (I-1-a) was prepared according to the method described in JP2007-224008A1.

A mixture of 7 parts of the salt represented by the formula (I-1-a), 6.5 parts of the salt represented by the formula (I-1-b), 35 parts of chloroform, 14 parts of acetonitrile and 14 parts of dimethylformamide was stirred at 23° C. for 30 minutes.

To the mixture, 0.07 part of p-toluenesulfonic acid were added, and the resultant mixture was refluxed for 3 hours with stirring. The obtained mixture was cooled down to 23° C., and then, 155 parts of chloroform and 40 parts of 5% aqueous sodium hydrogen carbonate solution were added thereto, followed by conducting stirring at 23° C. for 30 minutes. The mixture obtained was separated to an organic layer and an aqueous layer. The organic layer obtained was washed three times with 45 parts of ion-exchanged water at 23° C. To the obtained layer, 95 parts of ethyl acetate was added, followed by removing the supernatant therefrom. The obtained residue was dissolved in acetonitrile, followed by being concentrated to give 4.38 parts of the salt represented by formula (I-1-c).

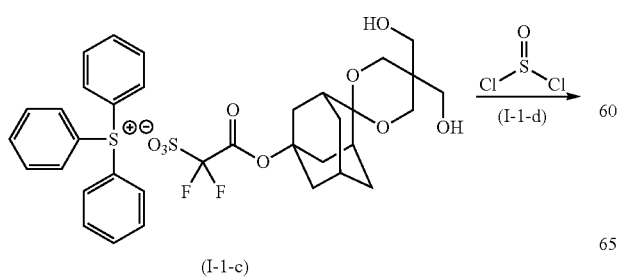

(I-1-c)

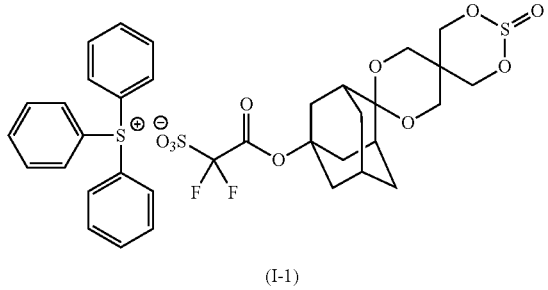

(I-1)

A mixture of 2.5 parts of the salt represented by the formula (I-1-c), 25 parts of chloroform and 2.5 parts of dimethylformamide was stirred at 23° C. for 30 minutes and then cooled to 5° C.

To the mixture, 0.42 parts of the salt represented by the formula (I-1-d) was added over 15 minutes, followed by adding 0.40 parts of trimethylamine thereto. Then the mixture was heated to 23° C. and then stirred at 23° C. for two hours.

To the obtained reaction mixture, 15 parts of ion-exchanged water was added and then stirred, followed by being separated by being left stand.

The organic layer was washed twice with ion-exchanged water. The washed organic layer was concentrated and then 1.08 parts of acetonitrile and 32.18 parts of tert-butylmethyl-ether were added and stirred at 23° C. for 30 minutes, followed by removing the supernatant therefrom, followed by being concentrated to give 3.58 parts of the salt represented by formula (I-1).

MS (ESI(+) Spectrum): $M^+$ 263.1
MS (ESI(−) Spectrum): $M^-$ 487.1

Synthesis Example 2

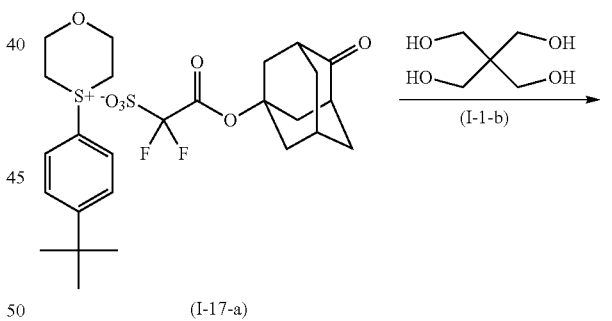

(I-17-a)

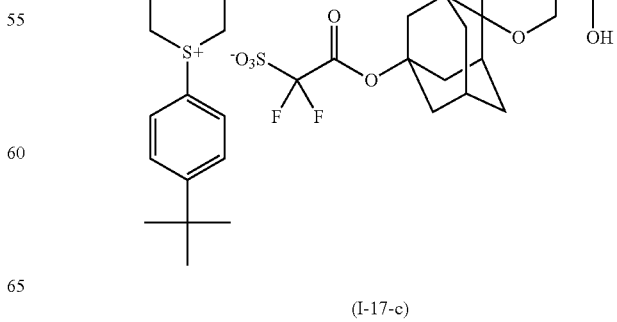

(I-17-c)

The salt represented by the formula (I-17-a) was prepared according to the method described in JP2012-2244611A1.

A mixture of 6.69 parts of the salt represented by the formula (I-17-a), 6.5 parts of the salt represented by the formula (I-1-b), 35 parts of chloroform, 14 parts of acetonitrile and 14 parts of dimethylformamide was stirred at 23° C. for 30 minutes.

To the mixture, 0.07 part of p-toluenesulfonic acid were added, and the resultant mixture was refluxed for 3 hours with stirring. The obtained mixture was cooled down to 23° C., and then 155 parts of chloroform were added thereto and then stirred, followed by being filtrated. Then 40 parts of 5% aqueous sodium hydrogen carbonate solution was added to the filtrated solution and stirred at 23° C. for 30 minutes. Then an organic layer was separated by being left to stand.

The collected organic layer, 45 parts of ion-exchanged water was added, and the obtained mixture was stirred at 23° C. for 30 minutes and then an organic layer was collected by being separated. The organic layer obtained was washed three times with ion-exchanged water. To the obtained layer, 95 parts of ethyl acetate was added, followed by removing the supernatant therefrom. The obtained residue was dissolved in acetonitrile, followed by being concentrated to give 3.69 parts of the salt represented by formula (I-17-c).

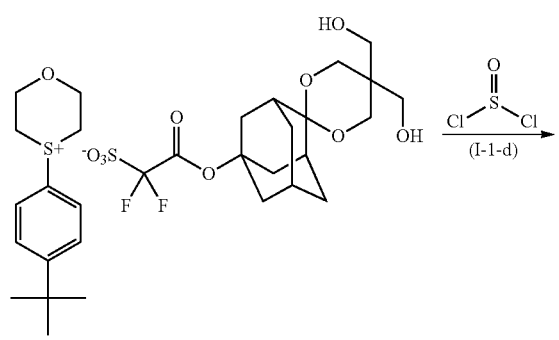

(I-17-c)

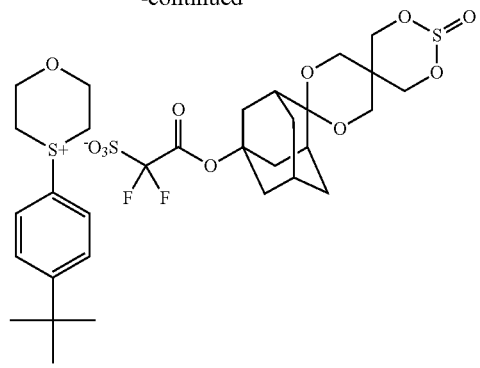

(I-17)

A mixture of 2.41 parts of the salt represented by the formula (I-17-c), 25 parts of chloroform and 2.5 parts of dimethylformamide was stirred at 23° C. for 30 minutes and then cooled to 5° C.

To the mixture, 0.42 parts of the salt represented by the formula (I-1-d) was added over 15 minutes, followed by adding 0.40 parts of trimethylamine thereto. Then the mixture was heated to 23° C. and then stirred at 23° C. for two hours.

To the obtained reaction mixture, 15 parts of ion-exchanged water was added and then stirred, followed by being separated by being left stand.

The organic layer was washed twice with ion-exchanged water. The washed organic layer was concentrated and then 1.08 parts of acetonitrile and 32.18 parts of tert-butylmethylether were added and stirred at 23° C. for 30 minutes, followed by removing the supernatant therefrom, followed by being concentrated to give 2.68 parts of the salt represented by formula (I-17).

MS (ESI(+) Spectrum): $M^+$ 237.1
MS (ESI(−) Spectrum): $M^-$ 487.1

Synthesis Example 3

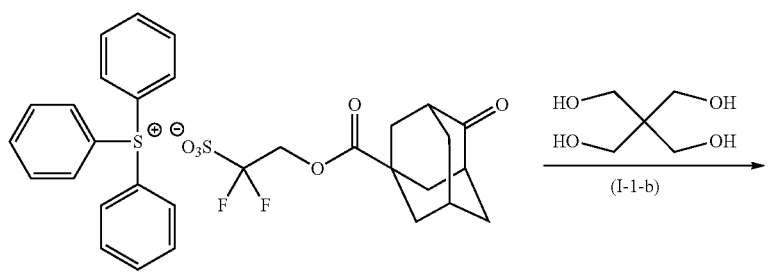

(I-2-a)

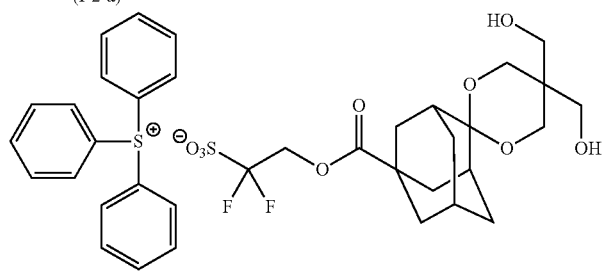

(I-2-c)

The salt represented by the formula (I-2-a) was prepared according to the method described in JP2009-46479A1.

A mixture of 7.17 parts of the salt represented by the formula (I-2-a), 6.5 parts of the salt represented by the formula (I-1-b), 35 parts of chloroform, 14 parts of acetonitrile and 14 parts of dimethylformamide was stirred at 23° C. for 30 minutes.

To the mixture, 0.07 part of p-toluenesulfonic acid were added, and the resultant mixture was refluxed for 3 hours with stirring. The obtained mixture was cooled down to 23° C., and then 155 parts of chloroform were added thereto and then stirred, followed by being filtrated. Then 40 parts of 5% aqueous sodium hydrogen carbonate solution was added to the filtrated solution and stirred at 23° C. for 30 minutes. Then an organic layer was separated by being left to stand.

The collected organic layer, 45 parts of ion-exchanged water was added, and the obtained mixture was stirred at 23° C. for 30 minutes and then an organic layer was collected by being separated. The organic layer obtained was washed three times with ion-exchanged water. To the obtained layer, 50 parts of ethyl acetate was added, followed by removing the supernatant therefrom. The obtained residue was dissolved in acetonitrile, followed by being concentrated to give 4.22 parts of the salt represented by formula (I-2-c).

A mixture of 2.55 parts of the salt represented by the formula (I-2-c), 25 parts of chloroform and 2.5 parts of dimethylformamide was stirred at 23° C. for 30 minutes and then cooled to 5° C.

To the mixture, 0.42 parts of the salt represented by the formula (I-1-d) was added over 15 minutes, followed by adding 0.4 parts of trimethylamine thereto. Then the mixture was heated to 23° C. and then stirred at 23° C. for two hours.

To the obtained reaction mixture, 15 parts of ion-exchanged water was added and then stirred, followed by being separated by being left stand.

The organic layer was washed twice with ion-exchanged water. The washed organic layer was concentrated and then 1.08 parts of acetonitrile and 32.18 parts of tert-butylmethylether were added and stirred at 23° C. for 30 minutes, followed by removing the supernatant therefrom, followed by being concentrated to give 3.12 parts of the salt represented by formula (I-2).

MS (ESI(+) Spectrum): M$^+$ 263.1
MS (ESI(−) Spectrum): M$^-$ 501.1

Synthesis Example 4

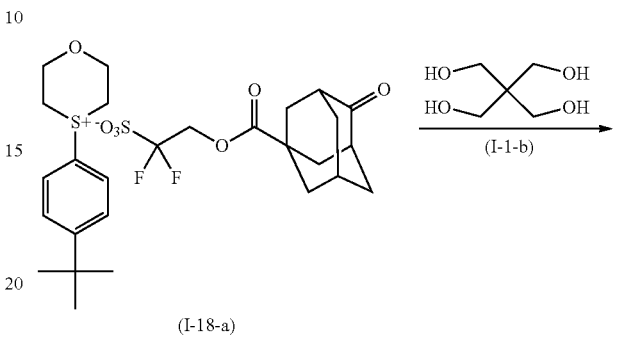

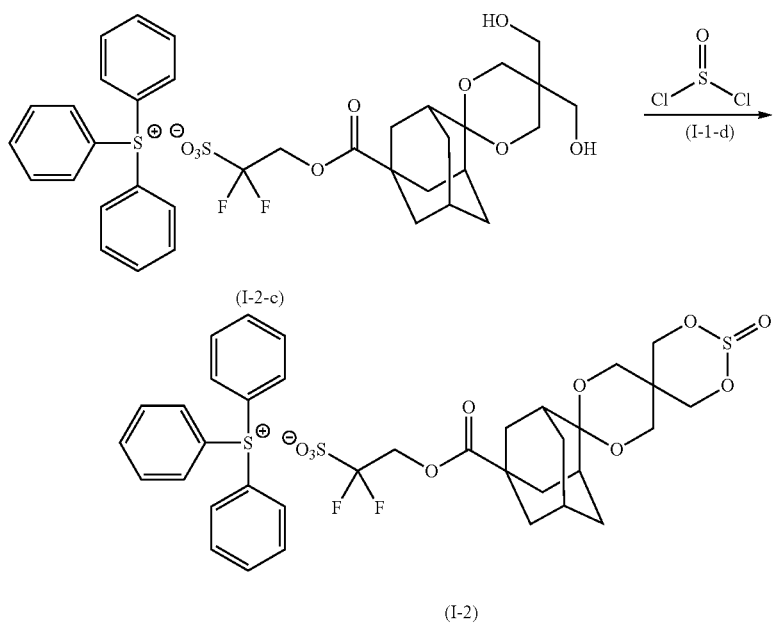

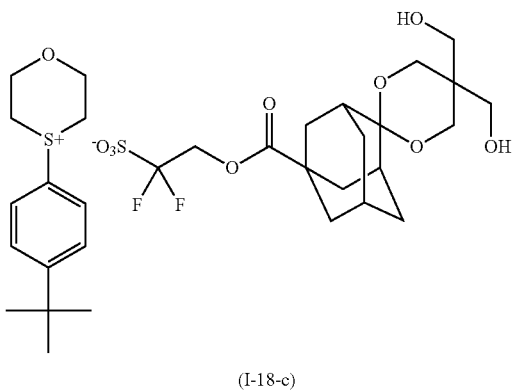

-continued

The salt represented by the formula (I-18-a) was prepared according to the method described in JP2016-113450A1.

A mixture of 6.86 parts of the salt represented by the formula (I-18-a), 6.5 parts of the salt represented by the formula (I-1-b), 35 parts of chloroform, 14 parts of acetonitrile and 14 parts of dimethylformamide was stirred at 23° C. for 30 minutes.

To the mixture, 0.07 part of p-toluenesulfonic acid were added, and the resultant mixture was refluxed for 3 hours with stirring. The obtained mixture was cooled down to 23° C., and then 155 parts of chloroform were added thereto and then stirred, followed by being filtrated. Then 40 parts of 5% aqueous sodium hydrogen carbonate solution was added to the filtrated solution and stirred at 23° C. for 30 minutes. Then an organic layer was separated by being left to stand.

The collected organic layer, 45 parts of ion-exchanged water was added, and the obtained mixture was stirred at 23° C. for 30 minutes and then an organic layer was collected by being separated. The organic layer obtained was washed three times with ion-exchanged water. To the obtained layer, 95 parts of ethyl acetate was added, followed by removing the supernatant therefrom. The obtained residue was dissolved in acetonitrile, followed by being concentrated to give 3.55 parts of the salt represented by formula (I-18-c).

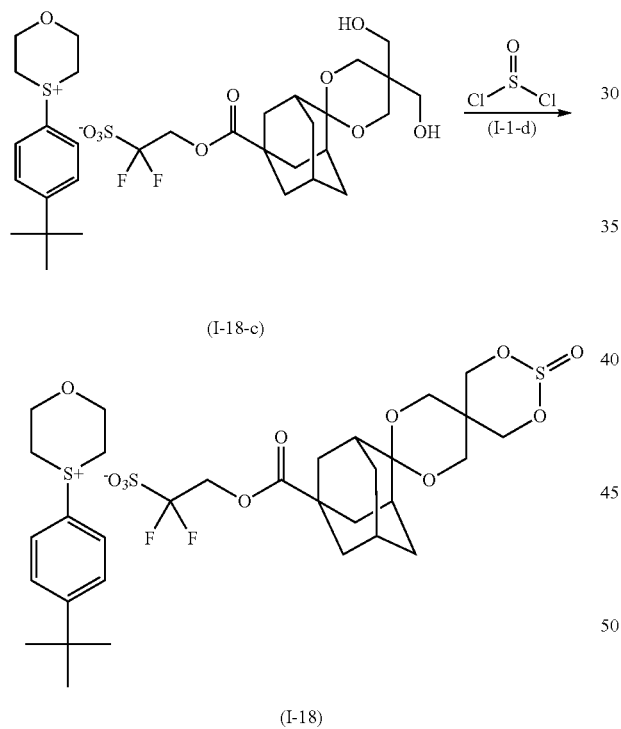

A mixture of 2.46 parts of the salt represented by the formula (I-18-c), 25 parts of chloroform and 2.5 parts of dimethylformamide was stirred at 23° C. for 30 minutes and then cooled to 5° C.

To the mixture, 0.42 parts of the salt represented by the formula (I-1-d) was added over 15 minutes, followed by adding 0.4 parts of trimethylamine thereto. Then the mixture was warmed to 23° C. and then stirred at 23° C. for two hours.

To the obtained reaction mixture, 15 parts of ion-exchanged water was added and then stirred, followed by being separated by being left stand.

The organic layer was washed twice with ion-exchanged water. The washed organic layer was concentrated and then 1.08 parts of acetonitrile and 32.18 parts of tert-butylmethylether were added and stirred at 23° C. for 30 minutes, followed by removing the supernatant therefrom, followed by being concentrated to give 2.28 parts of the salt represented by formula (I-18).

MS (ESI (+) Spectrum): M$^+$ 237.1

MS (ESI(−) Spectrum): M$^−$ 501.1

Synthesis Examples of Resins

The monomers used for Synthesis Examples of the resins are shown below. These monomers are referred to as "monomer (X)" where "(X)" is the symbol of the formula representing the structure of each monomer. For example, Monomer (a1-1-3) is a monomer represented by formula (a1-1-3).

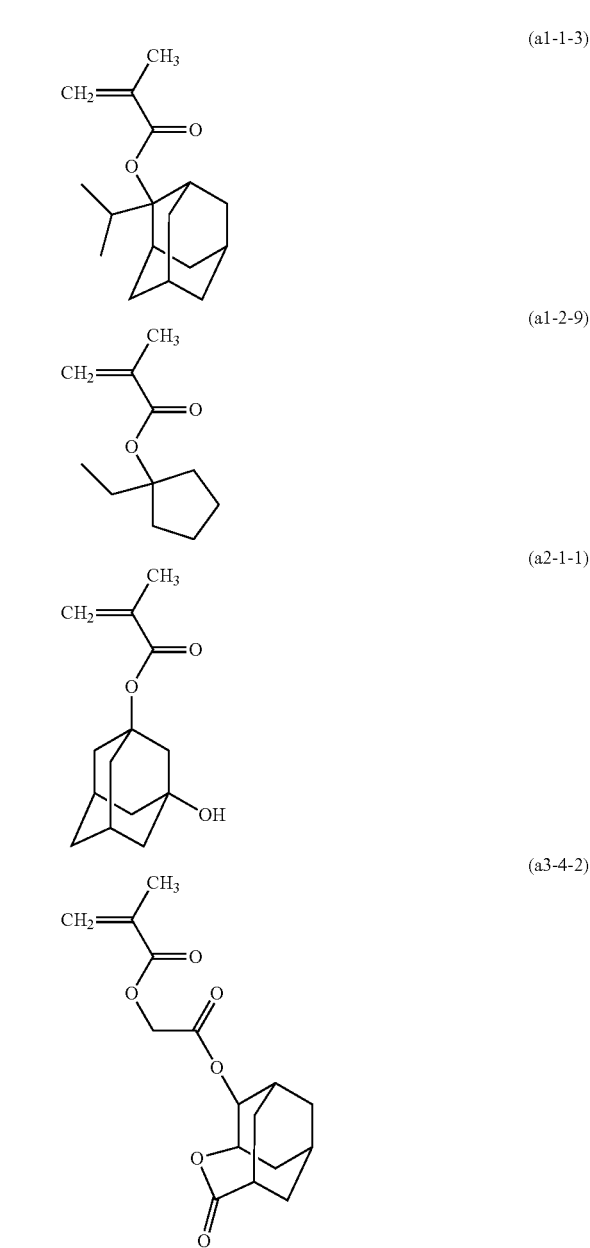

-continued

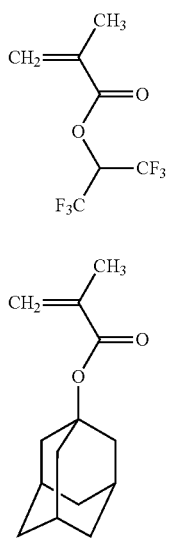

(a4-0-12)

(a5-1-1)

Synthesis Example 5

Monomer (a1-1-3), monomer (a1-2-9), monomer (a2-1-1) and monomer (a3-4-2) were mixed together with the mole ratio of the monomers being 45:14:2.5:38.5 [monomer (a1-1-3):monomer (a1-2-9):monomer (a2-1-1):monomer (a3-4-2)], and propyleneglycolmonomethylether acetate was added thereto in the amount equal to 1.5 times by mass of the total amount of monomers to obtain a solution. Azobisisobutyronitrile and azobis(2,4-dimethylvaleronitrile) were added as initiators to the solution in the amounts of 1% by mole and 3% by mole respectively with respect to the total amount of monomers, and the resultant mixture was heated at 75° C. for about 5 hours. Then, the obtained reaction mixture was poured into a large amount of a mixture of methanol and ion exchanged water to precipitate a resin. The obtained resin was filtrated. The obtained resin was dissolved in propyleneglycolmonomethylether acetate to obtain a solution, and the solution was poured into a mixture of methanol and ion exchanged water to precipitate a resin. The obtained resin was filtrated. These operations were conducted twice to provide the resin having a weight average molecular weight of about 7800 in 66% yield. This resin, which had the structural units of the following formulae, was referred to Resin A1.

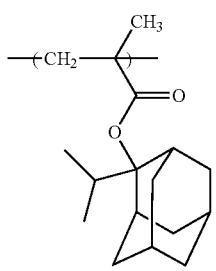 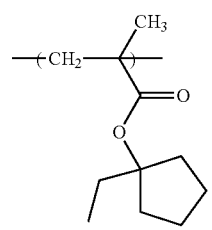

-continued

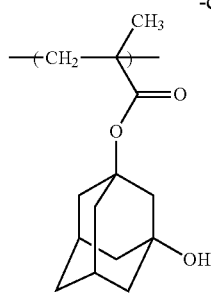

Synthesis Example 6

To a mixture of Monomer (a5-1-1) and monomer (a4-0-12) the molar ratio of which was 50:50, methylisobutylketone was added in the amount equal to 1.2 times by mass of the total amount of monomers to obtain a solution. Azobisisobutyronitrile was added as initiators to the solution in the amounts of 3% by mole with respect to the total amount of monomers, and the resultant mixture was heated at 70° C. for about 5 hours. The obtained reaction mixture was poured into a large amount of a mixture of methanol and ion exchanged water to precipitate a resin. The obtained resin was filtrated to provide the copolymer having a weight average molecular weight of about 10000 in 91% yield. This resin, which had the structural units of the following formulae, was referred to Resin X1.

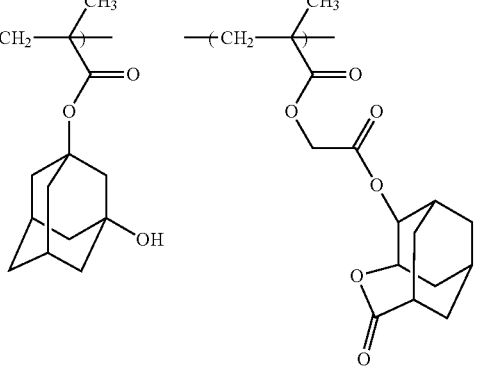

(Preparing Photoresist Compositions-1)

Photoresist compositions were prepared by mixing and dissolving each of the components as shown in Table 2, and then filtrating through a fluororesin filter having 0.2 μm pore diameter.

TABLE 2

| Photoresist Comp. | Resin (Kind/ parts) | Acid Generator (Kind/parts) | Quencher (D) (Kind/ parts) | Solvent (E) | PB/ PEB |
|---|---|---|---|---|---|
| Composition 1 | X1/0.4 A1/10 | I-1/0.8 | D1/0.28 | Solvent 1 | 90° C./ 85° C. |
| Composition 2 | X1/0.4 A1/10 | I-2/0.8 | D1/0.28 | Solvent 1 | 90° C./ 85° C. |
| Composition 3 | X1/0.4 A1/10 | I-17/1.4 | D1/0.28 | Solvent 1 | 90° C./ 85° C. |
| Composition 4 | X1/0.4 A1/10 | I-18/1.4 | D1/0.28 | Solvent 1 | 90° C./ 85° C. |

TABLE 2-continued

| Photoresist Comp. | Resin (Kind/parts) | Acid Generator (Kind/parts) | Quencher (D) (Kind/parts) | Solvent (E) | PB/PEB |
|---|---|---|---|---|---|
| Comparative Composition 1 | X1/0.4 A1/10 | B1-2/0.8 | D1/0.28 | Solvent 1 | 90° C./ 85° C. |
| Comparative Composition 2 | X1/0.4 A1/10 | B1-6/0.8 | D1/0.28 | Solvent 1 | 90° C./ 85° C. |
| Comparative Composition 3 | X1/0.4 A1/10 | B1-25/0.8 | D1/0.28 | Solvent 1 | 90° C./ 85° C. |
| Comparative Composition 4 | X1/0.4 A1/10 | B1-31/0.8 | D1/0.28 | Solvent 1 | 90° C./ 85° C. |

The symbols listed in Table 2 represent the following ones.

<Resin>

A1, X1: Resin A1, Resin X-1, each prepared by the methods as described above.

<Acid Generator>

B1-2: The salt represented by the formula (B1-2), prepared according to JP2006-257078A1

B1-6: The salt represented by the formula (B1-6), prepared according to JP2007-224008A1

B1-25: The salt represented by the formula (B1-25), prepared according to JP2013-41257A1

B1-31: The salt represented by the formula (B1-31), prepared according to JP2012-97074A1

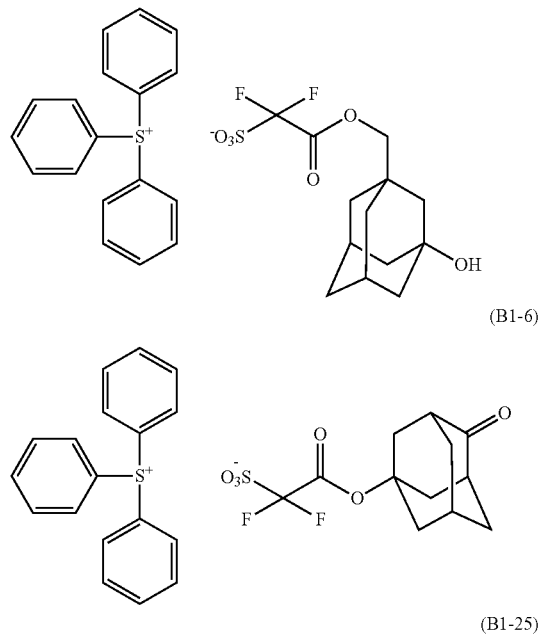

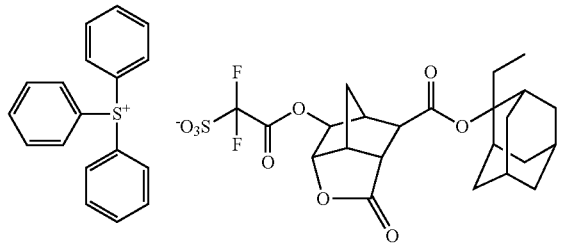

(B1-2), (B1-6), (B1-25)

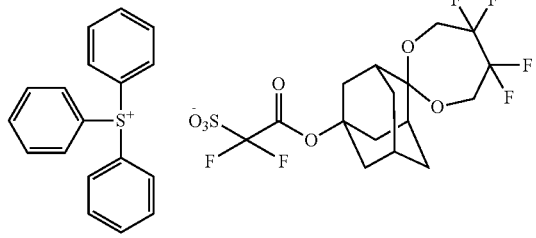

(B1-31)

The parameters [$\delta d$, $\delta p$, and $\delta h$] of an acid generated from each of the above-mentioned acid generators are listed in Table 3, and a distance of of Hansen solubility parameters between the acid and γ-butyrolactone is listed therein.

These parameters were calculated using the software "HSPiP Version 4.1". The molar volumes were calculated from their chemical structures by using a computer software "Hansen Solubility Parameters in Practice (HSPiP)". The units of the parameters [$\delta d$, $\delta p$, and $\delta h$] are $(MPa)^{1/2}$, and the unit of the molar volumes is $cm^3/mol$.

TABLE 3

| Acid Generator | $\delta d$ | $\delta p$ | $\delta h$ | Molar volume | R |
|---|---|---|---|---|---|
| (I-1) | 17.3 | 17.0 | 14.2 | 905.5 | 6.95 |
| (I-2) | 17.2 | 16.6 | 13.9 | 961.5 | 6.69 |
| (I-17) | 17.3 | 17.0 | 14.2 | 905.5 | 6.95 |
| (I-18) | 17.2 | 16.6 | 13.9 | 961.5 | 6.69 |
| (B1-2) | 17.8 | 14.5 | 17.5 | 710.5 | 10.32 |
| (B1-6) | 18.4 | 16.2 | 15.3 | 644.5 | 7.95 |
| (B1-25) | 16.7 | 17.1 | 11.6 | 1188.5 | 4.96 |
| (B1-31) | 16.0 | 13.1 | 12.8 | 834.5 | 7.58 |

In this table, R represents the above-mentioned distance.

<Quencher (D)>

D1: The compound as follow, a product of Tokyo Chemical Industry Co., LTD

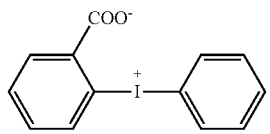

<Solvent 1>

| | |
|---|---|
| Propyleneglycolmonomethyl ether acetate | 265 parts |
| Propyleneglycolmonomethyl ether | 20 parts |
| 2-Heptanone | 20 parts |
| γ-butyrolactone | 3.5 parts |

<Producing Photoresist Patterns 1>

A composition for an organic antireflective film ("ARC-29", by Nissan Chemical Co. Ltd.) was applied onto 12-inch silicon wafer and baked for 60 seconds at 205° C. to form a 78 nm thick organic antireflective film. One of the photoresist compositions as listed in Table 2 was then applied thereon by spin coating in such a manner that the thickness of the film after drying (pre-baking) became 85 nm.

The obtained wafer was then pre-baked for 60 seconds on a direct hot plate at the temperature given in the "PB" column in Table 2.

On the wafers on which the photoresist film had thus formed, the film was then exposed through a mask for forming contact hole patterns (hole pitch 90 nm/hole diameter 55 nm) while changing exposure quantity stepwise, with an ArF excimer laser stepper for liquid-immersion lithography ("XT:1900Gi" by ASML Ltd.: NA=1.35, 3/4 Annular X-Y-pol. lighting). Ultrapure water was used as medium for liquid-immersion.

After the exposure, post-exposure baking was carried out for 60 seconds at the temperature given in the "PEB" column in Table 2.

Then, development was carried out with butyl acetate (a product of Tokyo Chemical Industry Co., LTD) at 23° C. for 20 seconds in the manner of dynamic dispensing method to obtain negative photoresist patterns.

<Evaluation of Mask Error Factor [MEF]>

Negative photoresist patterns were produced in the same manner as recited in "Producing photoresist patterns 1", conducting exposure with an effective sensitivity and using a mask the hole diameter of which was 57 nm, 56 nm, 55 nm, 54 nm or 53 nm and the hole pitches of which was 90 nm. In this evaluation, the effective sensitivity was determined as the exposure quantity at which the photoresist pattern having 45 nm hole diameter was obtained by the exposure using the above-mentioned mask. The results were plotted along the abscissa axis representing diameters of mask holes and along the ordinate axis representing diameters of the holes of the photoresist patterns formed (transferred) on the substrate by exposure.

The slope of a plotted regression line, i.e., the increment of the ordinate per the increment by 1 of the abscissa, was determined as the MEF value. When the MEF value was 4.6 or less, MEF was evaluated as being good and expressed by oo;
when the MEF value was greater than 4.6 to not greater than 4.8, MEF was evaluated as being good and expressed by 0; and
when the MEF value was greater than 4.8, MEF was evaluated as being not good and expressed by X.

The results are shown in Table 4. The numerical values in parentheses represent MEF values.

<Evaluation as to Critical Dimension Uniformity (CDU)>

The photoresist patterns were produced in the same manner as described above in which exposure was conducted at the effective sensitivity. In this evaluation, the effective sensitivity was determined as the exposure quantity at which the photoresist pattern having 55 nm of hole diameter was produced by the exposure using the above-mentioned mask.

The hole diameter was measured at 24 points per one hole of the pattern. The average of the values determined as the hole diameter was defined as the average hole diameter of the hole.

As to the average hole diameter, the standard deviation was obtained based on the population which consisted of 400 holes within the same wafer. When the standard deviation was not more than 1.8 nm, it was evaluated as "oo" (very good). When the standard deviation was from 1.8 nm to 2.00 nm, it was evaluated as "o" (bad).
When the standard deviation was more than 2.00 nm, it was evaluated as "X" (bad).

Table 4 illustrates the results thereof. The parenthetical number in each column of "CDU" represents the standard deviation (nm).

TABLE 4

|  | Photoresist Composition | MEF | CDU |
|---|---|---|---|
| Ex. 1 | Composition 1 | oo (4.56) | oo (1.69) |
| Ex. 2 | Composition 2 | oo (4.58) | oo (1.70) |
| Ex. 3 | Composition 3 | oo (4.42) | oo (1.62) |
| Ex. 4 | Composition 4 | oo (4.46) | oo (1.65) |
| Comparative Ex. 1 | Comparative Composition 1 | x (4.84) | o (1.82) |
| Comparative Ex. 2 | Comparative Composition 2 | x (4.89) | o (1.88) |
| Comparative Ex. 3 | Comparative Composition 3 | o (4.75) | x (2.17) |
| Comparative Ex. 4 | Comparative Composition 4 | o (4.80) | o (1.83) |

(Preparing Photoresist Compositions-2)

Photoresist compositions were prepared by mixing and dissolving each of the components shown in Table 5, and then filtrating through a fluororesin filter having 0.2 μm pore diameter.

The half amount of the obtained compositions were stored for two weeks respectively while a temperature of its storage was 40° C. or −5° C., which was set every second days.

TABLE 5

| Photoresist Comp. | Resin (Kind/parts) | Acid Generator (Kind/parts) | Quencher (D) (Kind/parts) | PB/PEB | Solvent (E) |
|---|---|---|---|---|---|
| Composition 5 | X1/0.4 A1/10 | I-1/1.5 | D1/0.28 | 90° C./85° C. | Solvent 1 |
| Composition 6 | X1/0.4 A1/10 | I-1/1.5 | D1/0.28 | 90° C./85° C. | Solvent 2 |
| Composition 7 | X1/0.4 A1/10 | I-2/1.5 | D1/0.28 | 90° C./85° C. | Solvent 1 |
| Composition 8 | X1/0.4 A1/10 | I-2/1.5 | D1/0.28 | 90° C./85° C. | Solvent 2 |
| Composition 9 | X1/0.4 A1/10 | I-17/2.2 | D1/0.28 | 90° C./85° C. | Solvent 1 |
| Composition 10 | X1/0.4 A1/10 | I-17/2.2 | D1/0.28 | 90° C./85° C. | Solvent 2 |
| Composition 11 | X1/0.4 A1/10 | I-18/2.2 | D1/0.28 | 90° C./85° C. | Solvent 1 |
| Composition 12 | X1/0.4 A1/10 | I-18/2.2 | D1/0.28 | 90° C./85° C. | Solvent 2 |
| Composition 13 | X1/0.4 A1/10 | I-18/2.2 | D1/0.28 | 90° C./85° C. | Solvent 3 |
| Composition 14 | X1/0.4 A1/10 | I-18/2.2 | D1/0.28 | 90° C./85° C. | Solvent 4 |
| Comparative Composition 5 | X1/0.4 A1/10 | BI-2/1.5 | D1/0.28 | 90° C./85° C. | Solvent 1 |
| Comparative Composition 6 | X1/0.4 A1/10 | BI-6/1.5 | D1/0.28 | 90° C./85° C. | Solvent 1 |
| Comparative Composition 7 | X1/0.4 A1/10 | BI-25/1.5 | D1/0.28 | 90° C./85° C. | Solvent 1 |
| Comparative Composition 8 | X1/0.4 A1/10 | BI-31/1.5 | D1/0.28 | 90° C./85° C. | Solvent 1 |
| Comparative Composition 9 | X1/0.4 A1/10 | BI-2/1.5 | D1/0.28 | 90° C./85° C. | Solvent 2 |
| Comparative Composition 10 | X1/0.4 A1/10 | BI-6/1.5 | D1/0.28 | 90° C./85° C. | Solvent 2 |
| Comparative Composition 11 | X1/0.4 A1/10 | BI-25/1.5 | D1/0.28 | 90° C./85° C. | Solvent 2 |
| Comparative Composition 12 | X1/0.4 A1/10 | BI-31/1.5 | D1/0.28 | 90° C./85° C. | Solvent 2 |
| Comparative Composition 13 | X1/0.4 A1/10 | BI-31/1.5 | D1/0.28 | 90° C./85° C. | Solvent 3 |
| Comparative Composition 14 | X1/0.4 A1/10 | BI-31/1.5 | D1/0.28 | 90° C./85° C. | Solvent 4 |

The solvents 2 to 4 have the following components as follow.

<Solvent 2>

| Propyleneglycolmonomethyl ether acetate | 265 parts |
|---|---|
| Propyleneglycolmonomethyl ether | 20 parts |
| 2-Heptanone | 20 parts |
| γ-butyrolactone | 2 parts |

<Solvent 3>

| Propyleneglycolmonomethyl ether acetate | 265 parts |
|---|---|
| Propyleneglycolmonomethyl ether | 20 parts |
| 2-Heptanone | 20 parts |
| γ-butyrolactone | 1 part |

<Solvent 4>

| Propyleneglycolmonomethyl ether acetate | 265 parts |
|---|---|
| Propyleneglycolmonomethyl ether | 20 parts |
| 2-Heptanone | 20 parts |
| γ-butyrolactone | 9 parts |

<Producing Photoresist Patterns 2>

A composition for an organic antireflective film ("ARC-29", by Nissan Chemical Co. Ltd.) was applied onto 12-inch silicon wafer and baked for 60 seconds at 205° C. to form a 78 nm thick organic antireflective film. One of the photoresist compositions as listed in Table 5 was then applied thereon by spin coating in such a manner that the thickness of the film after drying (pre-baking) became 100 nm.

The obtained wafer was then pre-baked for 60 seconds on a direct hot plate at the temperature given in the "PB" column in Table 5.

On the wafers on which the photoresist film had thus formed, the film was then exposed through a mask for forming trench patterns (Pitch 120 nm/trench width 40 nm) while changing exposure quantity stepwise, with an ArF excimer laser stepper for liquid-immersion lithography ("XT:1900Gi" by ASML Ltd.: NA=1.35, 3/4 Annular X-Y-pol. lighting). Ultrapure water was used as medium for liquid-immersion.

After the exposure, post-exposure baking was carried out for 60 seconds at the temperature given in the "PEB" column in Table 5.

Then, development was carried out with butyl acetate (a product of Tokyo Chemical Industry Co., LTD) at 23° C. for 20 seconds in the manner of dynamic dispensing method to obtain negative photoresist patterns.

<Evaluation of Focus Margin [DOF]>

In this evaluation, the effective sensitivity was determined as the exposure quantity at which the photoresist pattern having 40 nm of trench width was obtained by the exposure using the above-mentioned mask.

Negative photoresist patterns were produced in the same manner as recited in "Producing photoresist patterns 2" in which exposure was conducted at the effective sensitivity with the focus point distance being varied stepwise.

The focus range where the resulting photoresist patterns exhibited a trench pattern width of 40 nm±5% (between 38 nm and 42 nm) was taken as DOF (nm). The evaluation was conducted as to both the compositions not stored and the compositions stored for two weeks as mentioned above.

The results are shown in Table 6.

TABLE 6

| | Photoresist Composition | DOF [nm] (not stored) | DOF [nm] (stored) |
|---|---|---|---|
| Ex. 5 | Composition 5 | 120 | 120 |
| Ex. 6 | Composition 6 | 120 | 120 |
| Ex. 7 | Composition 7 | 120 | 120 |
| Ex. 8 | Composition 8 | 120 | 120 |
| Ex. 9 | Composition 9 | 135 | 135 |
| Ex. 10 | Composition 10 | 135 | 135 |
| Ex. 11 | Composition 11 | 135 | 135 |
| Ex. 12 | Composition 12 | 135 | 135 |
| Ex. 13 | Composition 13 | 135 | 135 |
| Ex. 14 | Composition 14 | 135 | 135 |
| Comparative Ex. 5 | Comparative Composition 5 | 120 | 90 |
| Comparative Ex. 6 | Comparative Composition 6 | 120 | 105 |
| Comparative Ex. 7 | Comparative Composition 7 | 75 | 75 |
| Comparative Ex. 8 | Comparative Composition 8 | 120 | 105 |
| Comparative Ex. 9 | Comparative Composition 9 | 120 | 75 |
| Comparative Ex. 10 | Comparative Composition 10 | 120 | 90 |
| Comparative Ex. 11 | Comparative Composition 11 | 75 | 75 |
| Comparative Ex. 12 | Comparative Composition 12 | 120 | 90 |
| Comparative Ex. 13 | Comparative Composition 13 | 120 | 75 |
| Comparative Ex. 14 | Comparative Composition 14 | 120 | 105 |

The photoresist composition of the disclosure can provide a photoresist pattern with excellent CDU, MEF or DOF. Therefore, the photoresist composition can be used for semiconductor microfabrication.

What is claimed is:

1. A photoresist composition comprising an acid generator and a resin which comprises a structural unit having an acid-liable group,
   the acid generator generating an acid (I) or an acid (II):
   the acid (I) showing a hydrogen bonding parameter in the range of 12 $(MPa)^{1/2}$ to 15 $(MPa)^{1/2}$ and a polarity parameter in the range of 15 $(MPa)^{1/2}$ or more;
   the acid (II) showing a hydrogen bonding parameter in the range of 12 $(MPa)^{1/2}$ to 15 $(MPa)^{1/2}$, and a distance of Hansen solubility parameters between the acid (II) and γ-butyrolactone being 7.5 or less, and
   the distance being calculated from formula (1):

$$R = (4 \times (\delta d_A - 18)^2 + (\delta p_A - 16.6)^2 + (\delta h_A - 7.4)^2)^{1/2} \quad (1)$$

in which $\delta d_A$ represents a dispersion parameter of an acid, $\delta p_A$ represents a polarity parameter of an acid, $\delta h_A$ represents a hydrogen bonding parameter of an acid, and R represents a distance of Hansen solubility parameters between an acid and γ-butyrolactone.

2. The photoresist composition according to claim 1, wherein the acid generator generates the acid (I).

3. The photoresist composition according to claim 1, wherein the acid generator generates the acid (II).

4. The photoresist composition according to claim 3 which further comprises γ-butyrolactone as a solvent.

5. The photoresist composition according to claim 4 wherein the weight ratio of γ-butyrolactone is from 0.1% by weight to 5% by weight with respect to the solvent.

6. The photoresist composition according to claim 4 which further comprises at least one selected from the group consisting of propyleneglycolmonomethylether acetate, propyleneglycolmonomethylether and a ketone solvent.

7. The photoresist composition according to claim 6 wherein the ketone solvent is 2-heptanone.

8. The photoresist composition according to claim 1 wherein the acid (I) or the acid (II) has a molar volume of 850 cm$^3$/mol or more.

9. The photoresist composition according to claim 1 wherein the structural unit having an acid-labile group is at least one selected from the group consisting of a structural unit represented by formula (a1-0), a structural unit represented by formula (a1-1) and a structural unit represented by formula (a1-2):

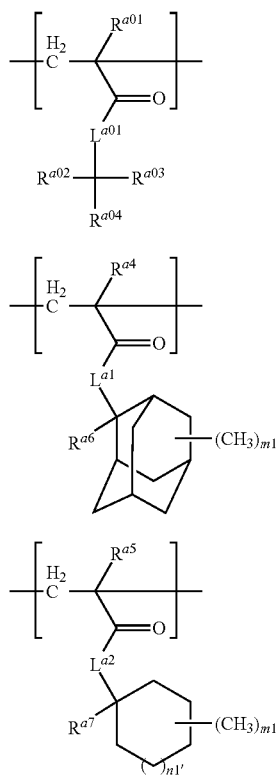

in each formula, $L^{a01}$, $L^{a1}$ and $L^{a2}$ represent —O— or *—O—(CH$_2$)$_{k01}$—CO—O—, k01 represents an integer of 1 to 7, * represents a binding position to —CO—, $R^{a01}$, $R^{a4}$ and $R^{a5}$ represent a hydrogen atom or a methyl group, and $R^{a02}$, $R^{a03}$ and $R^{a04}$ independently represent a C1 to C8 alkyl group, a C3 to C18 alicyclic hydrocarbon group or combination thereof, $R^{a6}$ and $R^{a7}$ independently represent a C1 to C8 alkyl group, a C3 to C18 alicyclic hydrocarbon group or a combination thereof, m1 represents an integer of 0 to 14, n1 represents an integer of 0 to 10, and n1' represents an integer of 0 to 3.

10. The photoresist composition according to claim 1 wherein the resin further comprises a structural unit having a lactone ring and no acid-labile group.

11. The photoresist composition according to claim 10 wherein the structural unit having a lactone ring and no acid-labile group is a structural unit represented by formula (a3-4):

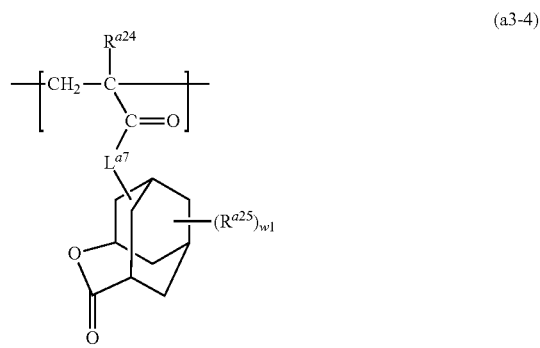

wherein $R^{a24}$ represents a hydrogen atom, a halogen atom or a C1 to C6 alkyl group which can have a halogen atom, $L^{a7}$ represents —O—, *—O-$L^{a8}$-O—, *—O-$L^{a8}$-CO—O—, *—O-$L^{a8}$-CO—O-$L^{a9}$-CO—O— or *—O-$L^{a8}$-O—CO-$L^{a9}$-O— where * represents a binding position to a carbonyl group, $L^{a8}$ and $L^{a9}$ independently represents a C1 to C6 alkanediyl group, and $R^{a25}$ in each occurrence represents a carboxy group, a cyano group or a C1 to C4 aliphatic hydrocarbon group, and w1 represents an integer of 0 to 8.

12. The photoresist composition according to claim 1 wherein the resin further comprises a structural unit having a hydroxyl group and no acid-labile group.

13. The photoresist composition according to claim 1 wherein the acid (I) or the acid (II) has a cyclic structure comprising a —O—SO—O— moiety.

14. The photoresist composition according to claim 1 further comprising a resin which comprises a structural unit having a fluorine atom and no acid-labile group.

15. The photoresist composition according to claim 1 further comprising a salt which generates an acid having an acidity weaker than the acid (I) and the acid (II).

16. A method for producing a photoresist pattern comprising steps (1) to (5);
(1) applying the photoresist composition according to claim 1 onto a substrate;
(2) drying the applied composition to form a composition layer;
(3) exposing the composition layer;
(4) heating the exposed composition layer; and
(5) developing the heated composition layer.

* * * * *